(12) United States Patent
Kizuki et al.

(10) Patent No.: US 6,358,316 B1
(45) Date of Patent: Mar. 19, 2002

(54) METHOD FOR PRODUCING SEMICONDUCTOR DEVICE, METHOD FOR PRODUCING SEMICONDUCTOR LASER DEVICE, AND METHOD FOR PRODUCING QUANTUM WIRE STRUCTURE

(75) Inventors: Hirotaka Kizuki; Norio Hayafuji; Tatsuya Kimura, all of Itami (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 1667 days.

(21) Appl. No.: 08/513,036

(22) Filed: Aug. 9, 1995

Related U.S. Application Data

(63) Continuation of application No. 08/111,485, filed on Aug. 25, 1993, now abandoned.

(30) Foreign Application Priority Data

Sep. 10, 1992 (JP) .............................................. 4-269610
Mar. 5, 1993 (JP) .............................................. 5-044869

(51) Int. Cl.[7] .............................................. C30B 25/04
(52) U.S. Cl. .................... 117/105; 117/89; 117/954; 438/29; 438/39; 438/40; 438/41; 438/761
(58) Field of Search ................ 437/129, 90; 156/651.1; 117/105, 89, 954; 438/761, 29, 39, 40, 41

(56) References Cited

U.S. PATENT DOCUMENTS

| | | | | |
|---|---|---|---|---|
| 4,579,623 A | * | 4/1986 | Suzuki et al. ............. | 156/651.1 |
| 4,648,940 A | * | 3/1987 | Menigaux et al. ............ | 437/90 |
| 4,734,514 A | * | 3/1988 | Melas et al. .................... | 556/70 |
| 4,789,643 A | * | 12/1988 | Kajikawa ...................... | 437/90 |

(List continued on next page.)

FOREIGN PATENT DOCUMENTS

| | | |
|---|---|---|
| EP | 0175561 | 9/1985 |
| EP | 0450228 | 10/1990 |
| EP | 0469712 | 2/1992 |
| EP | 0527615 | 2/1993 |
| EP | 0539963 | 5/1993 |
| GB | 1011979 | 5/1962 |
| GB | 1047942 | 4/1963 |
| GB | 1047942 | 11/1966 |
| GB | 2101045 | 6/1982 |
| JP | 163487 | 8/1985 |
| JP | 184892 | 8/1986 |
| JP | 55439 | 8/1991 |
| JP | 59576 | 9/1991 |
| JP | 10683 | 1/1992 |
| WO | 8606546 | 3/1986 |

OTHER PUBLICATIONS

Van 'T Blink et al., "On the MOVPE Growth of Self–Aligned Laser Structures," Journal of Crystal Growth 92 (1988) pp. 165–170.*

Heyen et al., "Vapor Phase Etching of GaAs in a Chlorine System," Journal of Crystal Growth 53 (1981) pp. 558–562.*

(List continued on next page.)

Primary Examiner—Robert Kunemund
(74) Attorney, Agent, or Firm—Leydig, Voit & Mayer, Ltd.

(57) ABSTRACT

In a method for producing a semiconductor device, a compound semiconductor cap layer including no aluminum is grown on a compound semiconductor layer including aluminum, a mask pattern insulating film is formed on a part of the compound semiconductor cap layer, the compound semiconductor wafer with the insulating mask pattern is immersed in an ammonium sulfide solution, the compound semiconductor wafer is selectively etched away using a chlorine containing gas in a reaction chamber, and a groove formed in the etching process is filled with a compound semiconductor layer grown in the reaction chamber by MOCVD. Therefore, a regrowth interface on which no impurity is segregated is attained, improving the quality of the regrown crystal layer.

18 Claims, 38 Drawing Sheets

U.S. PATENT DOCUMENTS

| | | | |
|---|---|---|---|
| 4,980,314 A | | 12/1990 | Strege ..................... 437/129 |
| 5,043,291 A | | 8/1991 | Devoldere et al. ............ 437/24 |
| 5,114,877 A | | 5/1992 | Paoli et al. ................. 437/129 |
| 5,314,575 A | * | 5/1994 | Yanagida ................. 156/651.1 |

OTHER PUBLICATIONS

Wang et al., "Analysis of GaAs(100) surfaces prepared with various wet and in situ sample treatments" Journal of Vacuum Science and Technology, A 11(4), Jul./Aug. 1993, 39th American Vacuum Society National Symposium, Chicago, IL., Nov. 9–13, 1992.*

Yasuo Nannichi, "Defect Reduction and Stabilization of GaAs Surface with Sulfur Treatments", Japanese Journal of Applied Physics, vol. 58, No. 9, (1989), pp. 1340–1344 (in Japanese).

Sasaki et al, "Highly Reliable 150 mW CW Operation of Single–Stripe AlGaAS Lasers with Window Grown on Facets", Japanese Journal of Applied Physics, vol. 30, No. 5B, (1991), pp. 904–906.

* cited by examiner ( Prior Art )

METHOD FOR PRODUCING SEMICONDUCTOR DEVICE, METHOD FOR PRODUCING SEMICONDUCTOR LASER DEVICE, AND METHOD FOR PRODUCING QUANTUM WIRE STRUCTURE

This disclosure is a continuation of patent application Ser. No. 08/111,485, filed Aug. 25, 1993 now abandoned.

FIELD OF THE INVENTION

The present invention relates to methods for producing semiconductor devices, semiconductor lasers, and quantum wire structures, an apparatus for producing semiconductor devices, and crystal growth methods, and more particularly to methods including a dry etching process and an epitaxial growth process.

BACKGROUND OF THE INVENTION

Recently, in manufacturing semiconductor laser diodes or quantum wire structures, a fine structure producing technique utilizing etching and regrowth has been developed. More specifically, this technique includes selectively etching away a portion of a crystal layer and growing an epitaxial layer on the surface of the crystal layer exposed by the etching, which epitaxial layer is electrically and optically different from the crystal layer, whereby a desired electronic state is achieved. In this process, forming a fine structure in desired shape with high controllability and maintaining a clean regrowth interface are very important. Especially when AlGaAs is employed as a material of the device, since Al is an easily oxidizable material, an oxide film formed on the surface adversely affects the etching process, resulting in a fine structure of unwanted shape. In addition, since the regrowth interface is contaminated, the quality of a regrown crystal layer is significantly deteriorated. These problems must be solved when the technique is employed in the manufacture of the devices.

Japanese Published Patent Application No. 58-53834 discloses a prior art method for etching an AlGaAs layer by reactive dry etching. In this method, a GaAs cap layer disposed on the AlGaAs layer prevents the surface of the AlGaAs layer from being oxidized. This prior art describes that a favorable AlGaAs etching is achieved for the first time when the reactive dry etching is performed from the GaAs cap layer. Japanese Published Patent Application No. 61-184892 also discloses an AlGaAs etching method employing a GaAs cap layer. In this prior art, the AlGaAs layer with the GaAs cap layer is etched by HCl gas.

A description is given of problems in the prior art AlGaAs etching method employing the GaAs cap layer.

FIGS. 30($a$)–30($c$) and 31($a$)–31($c$) are sectional views for explaining experiments conducted to confirm the effects of the prior art AlGaAs etching method. In the figures, reference numeral 1 designates a regrown GaAs layer, numeral 2 designates an $Al_xGa_{1-x}As$ layer, numeral 23 designates a GaAs substrate, and numeral 211 designates a GaAs cap layer. A first sample and a second sample are formed according to the process steps illustrated in FIGS. 30($a$)–30($c$) and FIGS. 31($a$)–31($c$), respectively.

Initially, as illustrated in FIG. 30($a$), the $Al_xGa_{1-x}As$ layer 2 and the GaAs cap layer 211 are successively grown on the GaAs substrate 23 by MOCVD (first crystal growth of the first sample). On the other hand, in the step of FIG. 31($a$), only the $Al_xGa_{1-x}As$ layer 2 is grown on the GaAs substrate 23 by MOCVD (first crystal growth of the second sample). The $Al_xGa_{1-x}As$ layer 2 is 2 $\mu$m thick and the GaAs cap layer 211 is 0.1 $\mu$m thick. The first and second samples are taken out from the reaction chamber and left in the air for a few days. Thereafter, each of the first and second samples is etched by 1 $\mu$m from the surface using HCl gas (FIGS. 30($b$) and 31($b$)) and, subsequently, in the same reaction chamber, the GaAs layer 1 is grown to 2 $\mu$m by MOCVD (FIGS. 30($c$) and 31($c$)).

FIGS. 32($a$) and 32($b$) illustrate SIMS (Secondary Ion Mass Spectroscope) profiles of impurity ion concentrations in the vicinity of the regrowth interface, i.e., the interface between the $Al_xGa_{1-x}As$ layer 2 and the regrown GaAs layer 1. FIG. 32($a$) illustrates the SIMS profile of the first sample shown in FIG. 30($c$) and FIG. 32($b$) illustrates the SIMS profile of the second sample shown in FIG. 31($c$). In the figures, reference numeral 1 designates the regrown GaAs layer, numeral 2 designates the $Al_xGa_{1-x}As$ layer, and numeral 3 designates the regrowth interface. In both samples, segregations of oxygen (O) and chlorine (Cl) are observed in the vicinity of the regrowth interface. In addition, the dislocation density of the regrown GaAs layer 1 of the first sample is $5 \times 10^5/cm^2$ and that of the second sample is $5 \times 10^8/cm^2$.

These results are construed as follows. In the second sample, since the etching is started from the $Al_xGa_{1-x}As$ layer 2 whose surface is oxidized, the oxide film on the surface reacts with Cl during the etching, and the products are attached to the wafer surface and segregated on the regrowth interface 3. The segregations of O and Cl on the regrowth interface 3 adversely affect the quality of the regrown GaAs layer 1.

On the other hand, in the first sample with the GaAs cap layer 211, since the cap layer prevents the surface of the $Al_xGa_{1-x}As$ layer 2 from being oxidized, segregations of O and Cl in the vicinity of the regrowth interface 3 are reduced compared to the second sample, which means that the GaAs cap layer 211 improves the quality of the regrown GaAs layer 1.

However, the segregations of O and Cl on the regrowth interface are not completely prevented by the GaAs cap layer as shown in FIG. 32($a$), and the dislocation density of the regrown GaAs layer of the first sample, i.e., $5 \times 10^5/cm^2$, is, by one order of magnitude, higher than $1 \times 10^4$ pieces/cm² that is a typical dislocation density required for a compound semiconductor device. This result shows that even a slight oxide film formed on the surface of the GaAs cap layer causes the segregations of O and Cl on the regrowth interface.

That is, the GaAs cap layer alone cannot provide a clean regrowth interface of the AlGaAs layer. Therefore, it is difficult to attain a clean regrowth interface and a high-quality regrown GaAs layer by the prior art etching method disclosed in Japanese Published Patent Application No. 58-53834.

FIG. 34 is a schematic diagram for explaining a vapor phase etching method disclosed in Japanese Published Patent Application No. 62-153199. In the figure, reference numeral 241 designates a reactor, numeral 242 designates a pedestal, numeral 243 designates a semiconductor substrate, numeral 244 designates a resistance heating means, numeral 245 designates a bypass pipe, numeral 246 designates a low temperature region, numeral 247 designates a high temperature region, and numeral 248 designates an etching gas inlet.

In this etching method, initially, HCl gas is sufficiently applied to the surface of the semiconductor substrate 243 in the low temperature region 246. Then, the substrate 243 is moved to the high temperature region and, after a prescribed time, it is returned to the low temperature region 246. This is one cycle of the etching process. In the low temperature region 246 at about 400° C., the substrate 243 is not etched by the HCl gas but Cl is adsorbed by the substrate. When the substrate is moved to the high temperature region 247 at about 600° C., the adsorbed Cl escapes from the surface as $GaCl_3$, whereby a monomolecular layer level etching is carried out with high controllability.

However, this prior art vapor phase etching method has the following drawbacks.

In this etching method, the wafer is moved between the low temperature region and the high temperature region and, in each region, it is left for a prescribed time until the substrate temperature reaches a desired temperature. Therefore, one cycle of the etching takes a few minutes, providing a very low etching rate. In addition, since it is difficult to control separations of As atoms and Ga atoms from the GaAs surface separately from each other, the etching is not smoothly carried out.

FIG. 35 is a sectional view illustrating a quantum wire laser structure disclosed in Applied Physics Letters, 55(1989), pp. 2715–2717. In the figure, reference numeral 250 designates an $n^+$ type GaAs substrate. There are successively disposed on the GaAs substrate 250 an n type $Al_yGa_{1-y}As$ first cladding layer 251, an $Al_xGa_{1-x}As$ barrier layer 252, a GaAs quantum well layer 253, an $Al_xGa_{1-x}As$ barrier layer 254, a p type $Al_yGa_{1-y}As$ second cladding layer 255, a $p^+$ type GaAs cap layer 256, and a Ti/Au electrode 257. An active layer 260 comprises the well layer 253 and the barrier layers 252 and 254. Reference numeral 258 designates high resistance regions formed by ion implantation. Reference numeral 259 designates an active region in which a quantum wire structure is formed.

In production, there are successively grown on the $n^+$ type GaAs substrate 250 having a stripe-shaped V groove, the n type $Al_yGa_{1-y}As$ first cladding layer 251, the active layer 260 comprising the GaAs well layer 253 and the $Al_xGa_{1-x}As$ barrier layers 252 and 254, the p type $Al_yGa_{1-y}As$ second cladding layer 255, and the $p^+$ type GaAs cap layer 256. Then, dopant impurity ions are selectively added to portions of the second cladding layer 255 and the cap layer 256, forming the current narrowing layers 258.

While the active layer forms a quantum well structure on the flat surface of the substrate, it forms a quantum wire structure 259 at the bottom of the V groove.

The quantum wire structure 259 will be described in more detail. In FIG. 35, the GaAs substrate 250 has a (100) surface orientation. Since the stripe-shaped V groove is formed along the $[0\bar{1}1]$ direction by conventional photolithography and wet etching, a (111) A plane is exposed at opposite side walls of the V groove. Under the typical growth conditions of MOCVD (Metal Organic Chemical Vapor Deposition), the growth rate on the (100) surface is approximately equal to the growth rate on the (111) A surface. Therefore, the crystal layers 251 to 256 are grown parallel to each other along the V groove as shown in FIG. 35. Since the bottom end of the V groove is rounded, the (100) surface is partially exposed. Therefore, on the very narrow region at the bottom of the V groove where the (100) surface is exposed, the crystal growth proceeds perpendicularly to the (100) surface, so that the crystal layer grown on that region is thicker than the crystal layer grown on the side surfaces of the groove. In this way, the GaAs quantum well layer 253 forms the crescent-shaped quantum wire 259 at the bottom of the V groove.

However, this prior art laser structure has the following drawbacks. Since the crescent-shaped quantum wire 259 is formed continuously on the quantum well structure formed on the side surfaces of the V groove, the active region has the electron states of both the quantum well and the quantum wire, resulting in a multimode oscillation of the laser. Further, since the quantum wire is united with the quantum well, it is difficult to bring out characteristics of the quantum wire independently. Therefore, in this prior art, it is difficult to produce a plurality of quantum wires of uniform characteristics with high controllability and reproducibility.

FIG. 33 is a perspective view illustrating a part of a high-power semiconductor laser with window layers grown on cleaved facets, disclosed in Japanese Journal of Applied Physics, Vol. 30, 1991, pp. L904~L906. In the figure, reference numeral 231 designates a p type GaAs substrate. There are successively disposed on the substrate 231 an n type GaAs current blocking layer 232, a p type $Al_{0.33}Ga_{0.67}As$ cladding layer 233, a p type $Al_{0.08}Ga_{0.92}As$ active layer 244, an n type $Al_{0.33}Ga_{0.67}As$ cladding layer 235, and an n type GaAs contact layer 236. Reference numeral 237 designates a cleaved (110) facet, and numeral 238 designates an undoped $Al_{0.4}Ga_{0.6}As$ window layer grown on the cleaved (110) facet 237.

The window structure employed in this prior art laser will be described in more detail.

In the AlGaAs high-power laser, a lot of surface states are produced at the oscillation facets. The surface states reduce the energy band gap in the vicinity of the facets compared with the energy band gap in the center of the laser. Therefore, regions in the vicinity of the facets become light absorption regions with respect to the wavelength of the laser light, and the localized heat generation in the light absorption region is increased with an increase in the light output. Since the energy band gap is reduced with the temperature rise, the absorption of laser light is further encouraged, increasing the temperature at the facet, i.e., so-called positive feedback occurs. If the temperature rise is sufficient, localized melting of the semiconductor materials can occur, resulting in catastrophic optical damage (COD) that destroys the laser. In order to reduce the light absorption at the oscillation facets of the laser and increase the power level without risk of COD, window layers having energy band gap larger than that equivalent to the oscillation wavelength of the laser are formed on the facets.

In the prior art high-power laser, the window layers 238 are formed according to the process steps described in the following. Initially, the laser structure is fabricated using conventional wet etching and LPE growth. More specifically, after growing the n type GaAs current blocking layer 232 on the p type GaAs substrate 231, the stripe-shaped V groove is formed in the center of the wafer penetrating through the current blocking layer 232. Then, the p type $Al_{0.33}Ga_{0.67}As$ cladding layer 233, the p type $Al_{0.08}Ga_{0.92}As$ active layer 244, the n type $Al_{0.33}Ga_{0.67}As$ cladding layer 235, and the n type GaAs contact layer 236 are successively grown on the wafer. After grinding the wafer to a desired thickness, the wafer is cleaved in a plurality of bars each having a width equal to the resonator length of the laser. The resonator length of a typical high-power laser is 300~600 µm. Then a material having an energy band gap larger than the energy band gap equivalent to the oscillation wavelength is deposited on a part of the bar-shaped wafer corresponding to the resonator facet, preferably by MOCVD.

In this prior art laser, since the laser oscillation wavelength is 830 nm, which is equivalent to 1.49 eV, the undoped $Al_{0.4}Ga_{0.6}As$ layer 238 having an energy band gap of about 1.93 eV is employed as the window layer. After forming electrodes and coating the window layers, the bar-shaped wafer is divided into a plurality of chips, completing the laser device shown in FIG. 33. The prior art literature, i.e., Japanese Journal of Applied Physics, Vol.30, 1991, pp. L904~L906, describes that the window layers prevent COD and increase the output power and life time of the laser.

However, the prior art laser with the window layers has the following drawbacks.

In fabricating semiconductor lasers, generally, process steps until the formation of electrodes are carried out on a wafer to secure mass production with high reproducibility. That is, the production method of this prior art, in which the window layers are formed on portions corresponding to resonator facets after cleaving the wafer in a plurality of bars each having a width equivalent to the resonator length, provides very poor productivity, so that this method is not industrially available. Further, when the window layers are formed by MOCVD after the formation of the resonator facets by cleaving, the cleaved facets are easily oxidized and surface states are produced thereon so long as the cleaving is performed in the air. Since the surface states on the facets adversely affect the effect of the window layers, the process steps from the cleaving to the growth of the window layers have to be carried out in inactive gas or in vacuum.

The reason why the prior art laser is fabricated in such complicated process will be described.

Since the resonator facets of the laser also serve as laser light reflecting facets, they must be optically flat. In addition, they must be perpendicular to the resonator length direction. Therefore, the prior art method, in which a semiconductor substrate having a (100) surface orientation is employed and the resonator facets perpendicular to the (100) surface are formed by cleaving, has been proposed and employed as a general production method. However, with the advance of developments of high power and multifunction semiconductor lasers, a technique for fabricating resonator facets of lasers without cleaving the wafer has been desired, and facet formation methods utilizing dry etching, such as reactive ion etching (RIE), have been developed. However, the present RIE technique has the problem of physical damage due to the collision of ions, that adversely affects the quality of crystal layers at the resonator facets, although perpendicular facets can be produced by RIE. Further, it is difficult to produce a facet as smooth as a cleavage plane. Therefore, the facet formation technique using RIE is not yet established. For the reasons described above, the oscillation facets are formed by cleaving at present.

FIGS. 36(a) to 36(e) are sectional views illustrating process steps in a method for fabricating a semiconductor laser disclosed in, for example, IEEE Journal of Quantum Electronics, Vol. 23, 1987, p. 720.

Initially, there are successively grown on an n type GaAs substrate 300 an n type GaAs buffer layer 301, an n type AlGaAs cladding layer 302, an undoped GaAs active layer 303, a p type AlGaAs cladding layer 304, and an n type GaAs current blocking layer 305. These layers are grown by MOCVD on a substrate with a (100) surface orientation. Thereafter, an SiO film 306 is deposited on the current blocking layer 305 by sputtering and patterned by conventional photolithography to form a stripe-shaped opening along the [0$\bar{1}$1] direction (FIG. 36(a)).

In the step of FIG. 36(b), the n type GaAs current blocking layer 305 is etched using a tartaric acid etchant, forming a stripe-shaped groove. In this etching process, a very thin portion of the current blocking layer 305 is left at the bottom of the groove. If the etching is carried out until the surface of p type.AlGaAs cladding layer 304 is exposed at the bottom of the groove, the exposed surface is unfavorably oxidized in air, adversely affecting a crystal layer grown thereon. In addition, (111)A planes are exposed on the opposite side surfaces of the groove.

In the step of FIG. 36(c), the wafer is put in a reactor of an MOCVD apparatus, and the portion of the current blocking layer 305 remaining at the bottom of the groove is selectively removed by vapor phase etching using HCl gas and AsH$_3$ gas.

Subsequently, in the same reactor, a p type AlGaAs cladding layer 307 is selectively grown in the groove by MOCVD (FIG. 36(d)). As shown in FIG. 36(d), the p type AlGaAs cladding layer 307 is not grown with a flat surface. The reason will be described using FIG. 37. As shown in FIG. 37, the growth of the cladding layer 307 starts from the opposite side surfaces of the groove, i.e., the (111)A planes, and from the flat bottom surface of the groove, i.e., the (100) surface. After the groove is completely filled with the layer 307, the growth proceeds forming the (111)B plane that forms an angle of about 54° with respect to the (100) surface, resulting in the uneven surface of the cladding layer 307.

After removing the SiO film 306 using a hydrogen fluoride (HF) etchant, a p type GaAs contact layer 308 is grown by MOCVD (FIG. 36(e)). Even if the p type GaAs contact layer 308 is grown thick as shown in FIG. 36(e), the wafer surface remains uneven.

In this prior art method, the uneven surface of the wafer adversely affects the processing after the crystal growth, for example, photolithography for patterning an upper electrode. Further, if the semiconductor laser fabricated by this prior art method is adhered to a heat sink with the p type GaAs contact layer in contact with the heat sink (junction down), compressive stress is applied to the active layer, reducing the reliability of the laser.

By the way, a technique for growing a crystal layer on a different kind substrate is a key technology for realizing an advanced information processing device, for example, a hybrid IC including an Si electron device and a compound semiconductor light emitting device. Therefore, this crystal growth technique has been extensively studied in many laboratories. Especially a technique for growing GaAs layer on Si has been desired because it has very wide application. In the growth of GaAs on Si, however, unwanted stress is applied to the GaAs layer due to a difference in thermal expansion coefficients between GaAs and Si, resulting in cracks in the GaAs layer.

FIGS. 38(a) to 38(e) are sectional views illustrating a method for growing a GaAs layer on an Si substrate in which the generation of cracks is suppressed, as disclosed in U.S. Pat. No. 5,145,793.

Initially, as illustrated in FIG. 38(a), a first GaAs layer 503 is grown on a first surface of an Si substrate 501 by a two-stage growth method and, thereafter, a BN (boron nitride) film 502 is formed on a second surface of the Si substrate 501 at room temperature. In the two-stage growth method, a low temperature buffer layer 100~400Å thick is grown at a temperature below 500° C. and, thereafter, the wafer is heated to about 700° C., which is suitable for the growth of GaAs, and the GaAs layer 503 is grown to a desired thickness. This two-stage growth method suppresses the three-dimensional growth of GaAs, providing a high-quality epitaxial layer.

Then, as illustrated in FIG. 38(b), grooves 504 are formed by selectively removing portions of the first GaAs layer 503.

These grooves 504 are easily formed by conventional photolithography and wet etching.

After heating the wafer with the grooves 504 to 700~800° C. (FIG. 38(c)), a second GaAs layer 505 and a third GaAs layer 506 as active layers of the device are successively grown on the wafer by MOCVD (FIG. 38(d)). During the growth, since a spontaneous oxide film is formed on the surface of the Si substrate 501 exposed in the grooves 504, the GaAs crystal is not grown in the grooves but selectively grown on the first GaAs layer 503.

Thereafter, portions of the GaAs layers 503, 505, and 506 in the vicinity of each groove 504 are selectively removed, forming a groove 507 larger than the groove 504. The reason why the groove 507 is formed will be described hereinafter. During growing the second and third GaAs layers 505 and 506 in the step of FIG. 38(d), the source gases reaching the groove 504 do not deposit GaAs on the Si substrate 501. The gases are used for the GaAs growth in the vicinity of the groove 504. Therefore, the thickness of the GaAs layer is increased in the vicinity of the groove, and especially the opposite edges of the groove are sharply swollen. Since mechanical stress is concentrated in this swollen part, cracks are generated from this part. The groove 507 is formed by selectively removing the swollen part.

In addition, the BN film 502 on the second surface of the Si substrate suppresses the warpage of the wafer.

As shown in FIG. 40, the generation of cracks in the GaAs layer grown on the Si substrate is closely related with the thickness of the GaAs layer. More specifically, the cracks start to occur when the thickness of the GaAs layer exceeds 3 $\mu$m and increase with an increase in the thickness of the GaAs layer. Most of the cracks are generated from the abnormally grown part of the GaAs layer at the edge of the wafer.

Therefore, in the prior art method illustrated in FIGS. 38(a)–38(e), the first GaAs layer 503 thinner than 2 $\mu$m, that is hardly cracked, is grown first and then the grooves 504 are formed surrounding a region where a device is to be formed (hereinafter referred to as a device region). Thereafter, the second GaAs layer 505 and the third GaAs layer 506 as active regions of the device and the third GaAs layer 506 are successively grown on the first GaAs layer 503. Therefore, the grooves 504 prevent the cracks produced at the edge of the wafer from reaching the device region.

However, this prior art method has the following problems.

FIGS. 39(a) and 39(b) are diagrams for explaining the problems in the prior art method for growing GaAs on Si. In FIG. 39(a), reference numeral 510 designates the GaAs layer and numeral 511 designates cracks. In our experiment, most of the cracks in the GaAs layer are produced from the edge of the wafer and stopped by the grooves 504 before reaching the device region. However, we found more than ten cracks in the 5 cm×5 cm region inside the grooves. On investigation, it was found that the source of these cracks is a rhombic pit shown in FIG. 39(b) which is produced from the interface between the first GaAs layer 503 and the second GaAs layer 505.

The case of the rhombic pit will be described. After the growth of the first GaAs layer 503, the grooves 504 are formed by conventional photolithography and wet etching. In this process, a photoresist deposited on the wafer is not completely removed but partially remains on the wafer as impurities that cause the rhombic pit. Generally, cleaning the surface of the GaAs layer is rather difficult compared to cleaning the surface of the Si substrate, so that it is very difficult to clean the surface of the GaAs layer which is once contaminated by the deposition of the photoresist and the like. However, it is necessary to separate the device region from the wafer edge by the grooves 504 to prevent the cracks produced at the edge of the wafer from reaching the device region.

As a solution to the above-described problem, a GaAs growth on an Si substrate which is previously patterned using an insulating film is proposed. In this method, however, polycrystalline GaAs is unfavorably deposited on the insulating film during growing the low temperature buffer layer. Generally, it is difficult to favorably perform a selective growth at a temperature below 500° C., and the polycrystalline material is deposited on the insulating film. If a GaAs layer is grown on the polycrystalline material at a temperature of about 700° C., another polycrystalline material is produced. As the result, crystals grown on the surface of the wafer are connected to each other, so that the isolation of the region patterned by the insulating film is impossible. Therefore, the cracks produced from the wafer edge unfavorably reach the device region through the polycrystalline on the insulating film.

SUMMARY OF THE INVENTION

An object of the present invention is to provide a method for producing a semiconductor device in which gas etching is combined with a crystal growth using MOCVD, which provides a clean regrowth interface of AlGaAs and prevents the segregation of impurities on the regrowth interface.

Another object of the present invention is to provide an AlGaAs etching technique using a chlorine containing gas which provides an etching surface as smooth as a cleavage plane.

A further object of the present invention is to provide a method and apparatus for etching a compound semiconductor, in which the etching is controlled to a one atomic layer level and a smooth etching surface is attained.

Another object of the present invention is to provide a method for fabricating quantum wire structures with high uniformity and high controllability.

Still another object of the present invention is to provide a method for fabricating a semiconductor laser in which resonator facets are formed by etching, which facets are perpendicular to the resonator length direction, optically very flat, as smooth as a mirror, and are not physically damaged.

Yet another object of the present invention is to provide a method for fabricating a semiconductor laser in which a flat surface is attained after the crystal growth, which flat surface facilitates processing after the crystal growth and secures high reliability even if the junction-down bonding is employed.

A still further object of the present invention is to provide a method for growing a crystal layer on a different kind substrate in which a favorable selective growth is performed on a substrate with an insulating film pattern, at a temperature lower than 500° C., without producing cracks in a region where a device is to be formed.

Other objects and advantages of the present invention will become apparent from the detailed description given hereinafter; it should be understood however, that the detailed description and specific embodiment are given by way of illustration only, since various changes and modifications within the spirit and scope of the invention will become apparent to those skilled in the art from this detailed description.

According to a first aspect of the present invention, in a method for producing a semiconductor device, a compound semiconductor cap layer including no aluminum is grown on a compound semiconductor layer including aluminum, a mask pattern comprising an insulating film is formed on a part of the compound semiconductor cap layer, the compound semiconductor wafer is immersed in an ammonium sulfide solution, the compound semiconductor wafer is selectively etched away using a chlorine containing gas in a reaction chamber, and a groove formed in the etching process is filled with a compound semiconductor layer in the reaction chamber by MOCVD. Therefore, a regrowth interface on which no impurity is segregated is attained, improving the quality of the regrown layer.

According to a second aspect of the present invention, in a method for producing a semiconductor device, a compound semiconductor cap layer including no aluminum is grown on a compound semiconductor layer including aluminum, a mask pattern comprising an insulating film is formed on a part of the compound semiconductor cap layer, an oxide film on the compound semiconductor cap layer is removed in a reaction chamber, the compound semiconductor wafer is selectively etched away using a chlorine containing gas in the reaction chamber, and a groove formed in the etching process is filled with a compound semiconductor layer in the reaction chamber by MOCVD. Therefore, a regrowth interface on which no impurity is segregated is attained, improving the quality of the regrown layer.

According to a third aspect of the present invention, in a method for producing a semiconductor device including etching an $Al_xGa_{1-x}As$ ($0 \leq x \leq 1$) layer by dry etching, the dry etching is a gas etching using a chlorine containing etching gas, a group V gas, and a hydrogen gas which are supplied at the same time. The chlorine containing etching gas is HCl gas or $Cl_2$ gas, the group V gas is arsine ($AsH_3$) gas, tertiary butyl arsine ($C_4H_9AsH_2$) gas, or trimethylarsine (($CH_3)_3As$) gas. The gas etching is carried out under conditions that a partial pressure of the group V gas is in a range from $8 \times 10^{-3}$ Torr to 0.08 Torr and the flow rate of the group V gas to the etching gas is lower than 2.5. Therefore, a very smooth etching surface is attained and the etching surface is not damaged.

According to a fourth aspect of the present invention, in a method for fabricating a semiconductor laser, a plurality of $Al_xGa_{1-x}As$ ($0 \leq x \leq 0$) layers are grown on a semiconductor substrate to form a prescribed laser diode structure, an etching mask comprising an insulating film is formed on a part of the laser diode structure, and an oscillation facet of the laser diode is formed by gas etching using an etching gas selected from HCl gas and $Cl_2$ gas, a group V gas selected from arsine ($AsH_3$) gas, tertiary butyl arsine ($C_4H_9AsH_2$) gas, and trimethylarsine (($CH_3)_3As$) gas, and a hydrogen gas, which are supplied at the same time. The gas etching is performed under conditions that the partial pressure of the group V gas is in a range from $8 \times 10^{-3}$ Torr to 0.08 Torr and the flow rate of the group V gas to the etching gas is lower than 2.5. Therefore, a laser oscillation facet as smooth as a cleavage facet is easily formed by the gas etching.

According to a fifth aspect of the present invention, in a method for fabricating a refractive index guide type semiconductor laser with a window structure, a plurality of $Al_xGa_{1-x}As$ ($0 \leq x \leq 0$) layers are grown on a semiconductor substrate to form a semiconductor multilayer structure including an active region, a protective film is formed on a part of the semiconductor multilayer structure, the semiconductor multilayer structure is selectively etched away by a gas etching using an etching gas selected from HCl gas and $Cl_2$ gas, a group V gas selected from arsine ($AsH_3$) gas, tertiary butyl arsine ($C_4H_9AsH_2$) gas, and trimethylarsine (($CH_3)_3As$) gas, and hydrogen, which gases are supplied at the same time, using the protective film as a mask. The gas etching is performed under conditions that the partial pressure of the group V gas is in a range from $8 \times 10^{-3}$ Torr to 0.08 Torr and the flow ratio of the group V gas to the etching gas is lower than 2.5. Thereafter, a semi-insulating or high-resistivity semiconductor material having an energy band gap larger than that of the laser oscillation region is grown on opposite sides of a ridge structure formed by the etching process, providing a current blocking structure and a window structure at the same time. After removing the protective film, an ohmic contact layer is grown on the surface of the wafer. Therefore, the semiconductor laser diode having the window layer on the facet is easily fabricated.

According to a sixth aspect of the present invention, a method for producing a semiconductor device including etching a III-V compound semiconductor layer comprises a first etching step including introducing a group V gas and a chlorine containing gas into a reactor so that the chlorine containing gas is supplied in a pulse for a time interval shorter than the supply time of the group V gas, and a second etching step including halting the supply of the group V gas and the chlorine containing gas and purging the inside of the reactor with hydrogen. The first etching step and the second etching step are alternatingly repeated. Therefore, it is possible to control the etching at one-atomic layer level, providing a smooth etching surface.

According to a seventh aspect of the present invention, an apparatus for producing a semiconductor device includes a rotatable disc susceptor on which a semiconductor wafer is disposed, and means for partitioning the surface of the susceptor into a plurality of regions using hydrogen is prepared. At least one of the regions is filled with a gas mixture comprising a group V material hydride gas, a chlorine containing gas, and hydrogen. At least one of the regions is filled with hydrogen. A semiconductor wafer on the susceptor is successively moved through the regions by rotation of the susceptor. Therefore, it is possible to control the etching at one-atomic layer level, providing a smooth etching surface.

According to an eighth aspect of the present invention, in a method for producing a semiconductor device, an apparatus including a rotatable disc susceptor on which a semiconductor wafer is disposed and means for partitioning the surface of the susceptor into a plurality of regions using hydrogen is prepared. At least one of the regions is filled with a gas mixture comprising a group V material hydride gas, a chlorine containing gas, and hydrogen. At least one of the regions is filled with hydrogen. A semiconductor wafer on the susceptor is successively moved through the regions with the rotation of the susceptor. A first etching step is carried out in the region filled with the gas mixture and a second etching step is carried out in the region filled with hydrogen. The first etching step and the second etching step are alternatingly repeated. Therefore, it is possible to control the etching at one-atomic layer level, providing a smooth etching surface.

According to a ninth aspect of the present invention, in a method for producing a quantum wire structure, a first semiconductor layer is formed on a semiconductor substrate with a {100} surface orientation, an etching mask having a stripe-shaped opening extending along a <011> direction is formed on the first semiconductor layer, the first semiconductor layer is selectively etched etching using an etching gas selected from HCl gas and $Cl_2$ gas, a group V gas selected from arsine (AsH$_3$) gas, tertiary butyl arsine (C$_4$H$_9$AsH$_2$) gas, and trimethylarsine ((CH$_3$)$_3$As) gas, and hydrogen, which gases are introduced into a reactor at the same time. The gas etching is carried out under conditions that the partial pressure of the group V gas is in a range from $8\times10^{-3}$ Torr to 0.08 Torr and the flow ratio of the group V gas to the etching gas is lower than 2.5, thereby forming a stripe-shaped V groove with side surfaces of {111}B planes. Thereafter, a second semiconductor layer having an energy band gap smaller than that of the first semiconductor layer is formed in the vicinity of the bottom of the V groove, and a third semiconductor layer having an energy band gap larger than that of the second semiconductor layer is formed on the second semiconductor layer.

According to a tenth aspect of the present invention, in a method for producing quantum wire structures, a first high-resistivity layer comprising a first semiconductor is grown on a semiconductor substrate, a second high-resistivity layer comprising a second semiconductor and having an electron affinity smaller than that of the first semiconductor and a third high-resistivity layer comprising same material as the first semiconductor are successively grown on the first high-resistivity layer, and alternating projections and recesses are formed in the second high resistivity layer so that the cross section of each recess is an inverted triangle. The alternating projections and recesses are formed by a gas etching using an etching gas selected from HCl gas and Cl$_2$ gas, a group V gas selected from arsine (AsH$_3$) gas, tertiary butyl arsine (C$_4$H$_9$AsH$_2$) gas, and trimethylarsine ((CH$_3$)$_3$As) gas, and hydrogen, which are introduced into a reactor at the same time, under conditions that the partial pressure of the group V gas is in a range from $8\times10^{-3}$ Torr to 0.08 Torr and the flow ratio of the group V gas to the etching gas is lower than 2.5. Therefore, high-quality quantum wires are. formed with high controllability.

According to an eleventh aspect of the present invention, in a method for fabricating a semiconductor laser, at least a first conductivity type Al$_y$Ga$_{1-y}$As cladding layer, an Al$_z$Ga$_{1-z}$As (0≦z<y) active layer, a second conductivity type Al$_w$Ga$_{1-w}$As (z<w) cladding layer, and a first conductivity type GaAs current blocking layer are successively grown on a first conductivity type GaAs substrate with a {100} surface orientation, an insulating film having a stripe-shaped opening extending along a <011> direction is formed on the semiconductor wafer after the crystal growth process, the semiconductor wafer is selectively etched away by vapor phase etching with a chlorine containing gas using the insulating film as a mask, forming a stripe-shaped groove with side surfaces of {111}B planes and a bottom surface of the second conductivity type cladding layer, and a second conductivity type Al$_w$Ga$_{1-w}$As layer is grown in the stripe-shaped groove. Since no crystal is grown on the {111}B planes, the groove is filled with the crystal layer grown from the bottom surface of the groove, resulting in a flat surface of the wafer.

According to a twelfth aspect of the present invention, in a method for fabricating a semiconductor laser, at least a first conductivity type Al$_y$Ga$_{1-y}$As cladding layer, an Al$_z$Ga$_{1-z}$As (0≦z <y) active layer, and a second conductivity type Al$_w$Ga$_{1-w}$As (z<w) cladding layer are successively grown on a first conductivity type GaAs substrate with a {100} surface orientation, a stripe-shaped insulating film pattern extending along a <011> direction is formed on a part of the semiconductor wafer after the crystal growth process, an oxide film on the surface of the semiconductor wafer is removed by an ammonium sulfide treatment or a surface cleaning conducted in a reaction chamber, the semiconductor wafer is selectively etched away by vapor phase etching with a chlorine containing gas using the insulating film pattern as a mask, forming a stripe-shaped ridge structure with side walls of {111}B planes, and a current blocking layer is formed on opposite sides of the ridge structure contacting the side walls. Therefore, a highly-reliable AlGaAs buried heterojunction laser is achieved.

According to a thirteenth aspect of the present invention, in a method for epitaxially growing a III-V compound semiconductor layer on a substrate with an insulating film pattern by MOCVD, the epitaxial growth is carried out while supplying source gases and HCl gas or Cl$_2$ gas at the same time under the condition that the molar flow ratio of the HCl gas or Cl$_2$ gas to the group III gas is lower than 0.3.

According to a fourteenth aspect of the present invention, in a method for epitaxially growing a semiconductor layer comprising a second semiconductor material on a semiconductor substrate comprising a first semiconductor material by MOCVD, an insulating film is deposited on the semiconductor substrate and patterned so as to surround a region of the semiconductor substrate on which a device is to be produced, a low temperature buffer layer comprising the second semiconductor material is grown on the semiconductor substrate while supplying source gases and HCl gas or Cl$_2$ gas at a temperature lower than 500° C., the semiconductor layer comprising the second semiconductor material being grown at a temperature higher than 600° C. Therefore, cracks produced in the semiconductor layer grown on the different kind of semiconductor substrate are suppressed.

According to a fifteenth aspect of the present invention, in the method for epitaxially growing the low temperature buffer layer comprising the second semiconductor material, the molar flow ratio of the HCl gas or Cl$_2$ gas to the group III gas is lower than 0.3. Therefore, cracks produced in the semiconductor layer grown on the different kind of semiconductor substrate are suppressed, and a high-quality crystal layer is grown on the substrate.

DETAILED DESCRIPTION OF THE PREFERRED EMBODIMENTS

Figure 41:
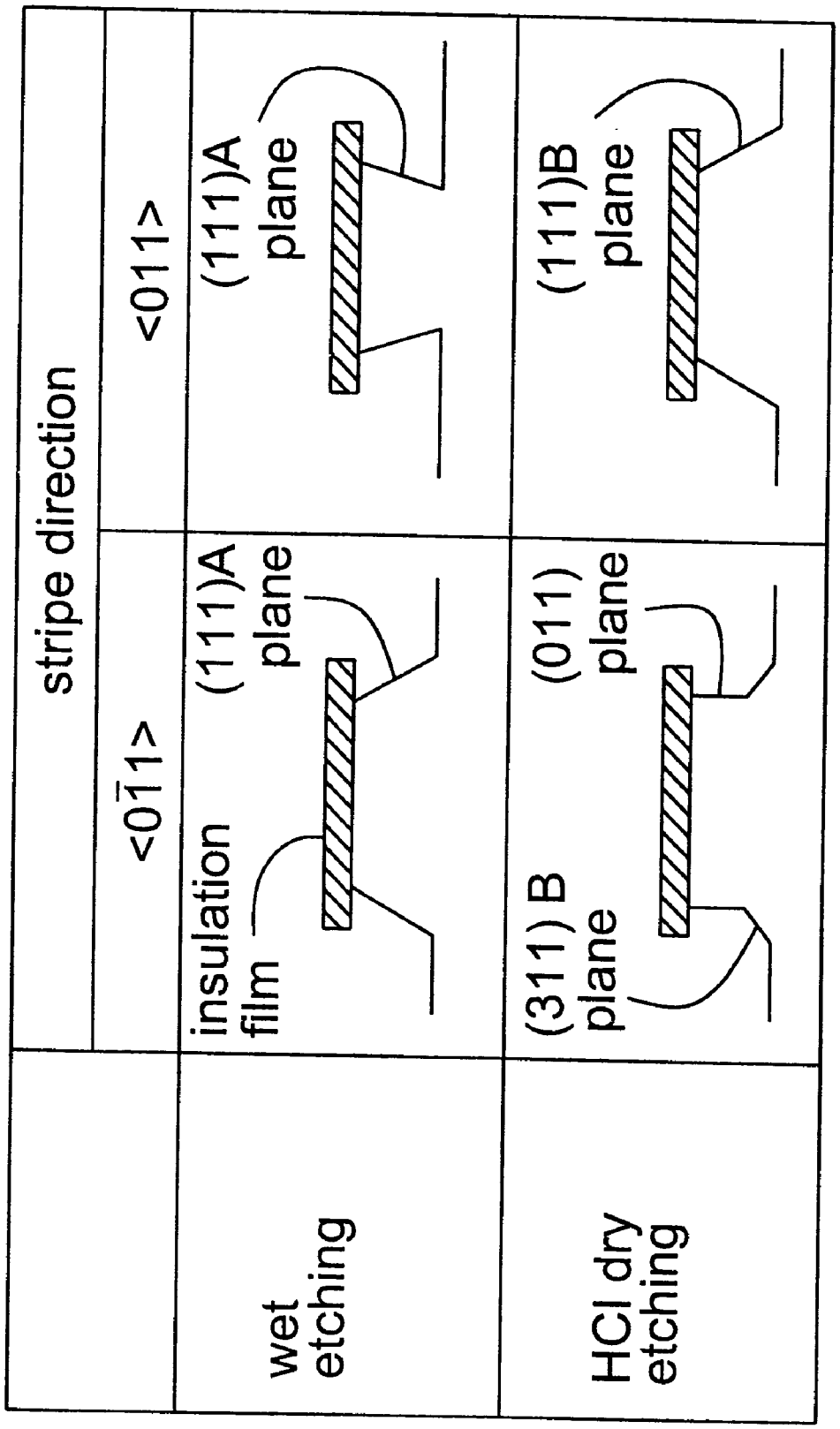

FIG. 41 illustrates etching results for various etchants and crystalline orientations of semiconductor wafers.

FIGS. 1(a)–1(e) are sectional views illustrating a method for producing a semiconductor device in accordance with a first embodiment of the present invention.

Initially, an $Al_xGa_{1-x}As$ layer 2 and a GaAs cap layer 11 are successively grown on a GaAs substrate 23 by MOCVD (first crystal growth). Preferably, the $Al_xGa_{1-x}As$ layer 2 is 2 $\mu$m thick and the cap layer 11 is 0.1 $\mu$m thick. This sample wafer is taken out from the reaction chamber and left in the air for a few days. During exposure to air, a thin oxide film 12 is formed on the surface of the GaAs layer 11. The wafer in this state is illustrated in FIG. 1(a).

Figure 1:
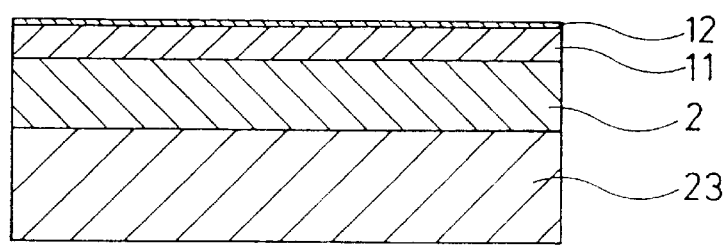
FIGS. 1(*a*)–1(*e*) are sectional views illustrating a method for fabricating a semiconductor device in accordance with a first embodiment of the present invention.
Figure 1:
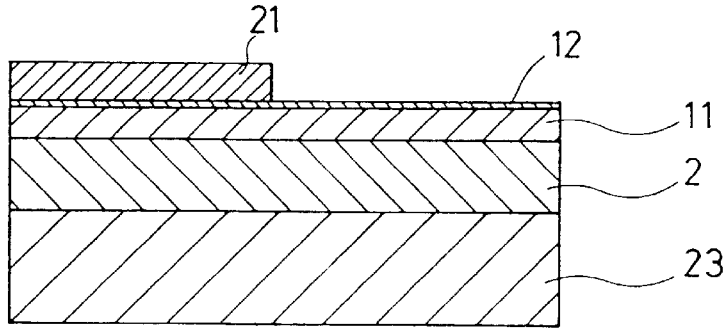
Figure 1:
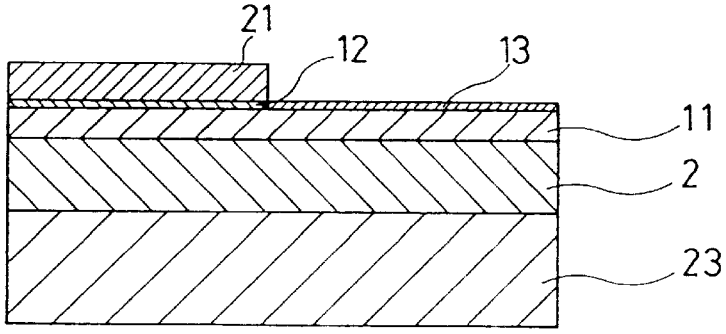
Figure 1:
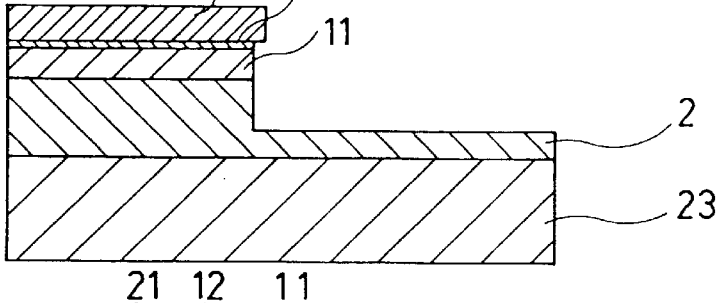
Figure 1:
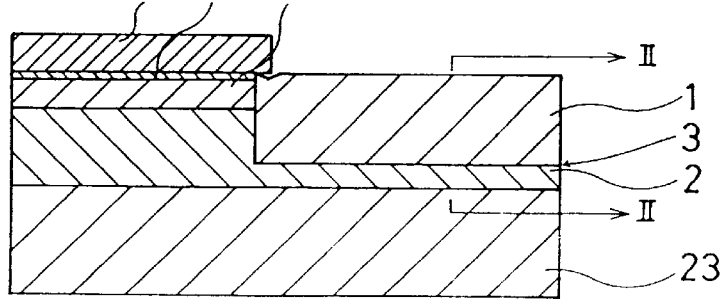

In the step of FIG. 1(b), an SiN film pattern 21 of a desired shape is formed on the surface of the wafer. Then, the wafer is immersed in an ammonium sulfide solution at 60° C. for three hours. In this embodiment, $(NH_4)_2S$ is employed as the ammonium sulfide solution. During this process, a part of the oxide film 12 which is not masked with the SiN film 21 is etched away and a sulfur film 13 is formed as shown in FIG. 1(c). Then, the wafer is put in an MOCVD chamber and annealed in a hydrogen ambient at 450° C. for thirty minutes. Then, a part of the wafer that is not masked with the SiN film 21 is etched down to a depth of 1 $\mu$m using a gas mixture of $AsH_3$:HCl:$H_2$ and, subsequently, a GaAs layer 1 is grown in the same chamber.

Figure 2:
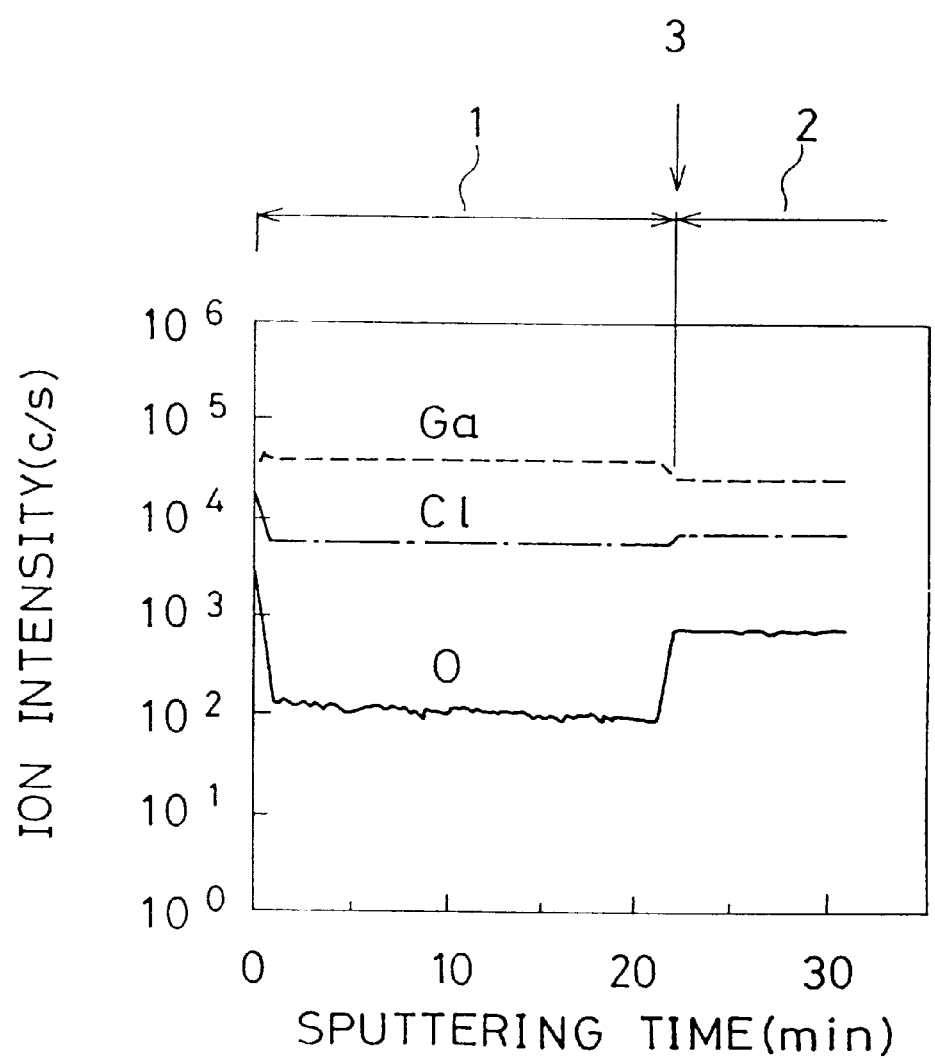
FIG. 2 is a graph illustrating SIMS profiles of impurity ion concentrations for explaining an effect of a compound semiconductor etching method in accordance with a second embodiment of the present invention.

FIG. 2 illustrates SIMS profiles of impurity ion concentrations in the vicinity of the regrowth interface 3 (cross section taken along line II—II of FIG. 1(e)) of the sample wafer fabricated according to the process steps of FIGS. 1(a)–1(e).

Figure 32:
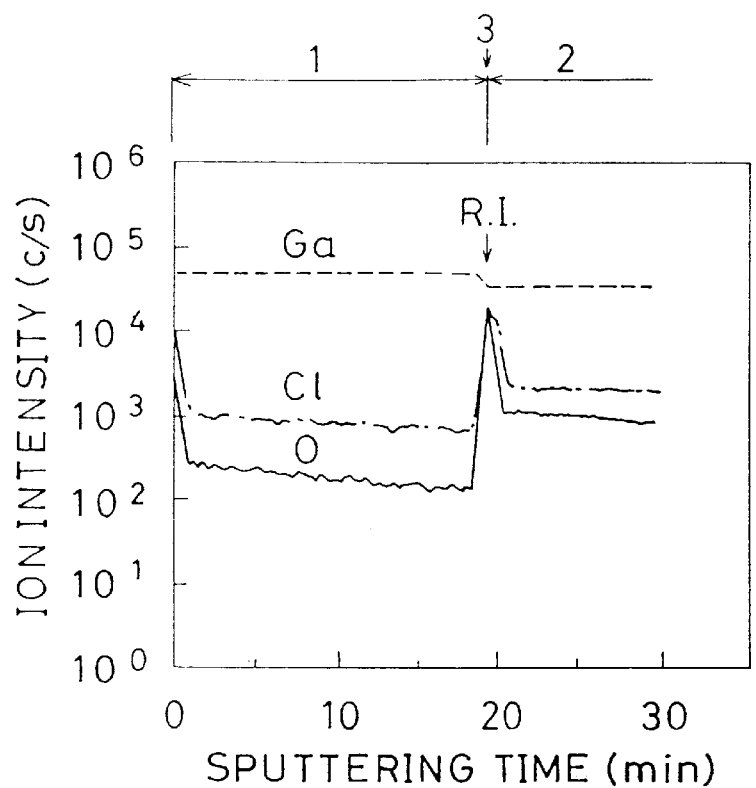
FIGS. 32(a) and 32(b) are graphs illustrating SIMS profiles of impurity ion concentrations for explaining problems in the compound semiconductor etching methods according to the prior art.
Figure 32:
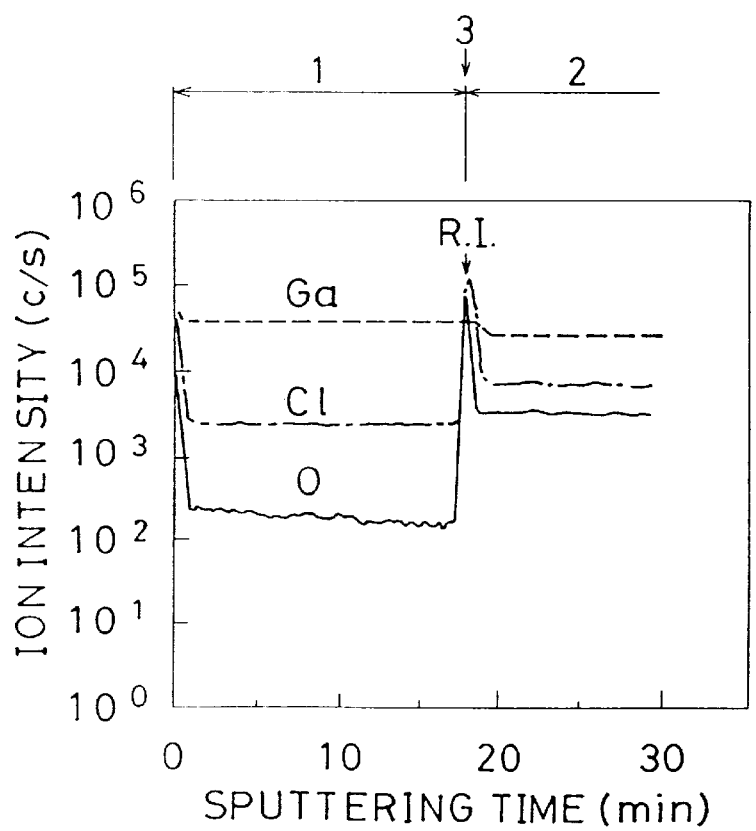
Figure 33:
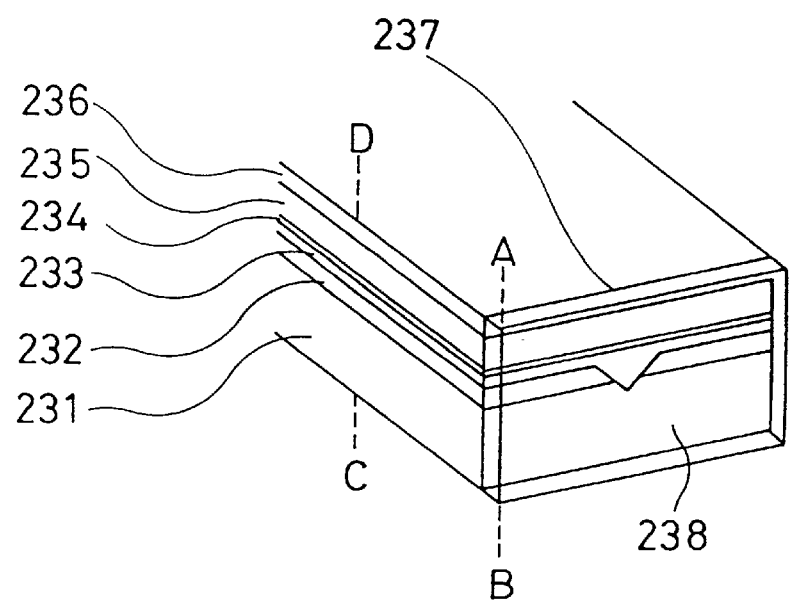
FIG. 33 is a perspective view illustrating a prior art semiconductor laser with a window structure.
Figure 34:
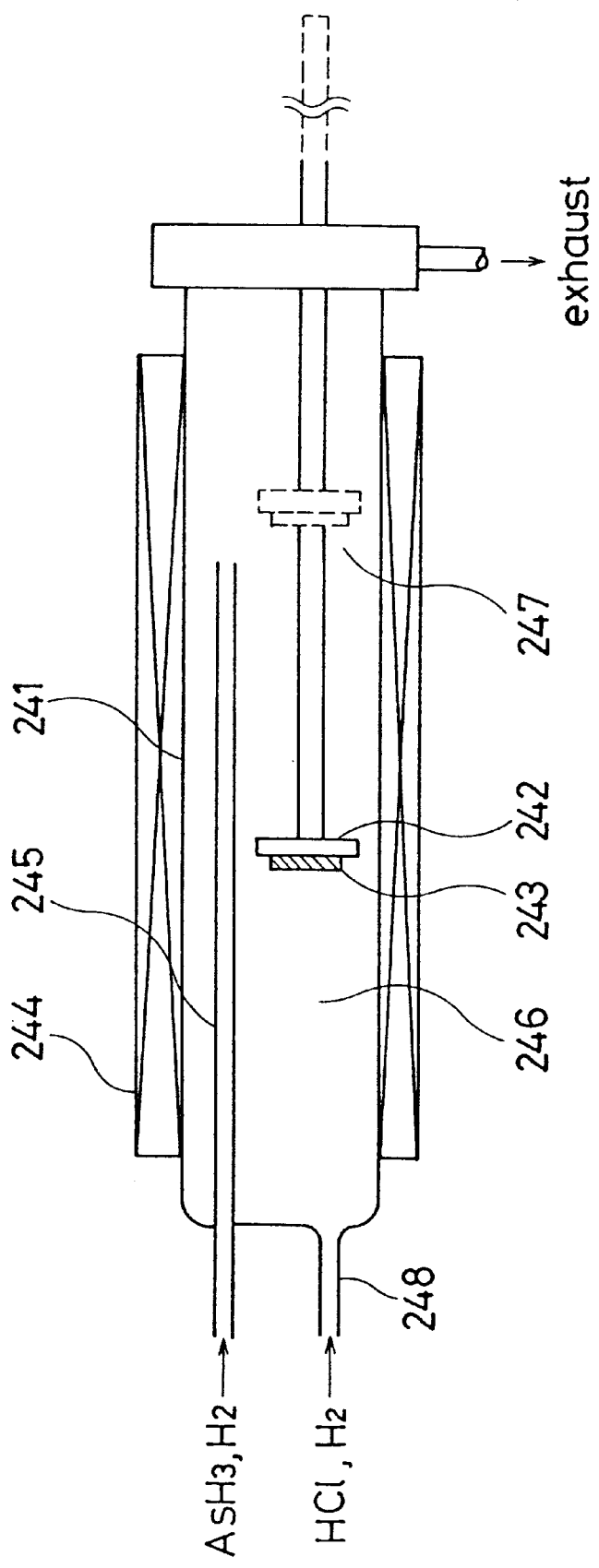
FIG. 34 is a schematic diagram for explaining a compound semiconductor etching method according to the prior art.
Figure 35:
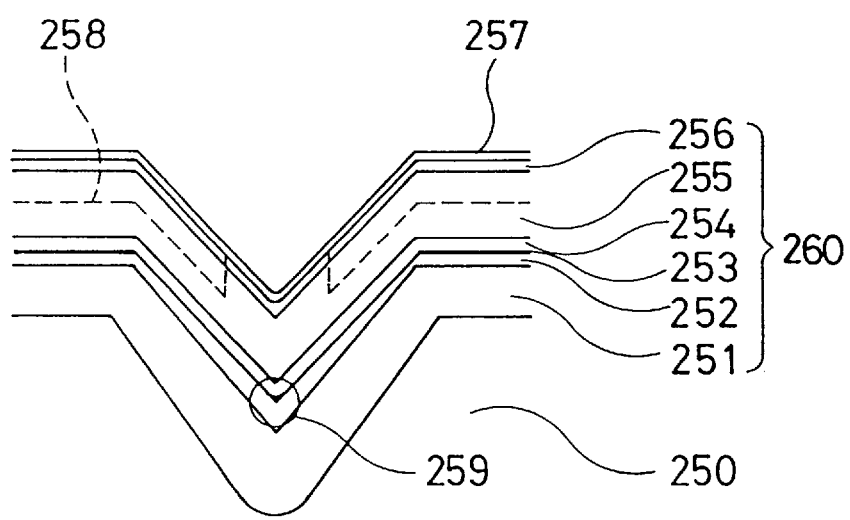
FIG. 35 is a sectional view for explaining problems of a quantum wire of a prior art quantum wire laser.
Figure 36:
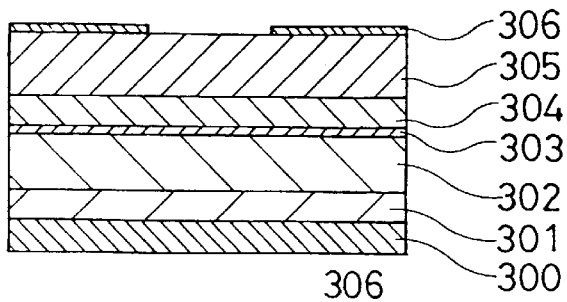
FIGS. 36(a)–36(e) are sectional views illustrating process steps in a method for fabricating a semiconductor laser according to the prior art.
Figure 36:
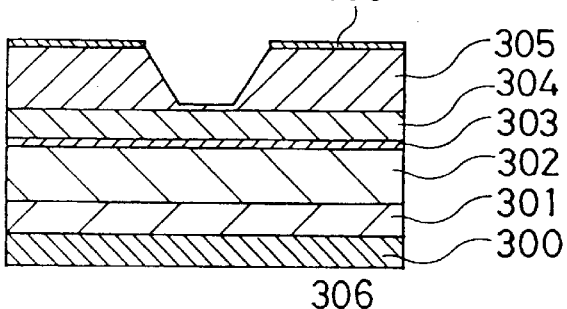
Figure 36:
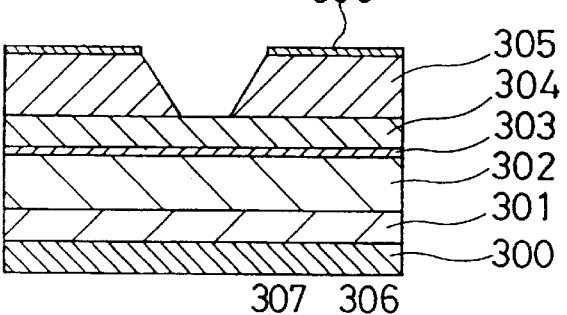
Figure 36:
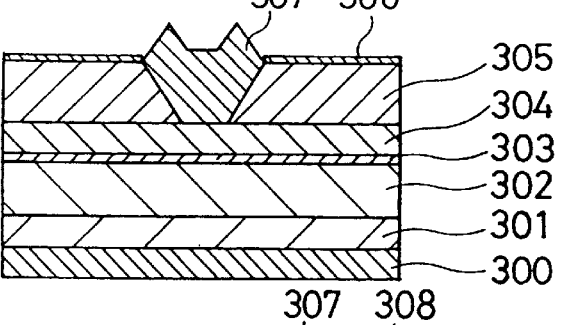
Figure 36:
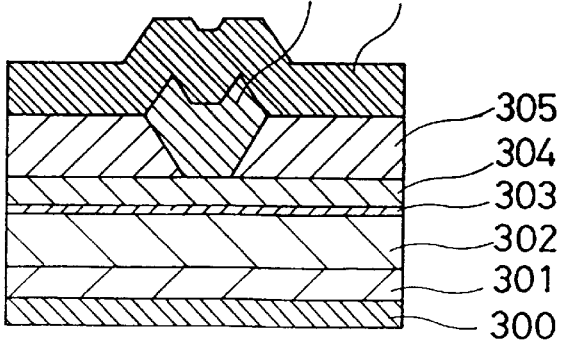
Figure 37:
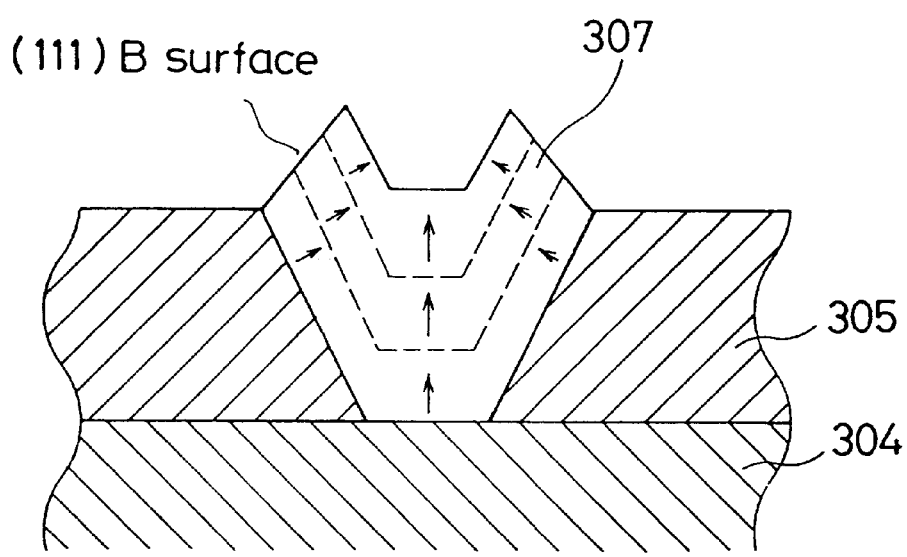
FIG. 37 is a sectional view for explaining a crystal growth in a groove in the process step of FIG. 36(d).
Figure 38:
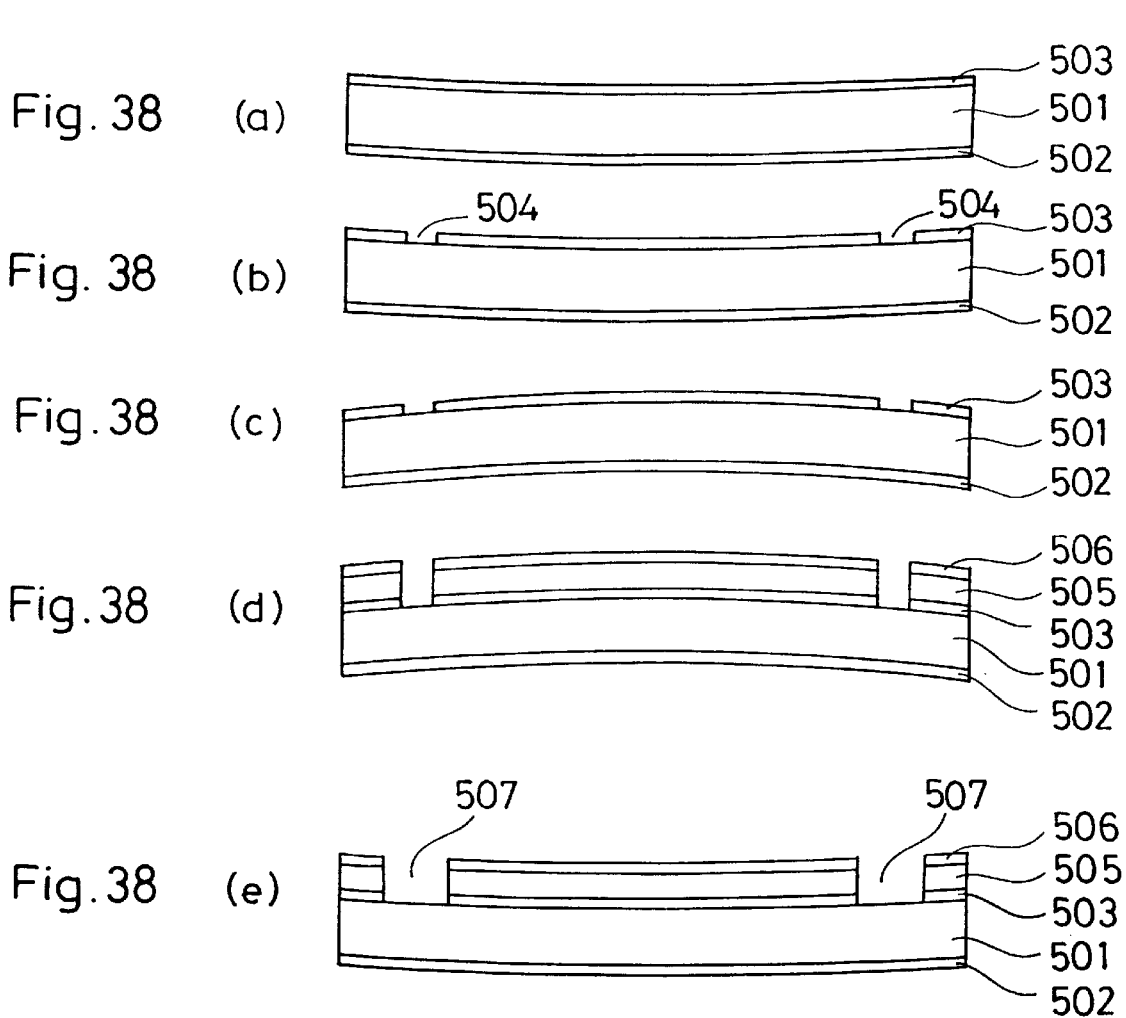
FIGS. 38(a)–38(e) are sectional views illustrating process steps in a method for growing a GaAs layer on an Si substrate according to the prior art.
Figure 39:
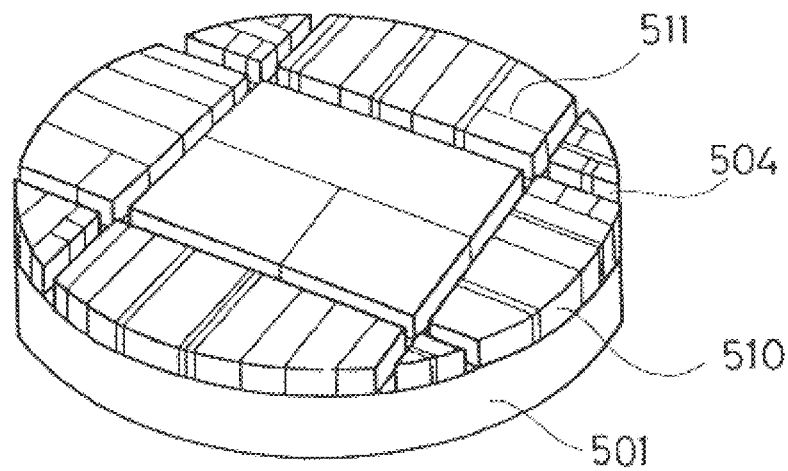
FIGS. 39(a) and 39(b) are diagrams for explaining problems in the method of FIGS. 38(a)–38(e).
Figure 39:
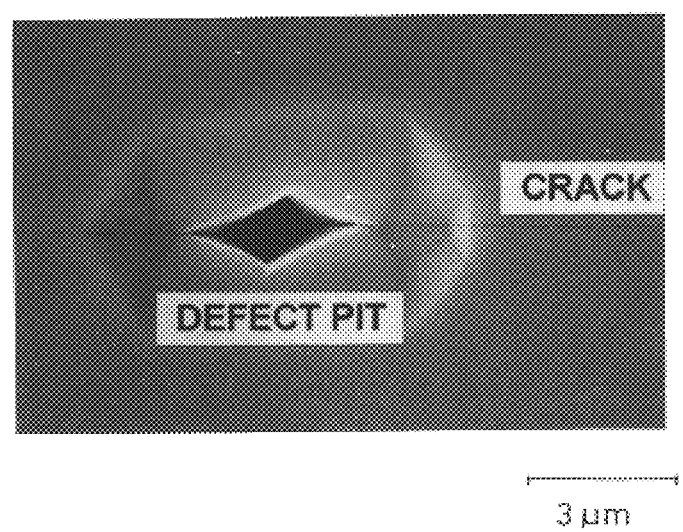
Figure 40:
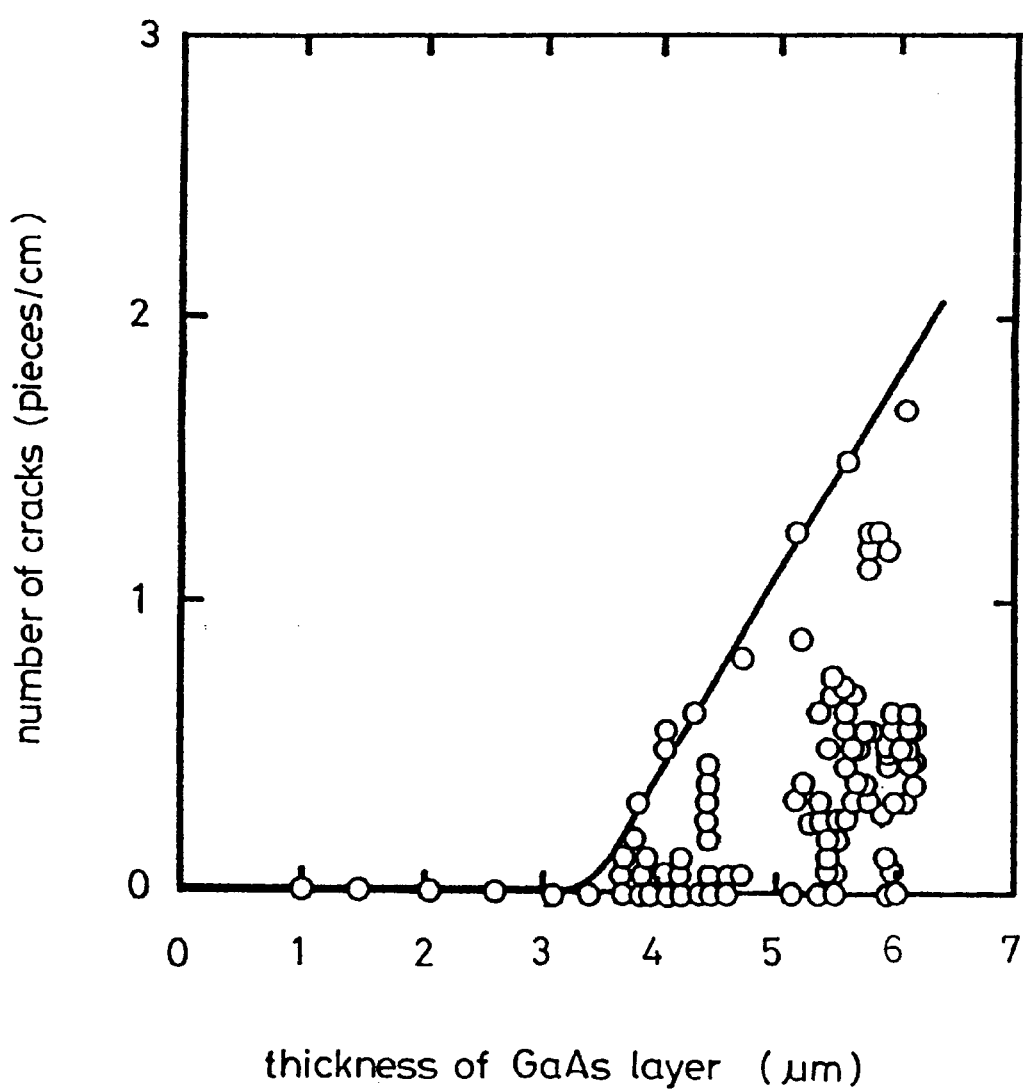
FIG. 40 is a graph illustrating a relation between the number of cracks produced in a GaAs layer grown on an Si substrate and the thickness of the GaAs layer.

In FIG. 2, no segregation of impurities, i.e., O and Cl, on the regrowth interface 3 is observed and the dislocation density of the regrown GaAs layer 1 is improved to $1\times10^4$/$cm^2$. In the prior art method employing only the GaAs cap layer, the segregations of impurities on the regrowth interface are not completely prevented as shown in FIG. 32(a). In this first embodiment of the present invention, since the GaAs cap layer 11 is employed and the $(NH_4)_2S$ treatment is performed before the etching process, the cleanliness of the regrowth interface and the quality of the regrown GaAs layer are significantly improved.

The effect of the (NH$_4$)$_2$S treatment is described in Applied Physics Letters, Vol. 58, No. 9, 1989, pp. 1340~1344. The oxide film on the surface of the GaAs layer is etched away by the (NH$_4$)$_2$S treatment, and sulfur (S) atoms are attached to the surface of the GaAs layer forming a surface protection film that prevents the GaAs surface from being oxidized.

Meanwhile, in Japanese Published Patent Application No. 4-10683, before growing a crystal layer on a GaAs or AlGaAs substrate, the surface of the substrate is cleaned using ammonium sulfide to remove an oxide film on the surface and to discourage the generation of another oxide film, whereby the quality of the crystal layer grown on the surface is improved.

However, in order to grow a high-quality GaAs layer on the surface of the GaAs layer covered with the sulfur thin film, the sulfur thin film must be removed by some means. According to an experiment by the inventor of this disclosure, the S atoms on the GaAs surface are not completely removed by the thermal cleaning due to the temperature rise before the MOCVD growth, and the S atoms segregated on the regrowth interface deterioration the quality of the regrown crystal layer. On the other hand, no effective means for removing the sulfur thin film serving as a surface protection film has been reported.

In order to attain a clean regrowth interface after the vapor phase etching, the surface before the etching process must be unoxidized. Although the (NH$_4$)$_2$S treatment is suitable for this purpose, the sulfur film deposited on the surface during the treatment cannot be completely removed as described above. The inventors of the present invention found that the HCl gas etching is very effective to remove the sulfur film and confirmed that a clean regrowth interface is attained after the gas etching if the (NH$_4$)$_2$S treatment is combined with the HCl gas etching.

As described above, the GaAs cap layer alone cannot provide a clean regrowth interface after the vapor phase etching because the etching is adversely affected by the very thin oxide film on the GaAs cap layer. Therefore, cleaning the surface of the GaAs cap layer is very important. In this first embodiment, since the (NH$_4$)$_2$S treatment, which is a conventional surface cleaning technique, is combined with the HCl gas etching, an effective and practical surface treatment is attained for the first time, resulting in an advanced composite process comprising HCl gas etching and MOCVD growth.

While in the above-described first embodiment the wafer with the sulfur film is put in the MOCVD chamber and annealed in a hydrogen ambient, the annealing is not necessarily carried out in the hydrogen ambience. In addition, the annealing may be performed while increasing the wafer temperature in the reactor.

While in the above-described first embodiment the compound semiconductor including aluminum is AlGaAs and the compound semiconductor grown thereon and including no aluminum is GaAs, the present invention may be applied to other crystal growths employing other compound semiconductors.

A description is given of a method for producing a semiconductor device in accordance with a second embodiment of the present invention.

In the second embodiment of the present invention, after forming the GaAs cap layer 11 on the AlGaAs layer 2 (FIG. 1(a)) and forming the insulating mask 21 on a part of the cap layer (FIG. 1(b)), the oxide film 12 on the cap layer 11 is removed not by the (NH$_4$)$_2$S treatment but by another surface cleaning method carried out in the reactor. Thereafter, etching using a chlorine containing gas is carried out in the same reactor and, successively, the groove formed in the wafer by the gas etching is filled with a compound semiconductor layer by MOCVD.

Although it is described in the first embodiment that the (NH$_4$)$_2$S treatment is an effective technique for cleaning the GaAs cap layer, the surface cleaning process performed in the reactor before the gas etching and the crystal growth also provides a clean regrowth interface. Preferably, the surface cleaning method of this second embodiment is irradiation with ultraviolet light or application of a hydrogen plasma that reduces the oxide film.

While in the above-described second embodiment the compound semiconductor including aluminum is AlGaAs and the compound semiconductor grown thereon and including no aluminum is GaAs, the present invention may be applied to crystal growths employing other compound semiconductors.

A description is given of a method for producing a semiconductor device in accordance with a third embodiment of the present invention. In this third embodiment, during the vapor phase etching of the compound semiconductor which is also carried out in the above-described first and second embodiments, etching conditions are precisely controlled to attain a smooth etching surface. The vapor phase etching of this third embodiment is developed in an experiment described below.

An Al$_x$Ga$_{1-x}$As (x=0.48) layer 2 µm thick with a GaAs cap layer 0.1 µm thick is employed as a sample. The etching is started from the GaAs cap layer, and the surface of the sample, after the etching of about 1 µm, is examined with a differential interference microscope.

In this experiment, a flow rate of AsH$_3$ gas to HCl gas exceeding a prescribed value results in a rough etching surface, and an AsH$_3$ gas flow rate not reaching a prescribed value also results in a rough etching surface. Therefore, when GaAs or AlGaAs is etched with AsH$_3$ gas, H$_2$ gas, and HCl gas which are introduced into the chamber at the same time, the flow rates of the ASH$_3$ gas and the HCl gas applied to the wafer surface must be precisely controlled to attain a smooth etching surface. More specifically, in order to etch the AlGaAs layer with a smooth surface, As chloride (for example, AsCl$_3$), Ga chloride (GaCl$_3$), and Al chloride (AlCl$_3$) have to be uniformly evaporated from the surface. However, since the evaporation temperatures of AsCl$_3$, GaCl$_3$, and AlCl$_3$ are different from each other, i.e., 130° C., 201° C., and 180° C., respectively, it is difficult to uniformly evaporate these chlorides from the surface. The evaporation of AsCl$_3$ from the surface is suppressed by adding a proper amount of AsH$_3$, whereby the evaporations of the respective chlorides are balanced. Therefore, it is necessary to optimize the flow rate of AsH$_3$ gas to HCl gas to attain a smooth etching surface.

Figure 3:
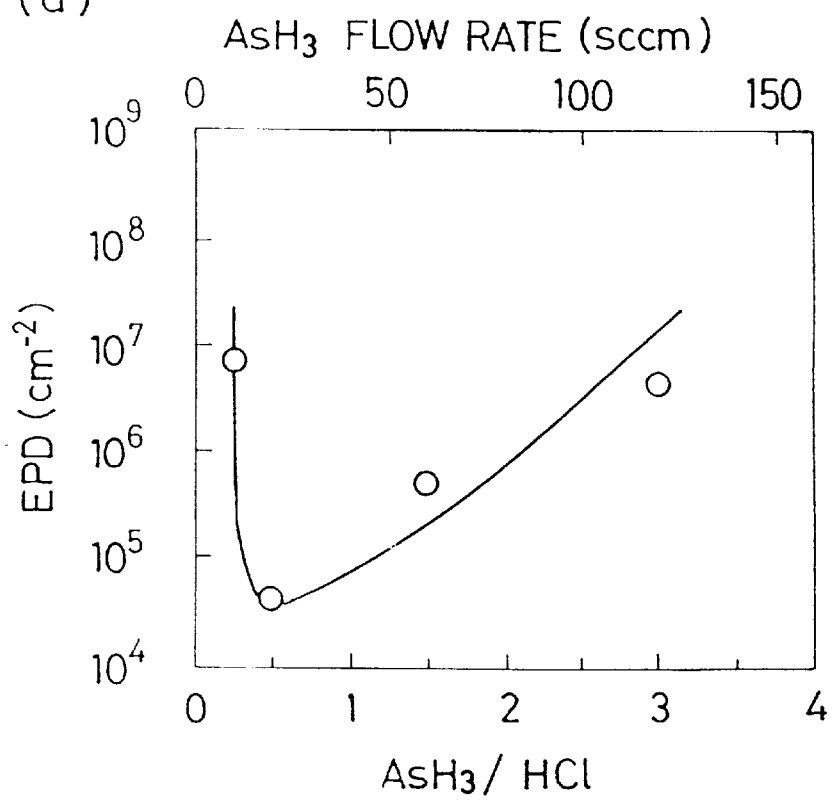
FIGS. 3(*a*) and 3(*b*) are graphs for explaining a method for fabricating a semiconductor device in accordance with a third embodiment of the present invention.
Figure 3:
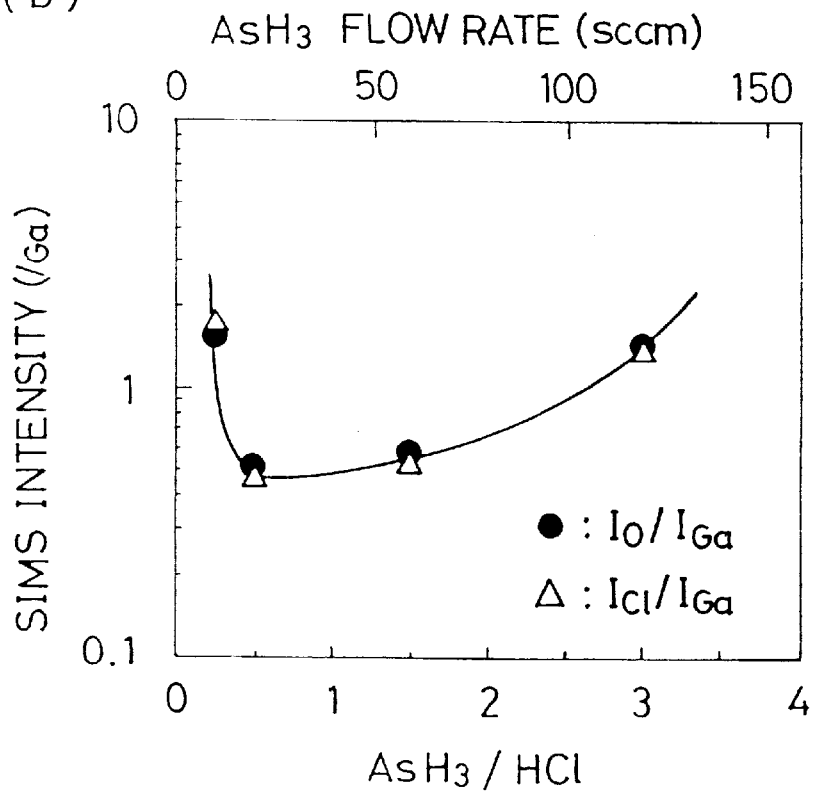

FIG. 3(a) is a graph illustrating AsH$_3$ flow rate dependence of the dislocation density (EPD) of the GaAs regrown layer when the flow rate of 20% dilute AsH$_3$ gas is varied under conditions that the etching temperature is 750° C., the etching pressure is 10 Torr, the flow rate of 10% dilute HCl gas is 80 sccm, and the total gas flow rate is 2.5 slm. FIG. 3(b) is a graph illustrating AsH$_3$ flow rate dependence of oxygen density (I$_O$) and chlorine density (I$_{Cl}$) on the etching surface under the same etching conditions as described above. From the result of this experiment, it is found that the optimum etching condition is attained when the $AsH_3$ partial pressure is 0.016 Torr and the flow ratio of $AsH_3$ gas to HCl gas is 0.5. The $AsH_3$ partial pressure is attained by dividing the $AsH_3$ flow rate by the total flow rate and multiplying by the pressure in the reaction chamber. A smooth etching surface is attained when the $AsH_3$ partial pressure is in a range from $8 \times 10^{-3}$ Torr to 0.08 Torr and the flow ratio of $AsH_3$ gas to HCl gas is below 2.5. In addition, this etching method does not adversely affect the etching surface, differently from the conventional RIE, because the etching is carried out only by the chemical reaction.

According to the third embodiment of the present invention, in the vapor phase etching of $Al_xGa_{1-x}As$ ($0 \leq x \leq 1$), gas etching using HCl gas, $AsH_3$ gas, and $H_2$, which are introduced into the reactor at the same time, is employed, and the gas etching is carried out with the $AsH_3$ partial pressure in a range from $8 \times 10^{-3}$ Torr to 0.08 Torr and the flow rate of the $AsH_3$ gas to the HCl gas lower than 2.5. Therefore, a smooth etching surface is attained and the etching surface is prevented from being damaged.

While in the above-described third embodiment the HCl gas is employed as the etching gas and the $AsH_3$ gas is employed as the group V gas, the etching gas may be $Cl_2$ gas and the group V gas may be tertiary butyl arsine ($C_4H_9AsH_2$) or trimethylarsine (($CH_3$)$_3$As). Since the chemical reaction during the etching process with these gases is the same as described above, the same effects as described above are attained if the etching is carried out with the partial pressure of the group V gas in a range from $8 \times 10^{-3}$ Torr to 0.08 Torr and the flow ratio of the group V gas to the etching gas lower than 2.5.

If the etching method of this third embodiment is combined with the surface cleaning method according to the first or second embodiment, the segregation of impurities on the etching surface is suppressed, significantly improving the quality of a crystal layer grown on the etching surface.

A description is given of a method for fabricating a semiconductor laser in accordance with a fourth embodiment of the present invention.

Figure 4:
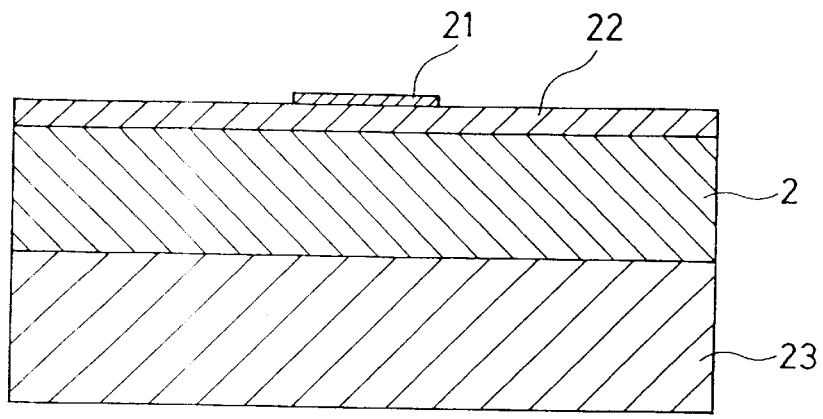
FIGS. 4(*a*)–4(*c*) are sectional views illustrating a method for fabricating a semiconductor laser in accordance with a fourth embodiment of the present invention.
Figure 4:
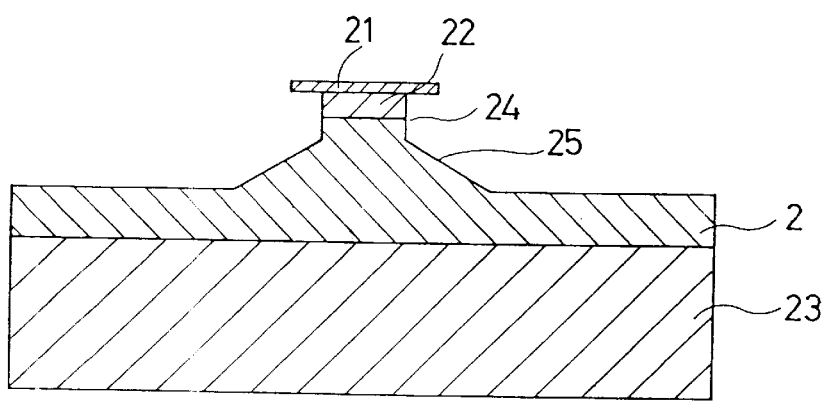
Figure 4:
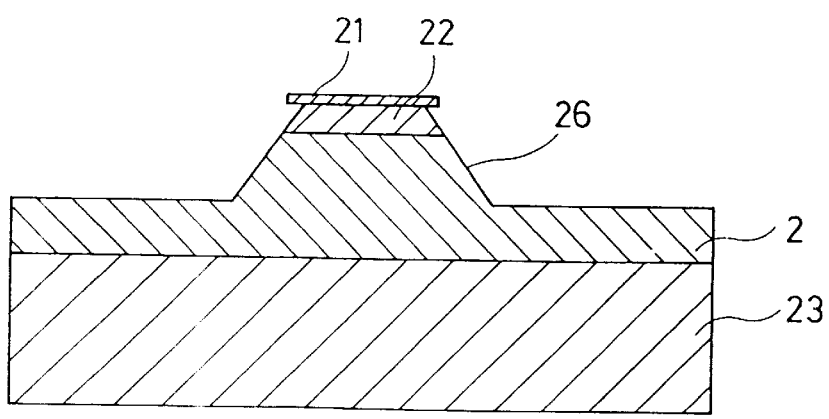

FIGS. 4(a)–4(c) are sectional views for explaining a relation between the stripe direction of the mask pattern and the etching profile when the etching is carried out under the etching conditions according to the above-described third embodiment of the present invention.

In FIG. 4(a), an AlGaAs layer 2 and a GaAs cap layer 22 are disposed on a (100) surface of a GaAs substrate 23, and a stripe-shaped SiN pattern 21 is disposed on a part of the cap layer 22. FIG. 4(b) illustrates an etching profile attained when the wafer is etched down using the stripe-shaped SiN pattern 21 extending along the [011] direction and FIG. 4(c) illustrates an etching profile attained when the wafer is etched down using the stripe-shaped SiN pattern 21 extending along the [0$\bar{1}$1] direction.

With the stripe-shaped mask pattern extending along the [0$\bar{1}$1] direction, a ridge structure having two individual tapered planes, i.e., a (011) plane 24 and a (311) plane 25, is formed as shown in FIG. 4(b). On the other hand, with the stripe-shaped mask pattern extending along the [011] direction, a ridge structure having a (111)B plane 26 is formed as shown in FIG. 4(c). These etching profiles attained by the HCl dry etching are compared to the etching profiles attained by the conventional wet etching in FIG. 4I.

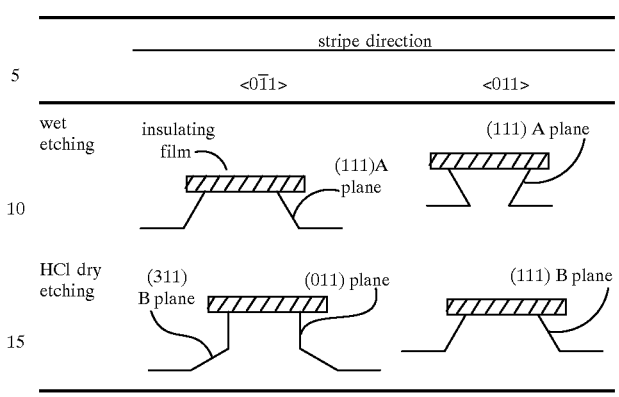

When the etching method according to the third embodiment of the present invention is employed as the HCl dry etching, opposite side surfaces of the ridge exposed by the etching are as smooth as a cleavage plane. In addition, no step is formed between the AlGaAs layer 2 and the GaAs cap layer 22 at the side wall of the ridge.

The method for fabricating a semiconductor laser according to the fourth embodiment of the present invention employs the etching method according to the third embodiment of the present invention. More specifically, as described above, the (011) surface 24 perpendicular to the (100) surface is partially exposed on the opposite side walls of the ridge structure when the etching is carried out with the stripe-shaped mask pattern extending along the [0$\bar{1}$1] direction. In this fourth embodiment, this (011) surface 24 is used as the oscillation facet of the laser.

Figure 7:
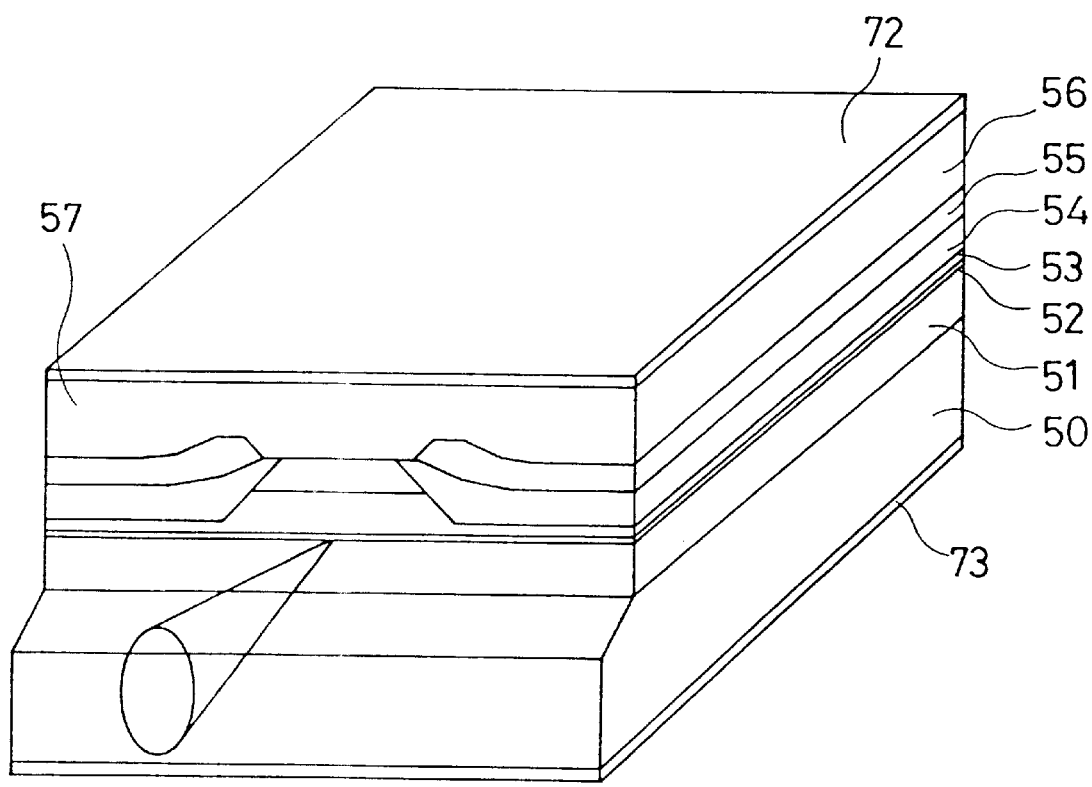
FIG. 7 is a perspective view illustrating a semiconductor laser fabricated by the method according to the fourth embodiment of the present invention.

FIG. 7 is a perspective view illustrating a semiconductor laser fabricated by the method according to the fourth embodiment of the present invention.

In the figure, reference numeral 50 designates an n type GaAs substrate. An n type $Al_xGa_{1-x}As$ first cladding layer 51 is disposed on the substrate 50. An active layer 52 is disposed on the first cladding layer 51. A p type $Al_xGa_{1-x}As$ second cladding layer 53 is disposed on the active layer 52. An n type GaAs current blocking layer 54 is disposed on the second cladding layer 53. A p type GaAs second cap layer 55 is disposed on the current blocking layer 54. A p type GaAs contact layer 56 is disposed on the cap layer 55. Reference numeral 57 designates a light emitting facet.

In production, first of all, a buried-ridge type laser structure is fabricated on the (100) GaAs substrate 50 by conventional MOCVD growth and wet etching. Since the process steps for fabricating the laser structure are well known, no detailed description is necessary.

The resonator length direction, i.e., the stripe direction of the ridge, is the [011] direction. Then, a part of the wafer to be a resonator of the laser is masked with an insulating film, and the wafer is etched by the etching method according to the third embodiment of the present invention. Since the (011) plane perpendicular to the (100) surface of the substrate is formed at the resonator facet 57, the laser oscillation facet is easily formed. The thus formed resonator facet is very smooth and is not adversely affected by the etching process. Therefore, this resonator facet can stand comparison with a resonator facet formed by cleaving.

According to the fourth embodiment of the present invention, after the buried-ridge type laser structure comprising GaAs and AlGaAs layers is fabricated on the (100) surface of the semiconductor substrate, the stripe-shaped etching mask extending along the [0$\bar{1}$1] direction is formed on the laser structure. Then, the wafer is subjected to the gas etching with HCl gas, AsH$_3$ gas, and H$_2$ gas which are supplied at the same time under the conditions that the AsH$_3$ partial pressure is in a range from 8×10$^{-3}$ Torr to 0.08 Torr and the flow ratio of the ASH$_3$ gas to the HCl gas is below 2.5, forming the oscillation facet of the laser. Therefore, the oscillation facet that can stand comparison with the cleavage facet is easily formed by the etching process.

While in the above-described fourth embodiment the buried-ridge type semiconductor laser is employed, the production method of the fourth embodiment may be applied to other laser structures.

While in the above-described fourth embodiment the semiconductor substrate with the (100) surface orientation is employed and the laser facet of the (011) plane is formed, the laser facet may be of a (0$\bar{1}\bar{1}$) plane. Alternatively, a substrate with a surface orientation that is crystallographically equivalent to the (100) surface may be employed. In this case, a laser facet is formed with a relation to the surface of the substrate which is equal to the relation between the (011) or (0$\bar{1}\bar{1}$) facet and the (100) surface.

A description is given of a method for fabricating a semiconductor laser in accordance with a fifth embodiment of the present invention.

Figure 5:
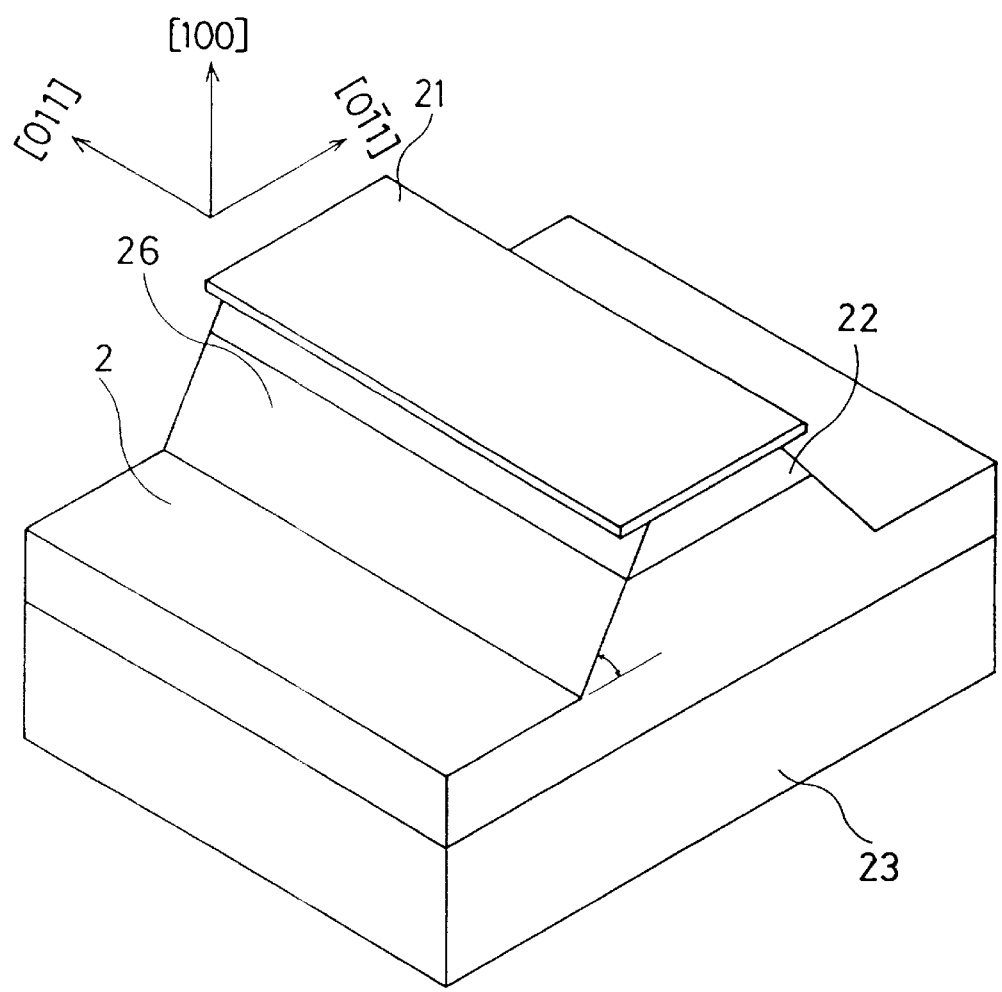
FIGS. 5 and 6 are perspective views for explaining a method for fabricating a semiconductor laser in accordance with a fifth embodiment of the present invention.
Figure 6:
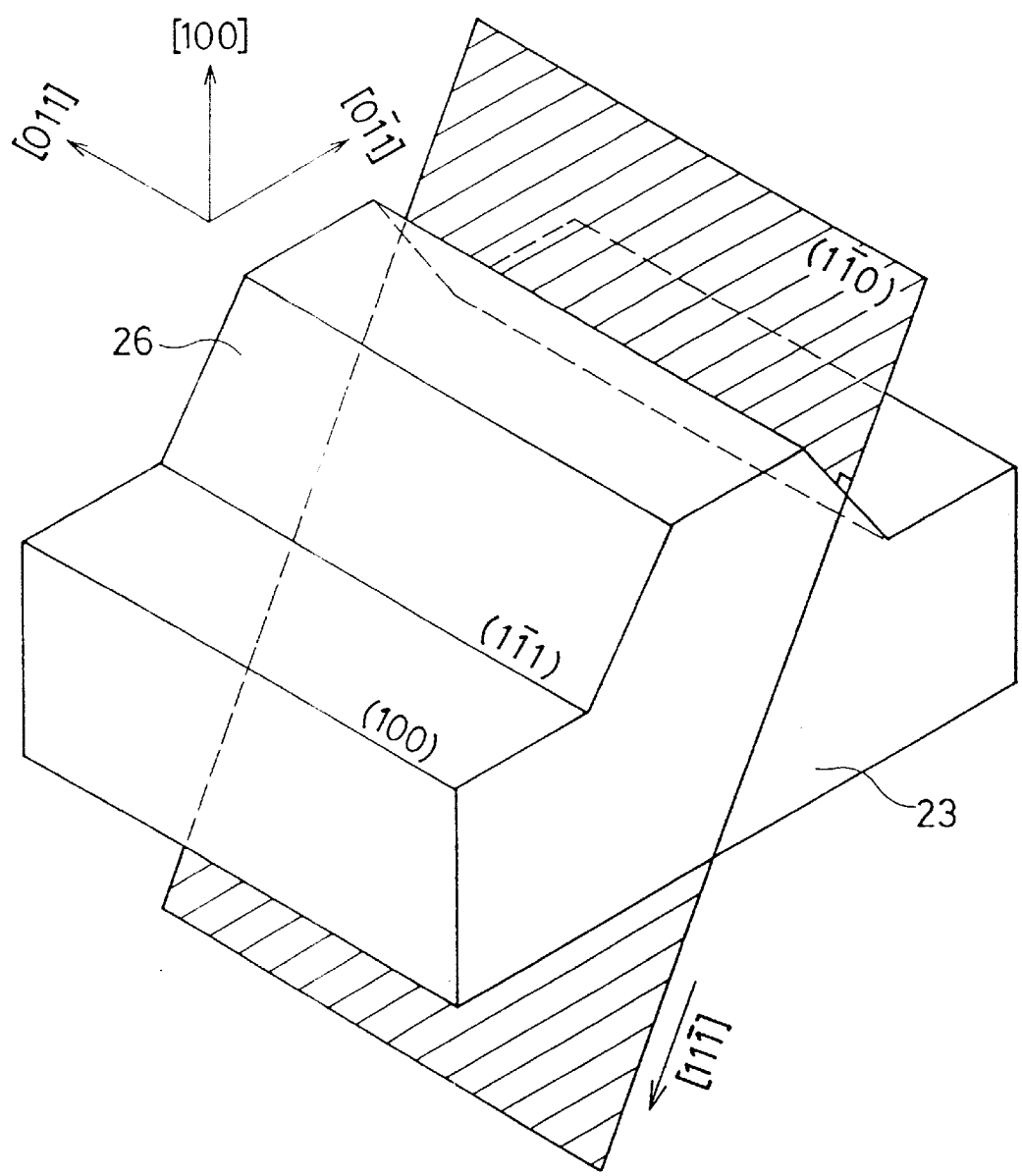

In this fifth embodiment, a semiconductor laser with an oscillation facet in a (111)B plane is fabricated. FIG. 5 is a perspective view illustrating a ridge structure formed by HCl gas etching using a stripe-shaped mask pattern extending along the [011] direction. As already described above, when the semiconductor layer grown on the (100) surface of the GaAs substrate 23 is etched using the stripe-shaped mask extending along the [011] direction, the (111)B plane 26 is exposed on the opposite side walls of the ridge structure. Since the (111)B plane forms an angle of about 54° with the (100) surface, it cannot be employed as an oscillation facet of the laser. However, if a plane perpendicular to the (111)B plane is selected as the surface of the semiconductor substrate, the (111)B plane can be employed as the oscillation facet. For example, the (1$\bar{1}$0) plane is perpendicular to the (111)B plane as shown in FIG. 6. Therefore, if a semiconductor substrate with a surface orientation crystallographically equivalent to the (1$\bar{1}$0) plane is employed, a side surface perpendicular to the surface of the substrate is easily formed using the etching method according to the third embodiment of the present invention.

Although in the above-described fifth embodiment a substrate with (1$\bar{1}$0) surface orientation is employed and the laser facet in a (111)B plane is formed, a substrate with a {110} surface that is crystallographically equivalent to the (1$\bar{1}$0) surface may be employed. In this case, if the above-described etching is carried out using a stripe-shaped mask extending along the <011> direction, a {111}B plane perpendicular to the {110} surface and crystallographically equivalent to the (111)B plane is attained, which (111)B plane can be used as an oscillation facet of the laser.

A description is given of a method for fabricating a semiconductor laser in accordance with a sixth embodiment of the present invention.

Figure 8:
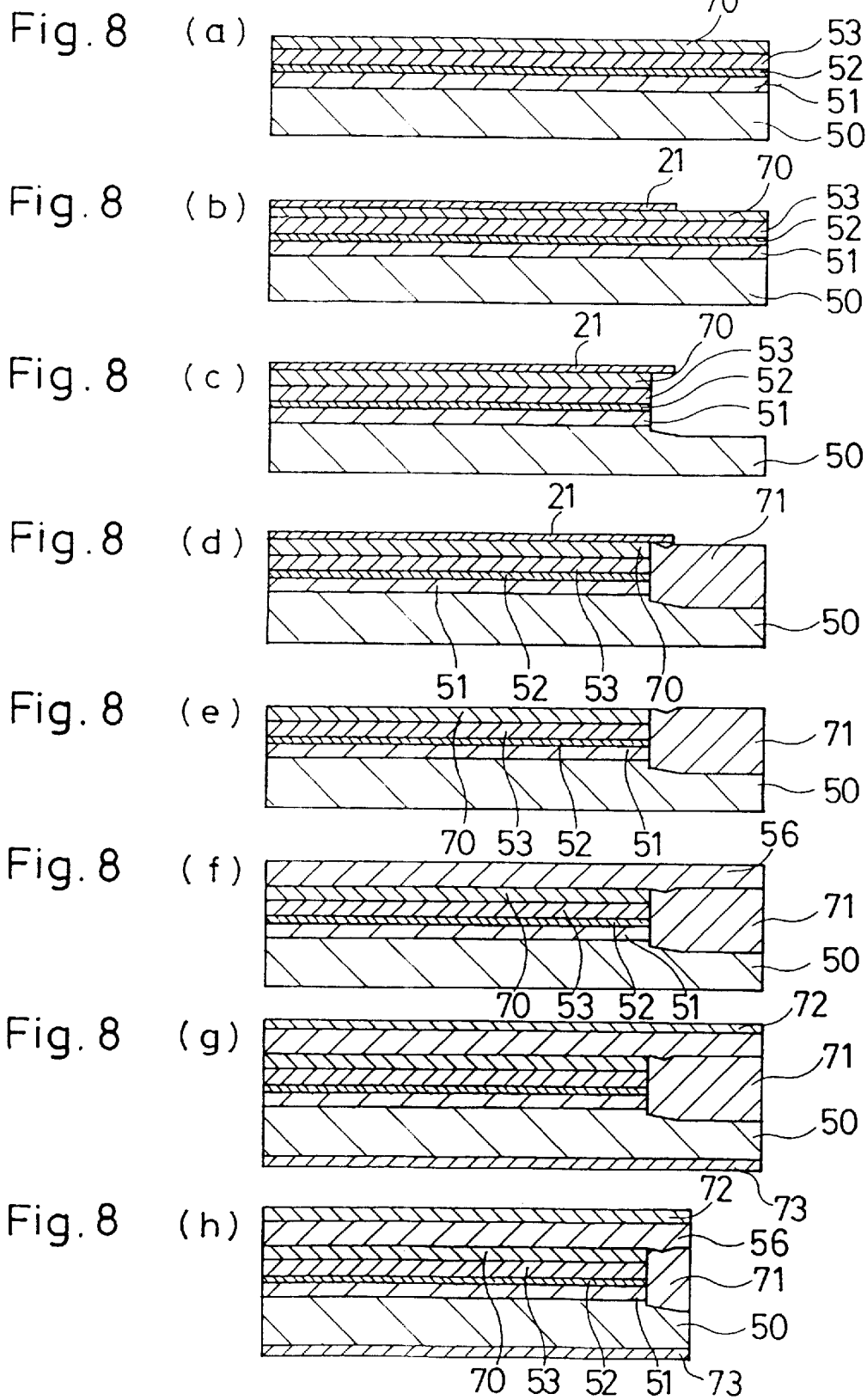
FIGS. 8(*a*)–8(*h*) and 9(*a*)–9(*g*) are sectional views illustrating process steps in a method for fabricating a refractive index guide type semiconductor laser with a window structure in accordance with a sixth embodiment of the present invention.

In this sixth embodiment, a refractive index guide type semiconductor laser with a window structure is fabricated using the etching method of the third embodiment of the present invention. FIGS. 8(*a*)–8(*h*) and 9(*a*)–9(*g*) are sectional views illustrating process steps for fabricating the semiconductor laser. The GaAs substrate 50 has a (100) surface orientation.

Figure 9:
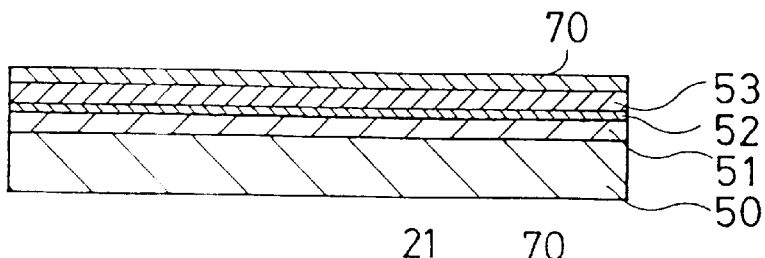
Figure 9:
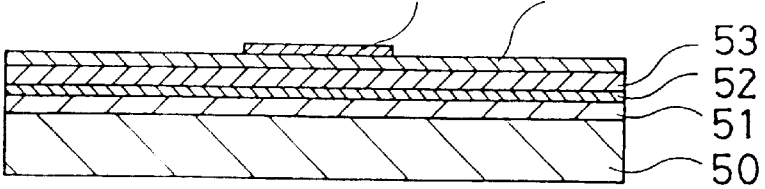
Figure 9:
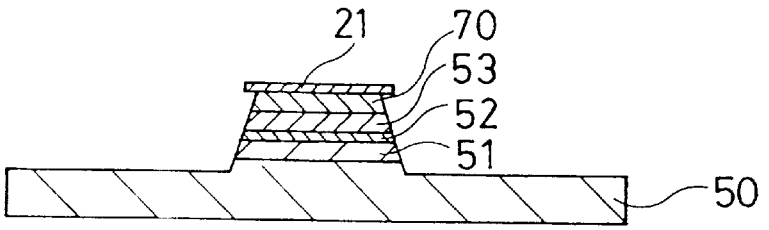
Figure 9:
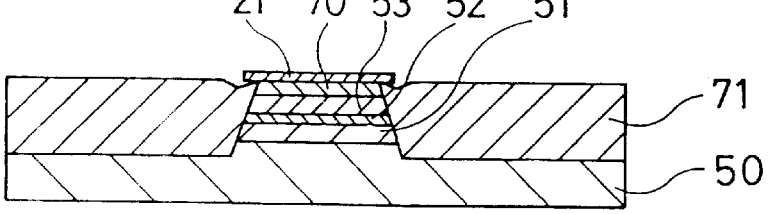
Figure 9:
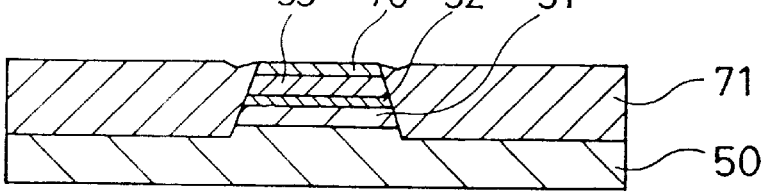
Figure 9:
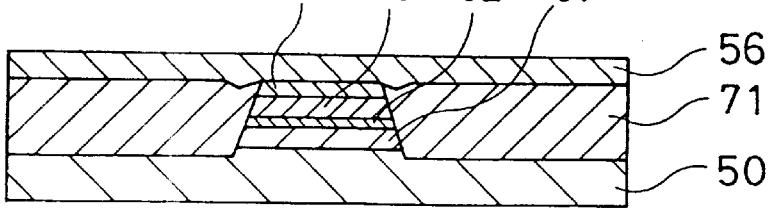
Figure 9:
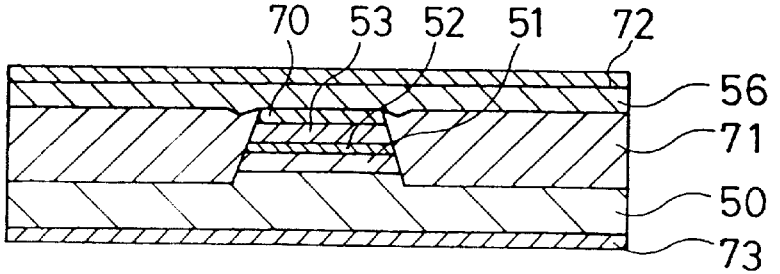

FIGS. 8(*a*)–8(*h*) are sectional views perpendicular to the <0$\bar{1}$1> direction and FIGS. 9(*a*)–9(*g*) are sectional views perpendicular to the <011> direction. In the figures, the same reference numerals as those in FIG. 7 designate the same or corresponding parts. Reference numeral 70 designates a p type GaAs first cap layer and numeral 71 designates a high resistivity Al$_y$Ga$_{1-y}$As window and current blocking layer. Reference numerals 72 and 73 designate a p side electrode and an n side electrode, respectively.

Figure 10:
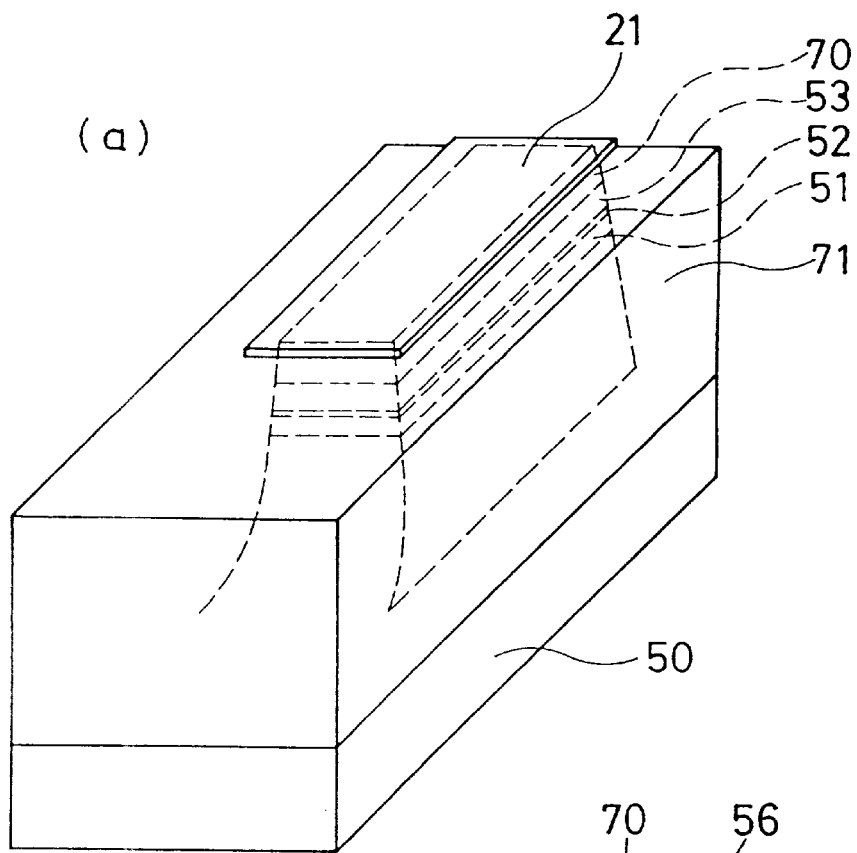
FIGS. 10(*a*) and 10(*b*) are perspective views illustrating process steps corresponding to the steps of FIGS. 8(*d*) and 9(*d*) and the steps of FIGS. 8(*f*) and 9(*f*), respectively.
Figure 10:
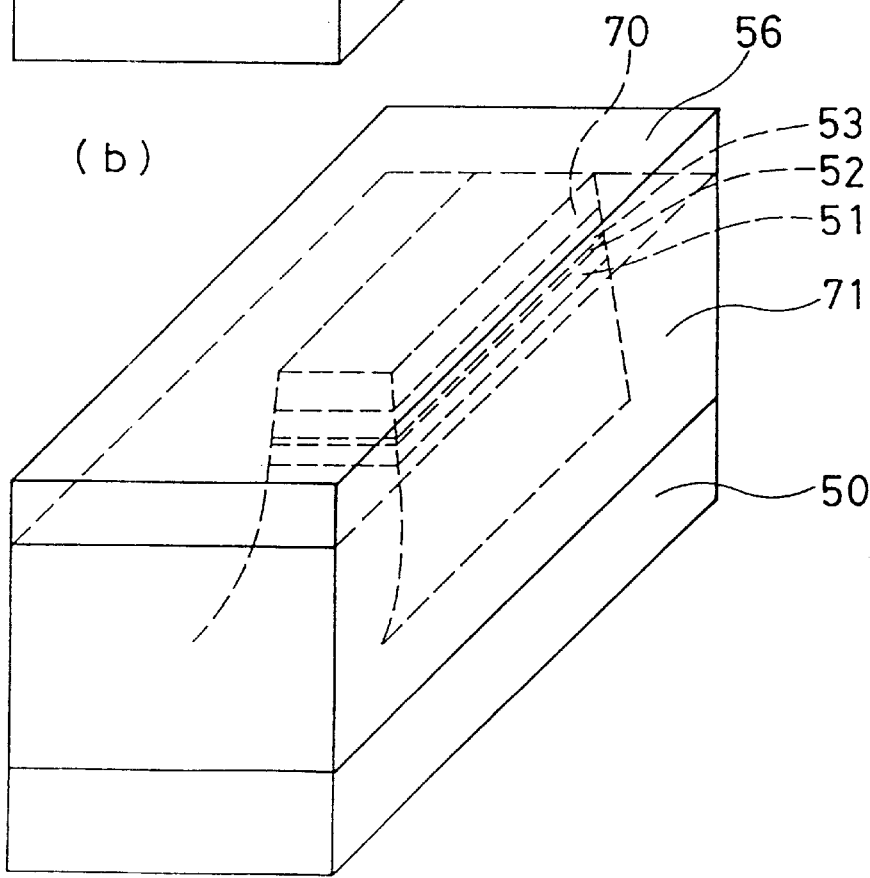

Initially, the first cladding layer 51, the active layer 52, the second cladding layer 53, and the p type GaAs first cap layer 70 are successively grown on the (100) GaAs substrate 50 by MOCVD (FIGS. 8(*a*) and 9(*a*)). Then, the stripe-shaped SiN film 21 is formed on a part of the wafer along the [011] direction, i.e., the resonator length direction (FIGS. 8(*b*) and 9(*b*)). Using the SiN film 21 as a mask, the wafer is etched under the etching conditions according to the third embodiment of the present invention (FIGS. 8(*c*) and 9(*c*)). As shown in FIG. 8(*c*), the etching is carried out forming a (011) plane to be a resonator facet perpendicular to the (100) surface of the substrate. It is to be desired that the surface cleaning according to the first or second embodiment of the present invention is performed before the etching process. After the etching process, the high resistivity Al$_y$Ga$_{1-y}$As window and current blocking layer 71 having an energy band gap larger than that of the active layer is grown in the same reaction chamber by conventional MOCVD (FIGS. 8(*d*) and 9(*d*)). FIG. 10(*a*) is a perspective view illustrating the wafer just after the MOCVD growth. If the etching and the regrowth are carried out in the same chamber using the method according to the first or second embodiment of the present invention, a favorable regrowth is achieved with no segregation of impurities at the interface between the window layer 71 and the resonator facet (FIG. 8(*d*)). After removing the Sin film 21 (FIGS. 8(*e*) and 9(*e*)), the p type GaAs contact layer 56 is grown on the wafer (FIGS. 8(*f*) and 9(*f*)). Then, the p side electrode 72 and the n side electrode 73 are formed on the contact layer 56 and on the rear surface of the substrate 50, respectively (FIGS. 8(*g*) and 9(*g*)). In this way, a fundamental structure of the refractive index guide type semiconductor laser with the window structure is fabricated in the wafer. Finally, the wafer is divided into chips by cleaving or the like (FIG. 8(*h*)).

FIG. 10(*b*) is a perspective view of the fabricated refractive index guide type semiconductor layer with the window structure. In the FIG., the p side and n side electrodes are omitted.

The prior art method for fabricating the semiconductor laser with the window structure provides very poor mass-producibility because the window layer is grown on a oscillation facet formed by cleaving. According to the sixth embodiment of the present invention, the semiconductor laser with the window structure is fabricated in a relatively simple process compared to the conventional process. In addition, since the flatness and the cleanliness of the regrowth interface are improved, a high-quality refractive index guide type semiconductor laser with a window structure is achieved.

While in the above-described sixth embodiment a semiconductor substrate with the (100) surface orientation is employed and a laser facet in a (011) plane is formed, the laser facet may be in a (0$\bar{1}\bar{1}$) plane. Alternatively, a substrate with a surface orientation that is crystallographically equivalent to the (100) surface may be employed. In this case, a laser facet is formed with a relation to the surface of the substrate which is equal to the relation between the (011) or (0$\bar{1}\bar{1}$) facet and the (100) surface.

A description is given of a method for fabricating a semiconductor laser in accordance with a seventh embodiment of the present invention. In this seventh embodiment, the etching method according to the third embodiment of the present invention is applied to the formation of a ridge structure in a method for fabricating a ridge waveguide type semiconductor laser. FIGS. 11(a)–11(d) are sectional views illustrating process steps in a method for fabricating the ridge waveguide type semiconductor laser. In the FIGS., the same reference numerals as those in FIG. 7 designate the same or corresponding parts.

Figure 11:
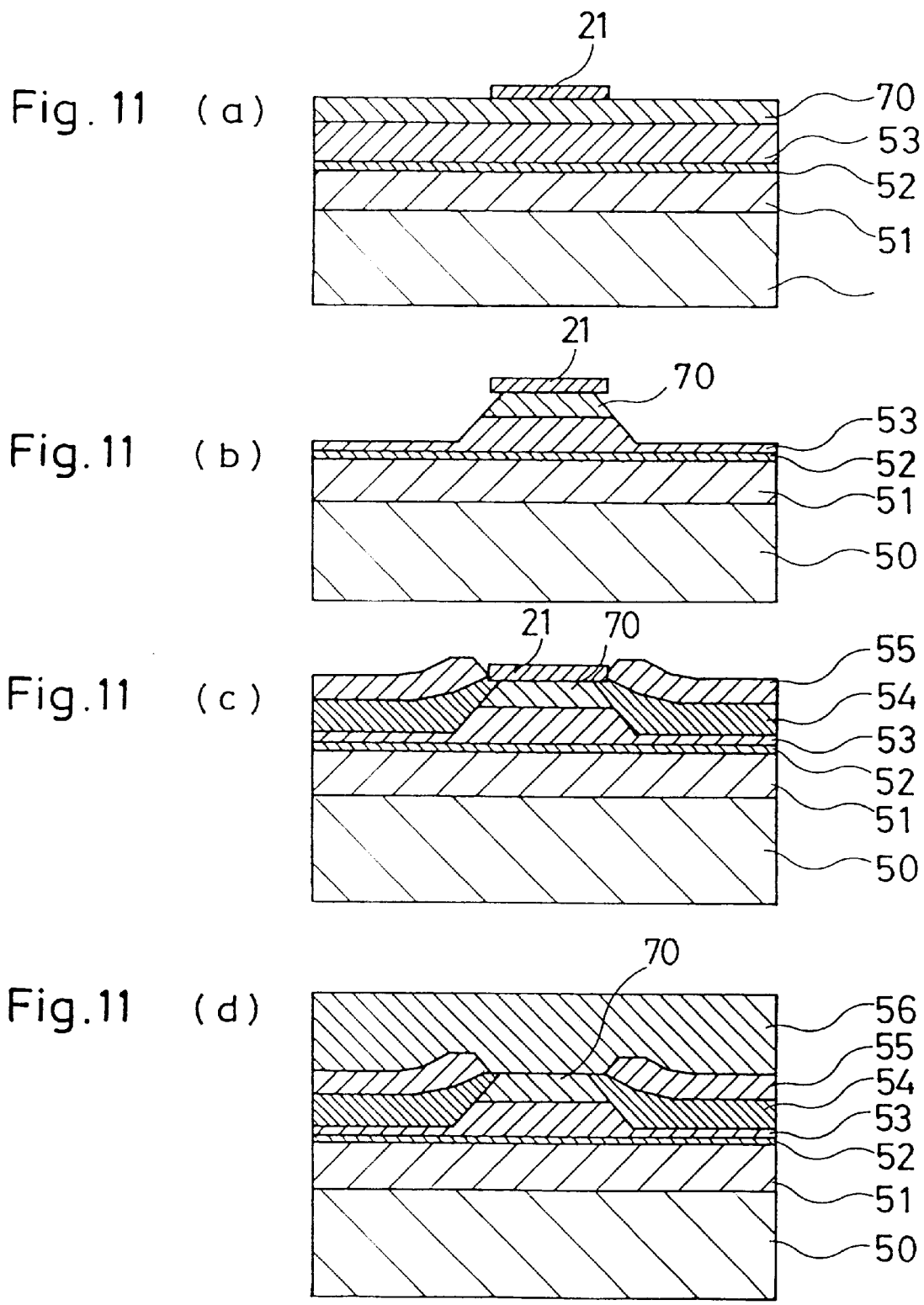
FIGS. 11(a)–11(d) are sectional views illustrating process steps in a method for fabricating a ridge type semiconductor laser in accordance with a seventh embodiment of the present invention.

Initially, the n type $Al_xGa_{1-x}As$ first cladding layer 51, the active layer 52, the p type $Al_xGa_{1-x}As$ second cladding layer 53, and the p type GaAs first cap layer 70 are successively grown on the n type GaAs substrate 50 by MOCVD. Then, the stripe-shaped SiN film 21 is formed on a part of the cap layer 70 (FIG. 11(a)). Using the SiN film 21 as a mask, the wafer is etched down by the etching method described in the third embodiment, forming a ridge structure as shown in FIG. 11(b). If the stripe of the SiN pattern 21 is in the [011] direction, (111)B planes are exposed on opposite side walls of the ridge. It is desired that the surface cleaning according to the first or second embodiment of the present invention be performed before the etching process. Then, as illustrated in FIG. 11(c), the n type GaAs current blocking layer 54 and the p type GaAs second cap layer 55 are grown on the second cladding layer 53 contacting the side walls of the ridge in the same reaction chamber by MOCVD. After removing the SiN film 21, the p type GaAs contact layer 56 is grown by MOCVD as shown in FIG. 11(d).

Figure 12:
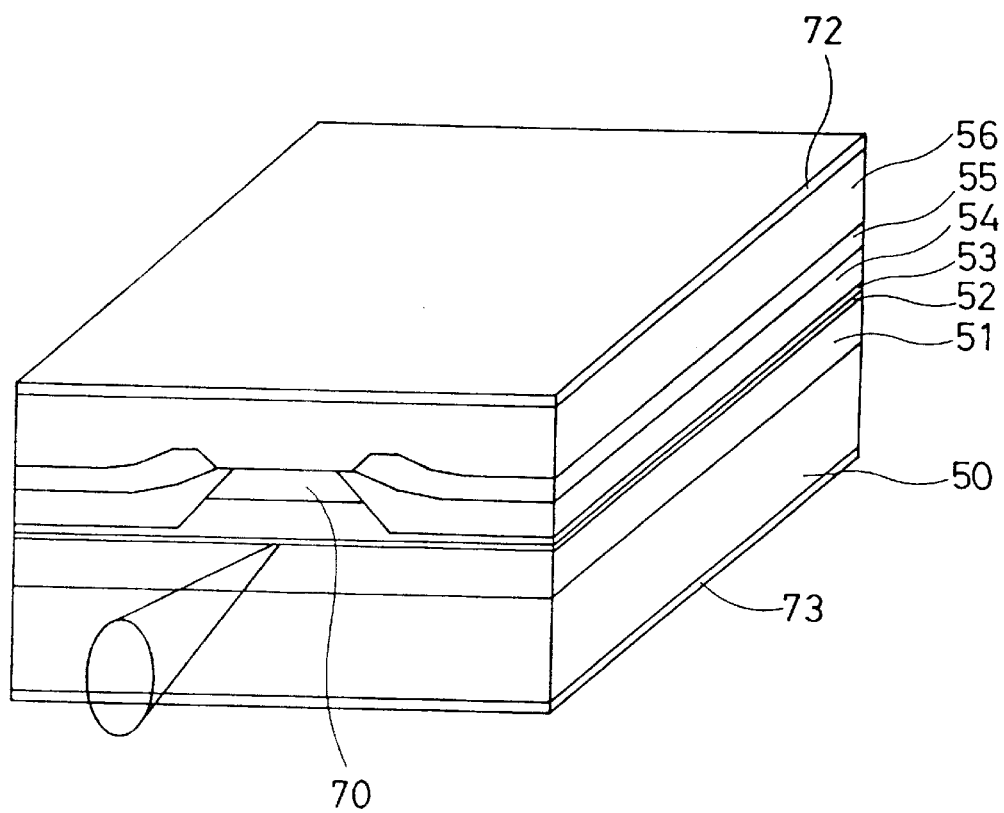
FIG. 12 is a perspective view illustrating a ridge type semiconductor laser fabricated by the method according to the seventh embodiment of the present invention.

To complete the ridge waveguide type semiconductor laser shown in FIG. 12, p side and n side electrodes 72 and 73 are deposited and the wafer is divided into chips by cleaving or the like.

In this seventh embodiment of the present invention, since the formation of the ridge structure using the gas phase etching method according to the third embodiment of the present invention is combined with the MOCVD selective growth, the complicated process steps, such as wet etching for forming the ridge structure, can be dispensed with, whereby the production process is significantly simplified. If the surface cleaning process according to the first or second embodiment of the present invention is performed before thegas phase etching, an improved regrowth interface is attained, increasing the life time of the high power semiconductor laser.

Although the ridge structure of the semiconductor laser formed using the HCl gas etching is also disclosed in Japanese Published Patent Application No. 60-163487, this prior art does not describe the etching conditions. The HCl gas etching for forming the ridge structure is put to practical use for the first time when the etching conditions described in the third embodiment of the present invention are employed.

Figure 13:
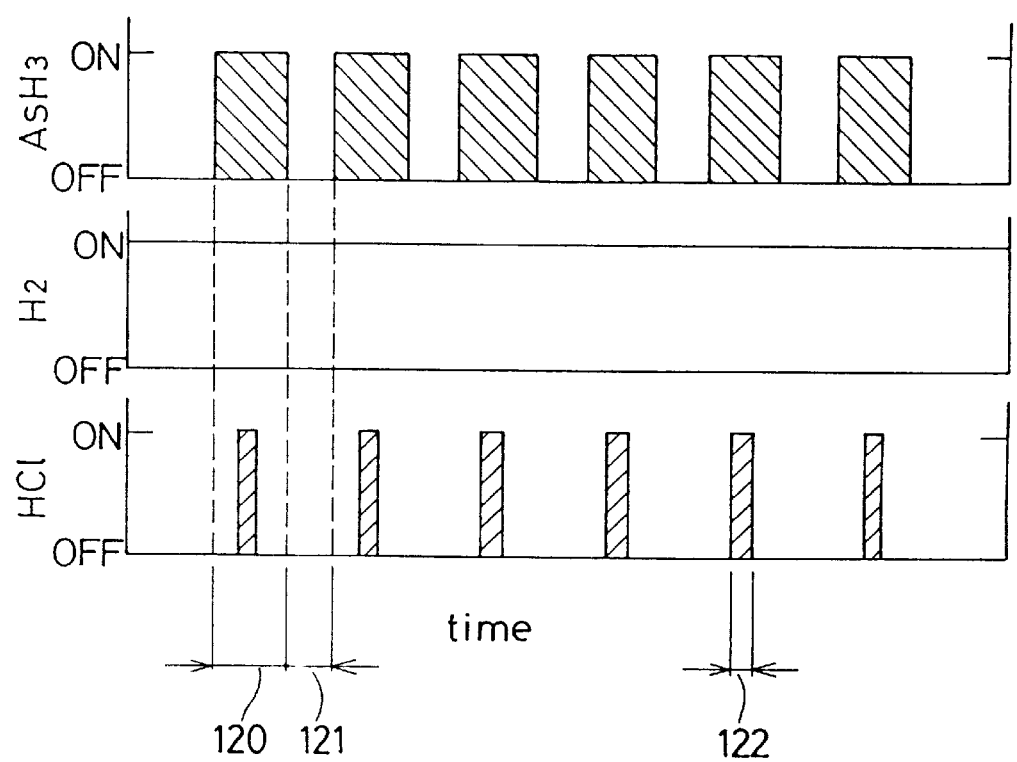
FIG. 13 is a diagram illustrating a gas introduction sequence for explaining a method for fabricating a semiconductor device in accordance with an eighth embodiment of the present invention.

A description is given of a method for producing a semiconductor device in accordance with an eighth embodiment of the present invention. FIG. 13 illustrates a gas introduction sequence employed in a compound semiconductor etching method according to the eighth embodiment of the present invention. In the figure, reference numeral 120 designates an $AsH_3$ gas supply region, numeral 121 designates an $H_2$ purge region, and numeral 122 designates an HCl gas supply region.

This etching method includes a first etching step in which $AsH_3$ gas and HCl gas are supplied so that the supply time of the HCl gas is shorter than that of the $AsH_3$ gas and a second etching step in which the supply of the $AsH_3$ gas and the HCl gas is halted and the inside of the reactor is purged with hydrogen. The first etching step and the second etching step are alternatingly repeated, realizing an one-atomic layer level etching.

A description is given of the principle of the compound semiconductor etching method. As already described in the third embodiment of the present invention, in order to attain a flat etching surface when GaAs is etched by HCl gas, the flow rate of $AsH_3$ gas must be precisely controlled. The proper amount of $AsH_3$ gas reduces the escape of $AsCl_3$ from the GaAs surface, and a flat etching surface is achieved when the escape of $AsCl_3$ and the escape of $GaCl_3$ are well-balanced. According to our experiment, the etching rate of GaAs decreases with an increase in the $AsH_3$ flow rate. This is because the excessively supplied $AsH_3$ suppresses the escape of $AsCl_3$. Therefore, if the HCl gas is supplied in a pulse while excessively supplying $AsH_3$, only $GaCl_3$ escapes from the GaAs surface, realizing the one-atomic layer level etching. At this time, $AsCl_3$ is prevented from escaping from the GaAs surface due to the excessive $AsH_3$ and remains on the surface. When the supply of $AsH_3$ gas is stopped, $AsCl_3$ escapes from the GaAs surface.

Figure 14:
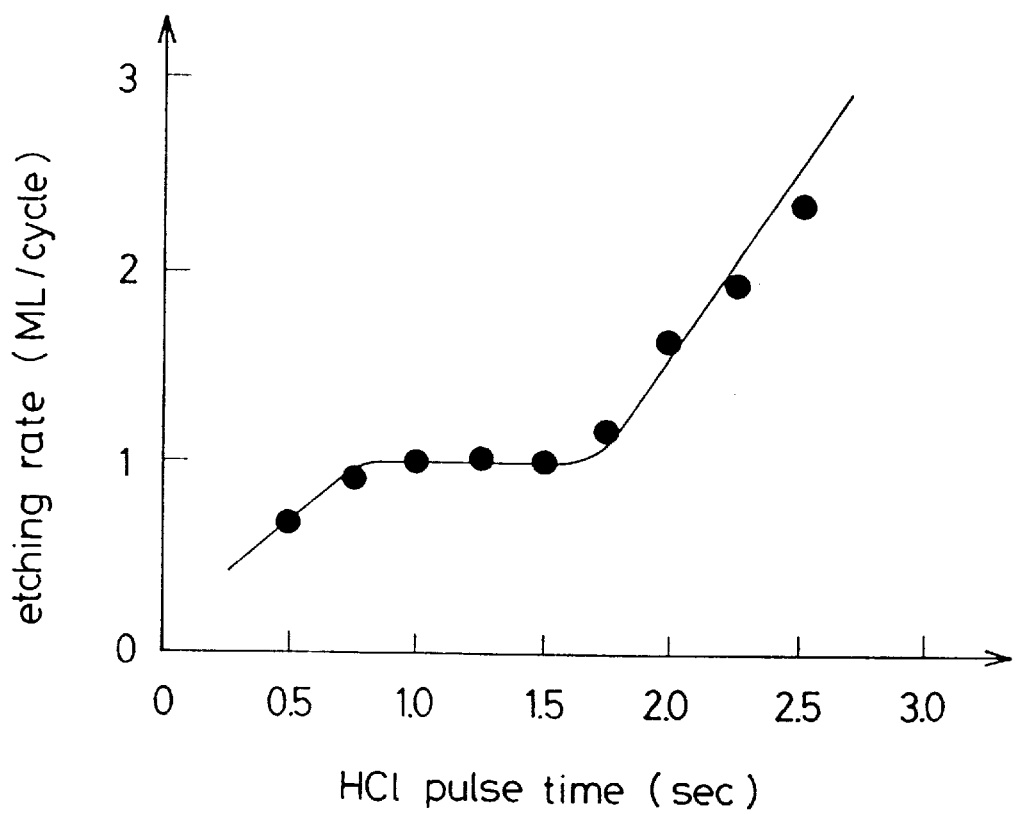
FIG. 14 is a graph illustrating an etching rate for explaining a method for fabricating a semiconductor device in accordance with the eighth embodiment of the present invention.

FIG. 14 is a graph illustrating a relation between the etching rate and the HCl gas supply pulse time in the above-described etching method. As shown in the graph, an etching rate of 1 ML/cycle is attained at a specific HCl pulse time. In this embodiment, the HCl pulse time is 0.75~1.5 sec. The HCl pulse time is not restricted thereto because it varies according to the HCl supply rate.

According to the eighth embodiment of the present invention, the etching controlled at the one-atomic layer level is easily performed. In addition, one cycle of the etching process takes only 4~8 seconds, significantly reducing the etching time.

Figure 15:
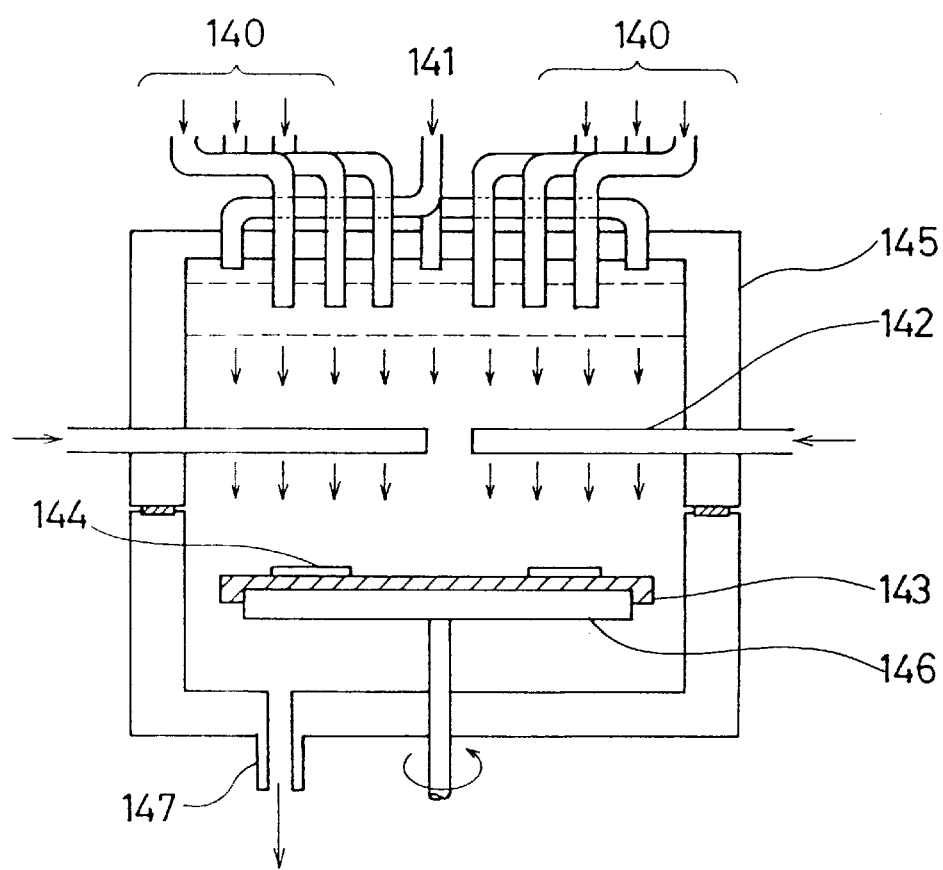
FIG. 15 is a schematic diagram illustrating an apparatus for fabricating a semiconductor device in accordance with a ninth embodiment of the present invention.
Figure 16:
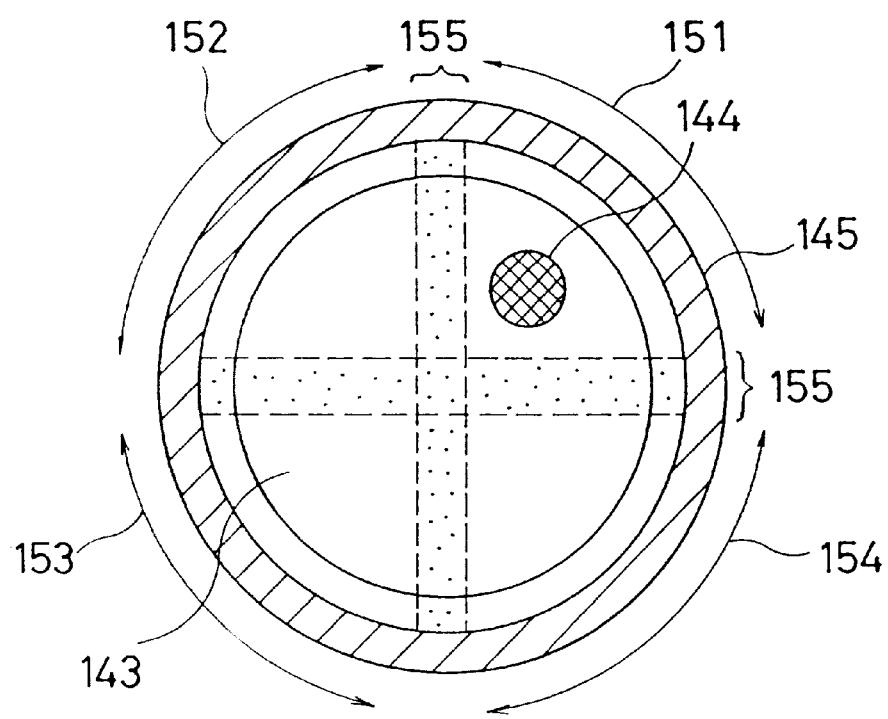
FIG. 16 is a schematic diagram illustrating a plan view of the apparatus of FIG. 15.

A description is given of an apparatus and a method for producing a semiconductor device in accordance with a ninth embodiment of the present invention. FIG. 15 is a schematic diagram illustrating an apparatus for etching a compound semiconductor according to the ninth embodiment of the present invention and FIG. 16 is a plan view thereof. In the figures, reference numeral 140 designates source gas injectors, numeral 141 designates carrier gas injectors, numeral 142 designates $H_2$ gas injectors, numeral 143 designates a wafer tray, numeral 144 designates a wafer, numeral 145 designates a reaction chamber, numeral 146 designates a susceptor, and numeral 147 designates an exhaust port.

A plurality of $H_2$ gas injectors 142 are disposed above the susceptor 146. The $H_2$ gas emitted from the injectors 142 forms hydrogen curtains 155, whereby the susceptor 146 is divided into four regions 151, 152, 153, and 154. A plurality of source gas injectors 140 are disposed so that source gas or etching gas is applied to the respective regions individually. Since the susceptor 146 has a rotating mechanism, the wafer 144 on the susceptor is successively moved through the regions 151 to 154.

The etching method will be described. In FIG. 16, $AsH_3$ gas, HCl gas, and $H_2$ gas are supplied to the regions 151 and 153 at the same time while only $H_2$ gas is supplied to the regions 152 and 154. As described in the eighth embodiment of the present invention, under the excessive supply of $AsH_3$ gas, only $GaCl_3$ escapes from the GaAs surface and the escape of $AsCl_3$ is suppressed. That is, when the wafer 144 is present in the region 151 or 153, only Ga atoms escape from the surface. When the wafer 144 is present in the region 152 or 154, only As atoms escape from the surface. In this way, the one-atomic layer level etching is performed. Since the wafer 144 is moved through the regions 151 to 154 by the rotation of the susceptor 146, the time required for one cycle of the etching process is significantly reduced compared to the conventional etching method.

Figure 17:
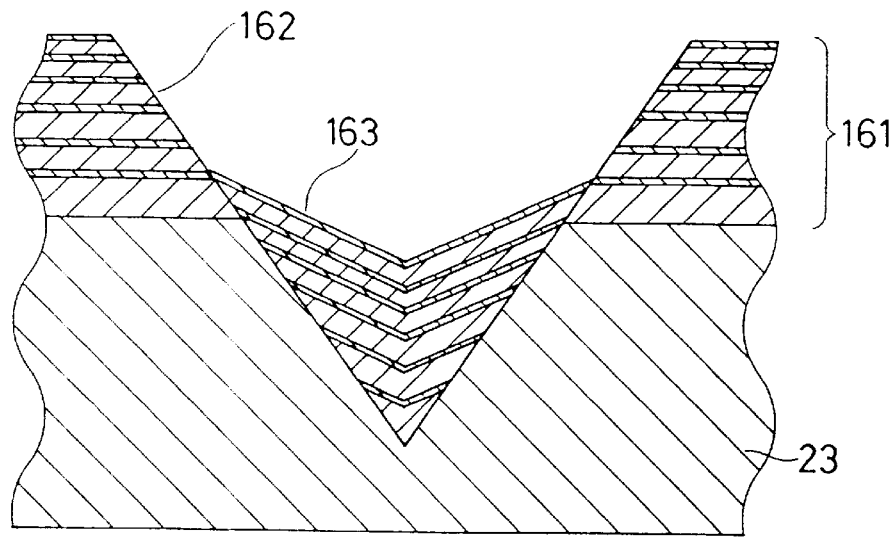
FIGS. 17 and 18 are sectional views for explaining a method for fabricating a quantum wire structure in accordance with a tenth embodiment of the present invention.
Figure 18:
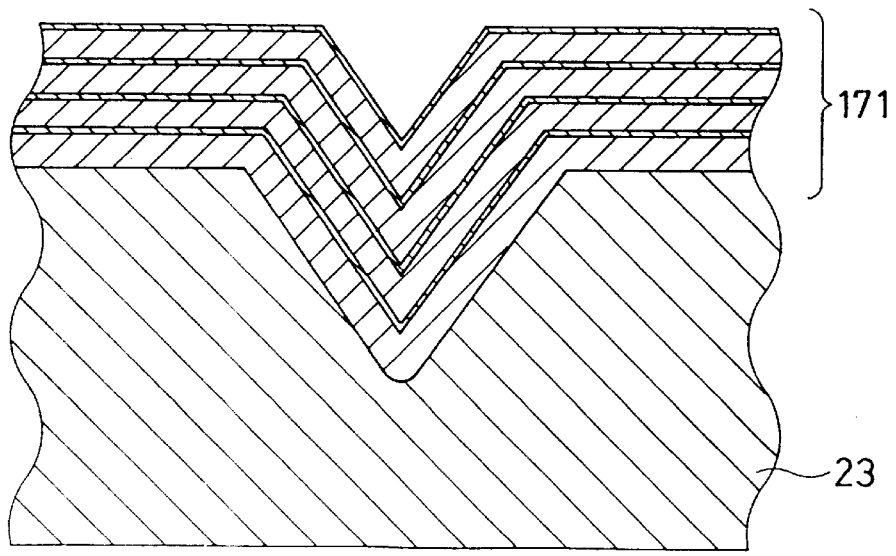

A description is given of a method for fabricating a quantum wire structure in accordance with a tenth embodiment of the present invention. FIGS. 17 and 18 are sectional views illustrating AlGaAs layers and GaAs layers alternatingly grown on a GaAs substrate 23 with a stripe-shaped V groove. The GaAs substrate 23 has a(100) surface orientation. In FIG. 17, the stripe-shaped V groove is formed along the [011] direction by the etching method according to the third embodiment of the present invention. In FIG. 18, the stripe-shaped V groove is formed along the [0$\bar{1}$1] direction by wet etching using a sulfuric acid solution as an etchant.

As shown in FIG. 17, when the stripe-shaped V groove is formed along the [011] direction, the (111)B planes are exposed on the opposite side surfaces of the groove. Since typical MOCVD growth does not proceed perpendicularly to the (111)B planes, the growth proceeds forming side surfaces 162 on which no crystal is grown. The crystal growth in the V groove proceeds discontinuously with the crystal growth on the flat surface of the substrate 23. That is, the growth proceeds with a front surface 163 that forms a smaller angle with respect to the (100) surface of the substrate than the angle formed between the (111)B plane and the (100) surface. The orientation of the growth front surface 163 is identified as a (311)B plane from the its orientation.

On the other hand, when the stripe-shaped V groove is formed along the [0$\bar{1}$1] direction, the (111)A planes are exposed on the opposite side surfaces of the V groove. Since the growth rate on the (111)A plane is approximately equal to the growth rate on the (100) surface, the growth proceeds uniformly on the surface of the groove and on the flat surface of the substrate 23 as shown in FIG. 18. This crystal growth does not provide a desired quantum wire structure. Further, it is difficult to form the V groove with the (111)B side surfaces shown in FIG. 17 by conventional wet etching.

Figure 19:
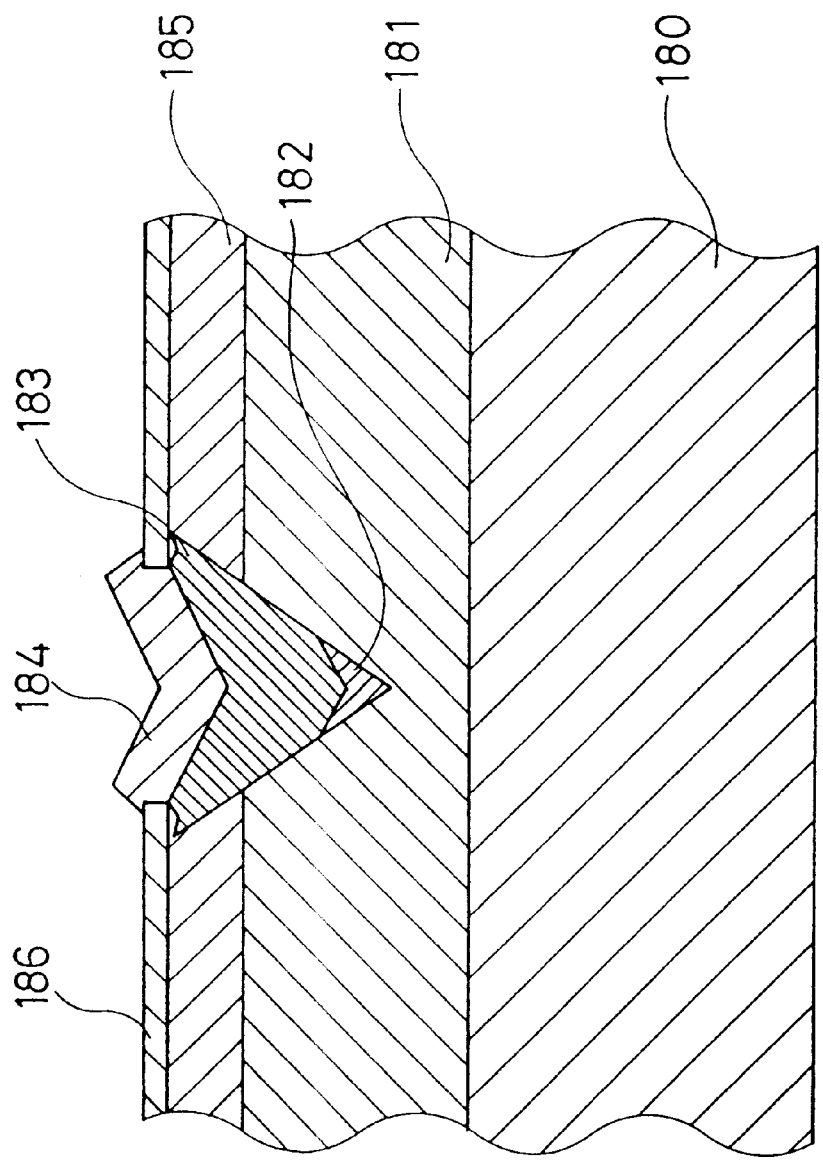
FIG. 19 is a sectional view illustrating a quantum wire structure in accordance with the tenth embodiment of the present invention.

FIGS. 20(a)–20(d) are sectional views illustrating process steps in a method for fabricating a quantum wire structure according to the tenth embodiment of the present invention, and FIG. 19 is a sectional view illustrating the quantum wire structure. In the figures, reference numerals 181 and 183 designate AlGaAs layers, numeral 182 designates a GaAs quantum wire, numeral 184 designates a GaAs second cap layer, numeral 185 designates a GaAs first cap layer, and numeral 186 designates an SiN film.

Figure 20:
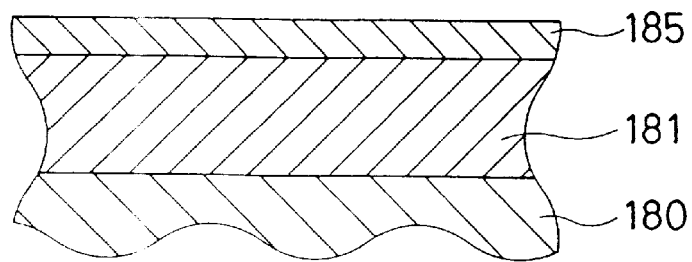
FIGS. 20(a)–20(d) are sectional views illustrating process steps in a method for fabricating the quantum wire structure of FIG. 19.
Figure 20:
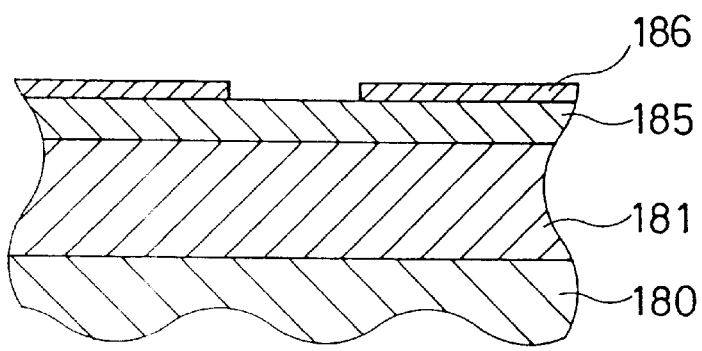
Figure 20:
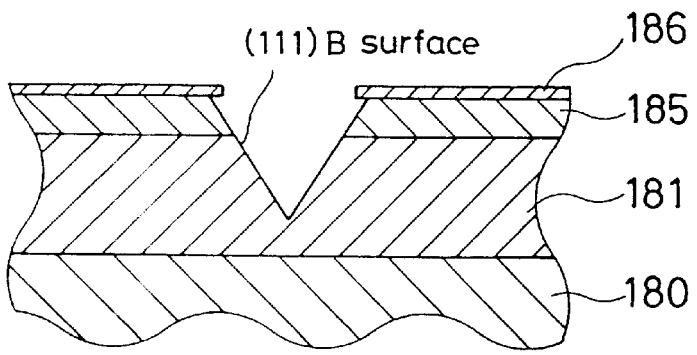
Figure 20:
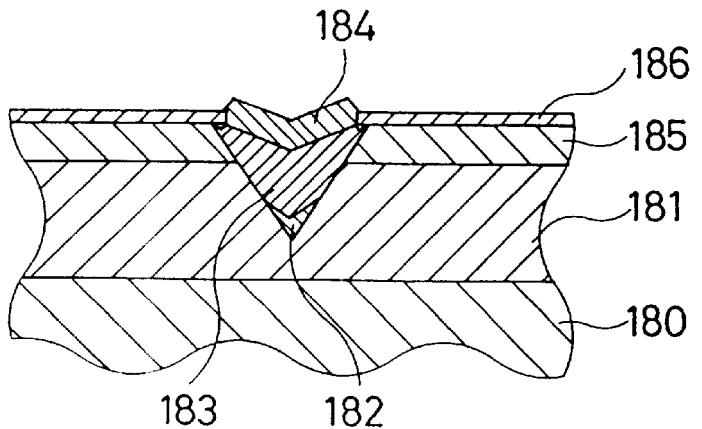

Initially, the AlGaAs layer 181 and the GaAs first cap layer 185 are successively grown on the GaAs substrate 180 by MOCVD (FIG. 20(a)). Then, an SiN film 186 is deposited on the first cap layer 185 and patterned to form a stripe-shaped aperture extending along the [011] direction (FIG. 20(b)). Using the SiN pattern 186 as a mask, a stripe-shaped V groove with the side surfaces of the (111)B planes is formed by the etching method according to the third embodiment of the present invention (FIG. 20(c)). Subsequently, in the same reaction chamber, the GaAs quantum wire 182, the AlGaAs layer 183, and the GaAs second cap layer 184 are selectively grown in the V groove (FIG. 20(d)). The growth of the GaAs quantum wire 182 should be controlled so that the width is in a range from 20 nm to 30 nm, whereby a desired quantum effect is attained. Since the crystal growth proceeds as shown in FIG. 17 in the V groove with the side surfaces of the (111)B planes, the GaAs quantum wire structure shown in FIG. 19 is easily formed.

Although in the above-described tenth embodiment a semiconductor substrate with a (100) surface orientation is employed and a stripe-shaped V groove with the side surfaces of the (111)B planes are formed, a semiconductor substrate with a {100} surface orientation that is crystallographically equivalent to the (100) surface may be employed. In this case, if the same etching process as described above is performed using a mask pattern with a stripe-shaped opening extending along the <011> direction, a stripe-shaped V groove having side surfaces of {111}B planes that are crystallographically equivalent to the (111)B planes is attained. When this groove is filled with the crystal layers, the same effects as described above are attained.

Figure 21:
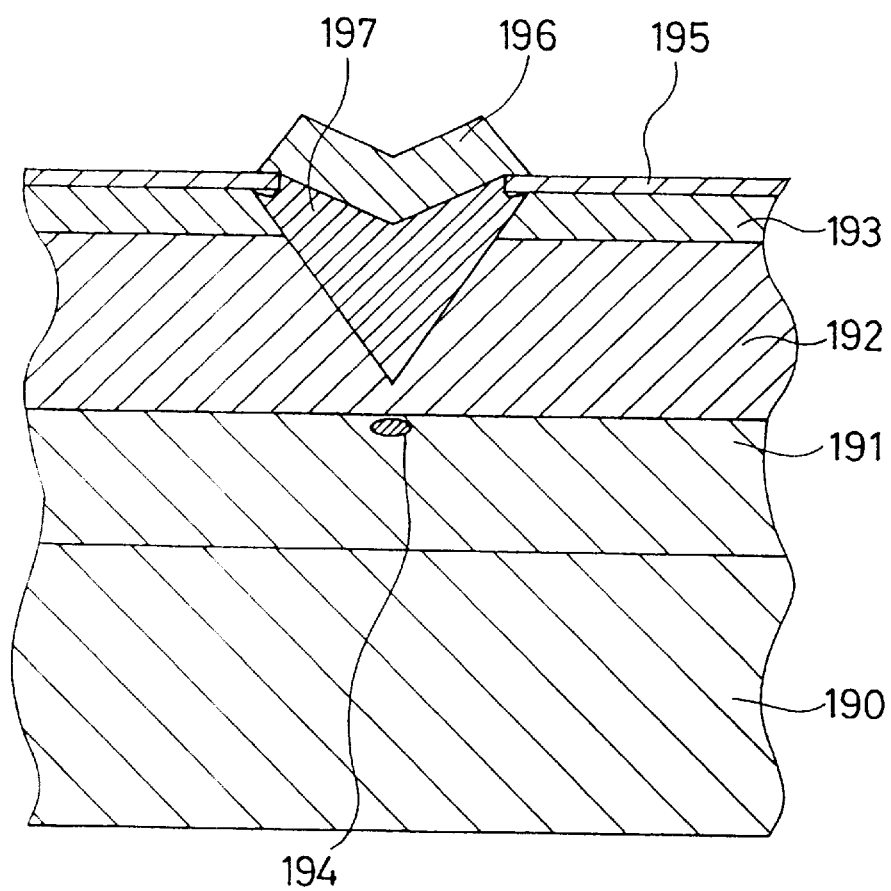
FIG. 21 is a sectional view illustrating a quantum wire structure.
Figure 22:
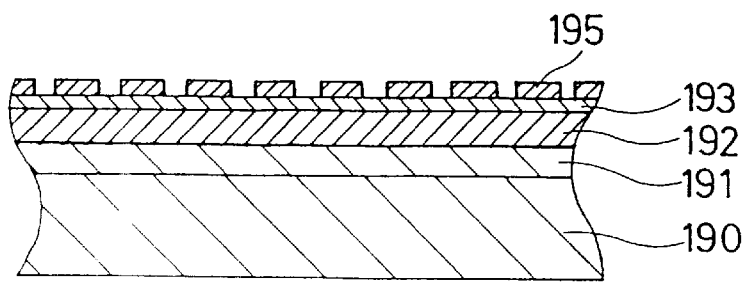
FIGS. 22(a)–22(e) are sectional views illustrating process steps in a method for fabricating the quantum wire structure of FIG. 21 in accordance with an eleventh embodiment of the present invention.
Figure 22:
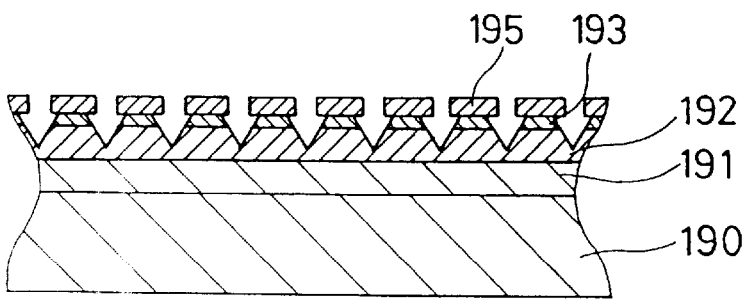
Figure 22:
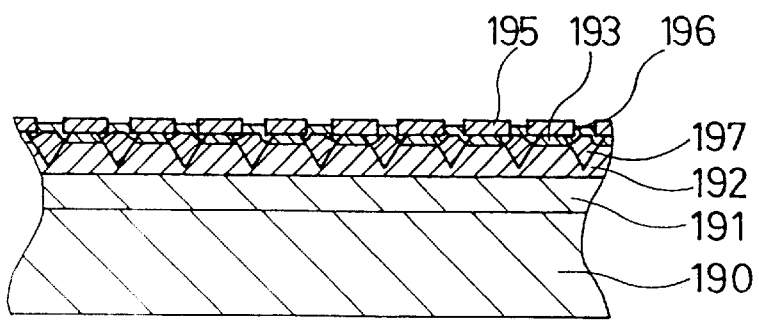
Figure 22:
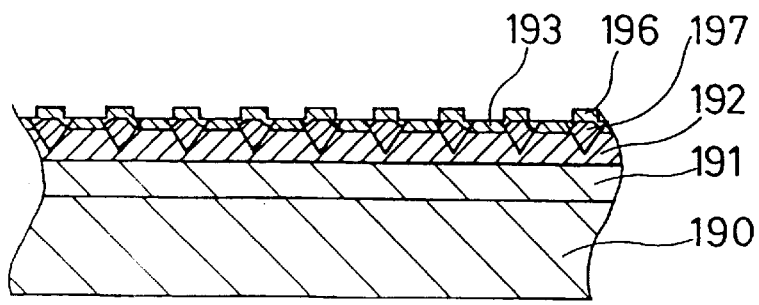
Figure 22:
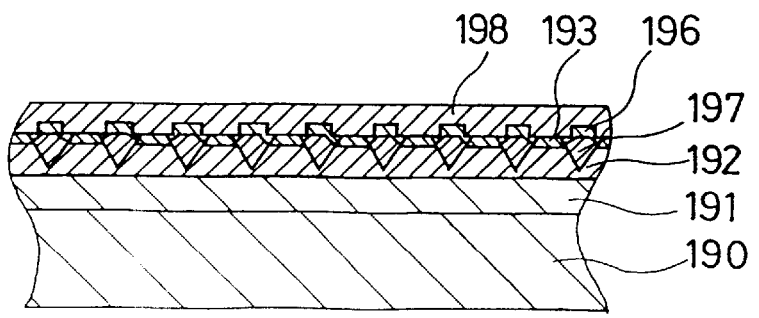

FIG. 21 is a cross-sectional view illustrating a quantum wire structure fabricated by a method according to an eleventh embodiment of the present invention. One of the inventors of the present invention discloses a quantum wire structure and a production method thereof in Japanese Published Patent Application No. 2-335827. This eleventh embodiment of the present invention offers an improved method for fabricating a quantum wire that is structurally the same as that disclosed in the prior application No. 2-335827, whereby a high-quality quantum wire structure is attained. In FIG. 21, reference numeral 190 designates a semi-insulating GaAs substrate. A high-resistivity intrinsic (hereinafter referred to as i type) GaAs layer 191 is disposed on the GaAs substrate 190. An n type AlGaAs spacer layer 192 is disposed on the GaAs layer 191. An n$^+$ type GaAs cap layer 193 is disposed on the AlGaAs spacer layer 192. A quantum wire 194 is buried in the i type GaAs layer 191. An SiN film 195 is disposed on the GaAs cap layer 193. An n type AlGaAs electron supply layer 197 is buried in the GaAs cap layer 193 and the AlGaAs spacer layer 192. An n$^+$ type GaAs cap layer 196 is disposed on the AlGaAs electron supply layer 197.

FIGS. 22(a)–22(e) are sectional views illustrating a method for fabricating a plurality of the quantum wire structures shown in FIG. 21 on the same substrate. In the FIGS., the same reference numerals as those in FIG. 21 designate the same or corresponding parts.

Initially, the i type GaAs layer 191, the i type AlGaAs spacer layer 192, and the n$^+$ type GaAs cap layer 193 are successively grown on the semi-insulating GaAs substrate 190 with a(100) surface orientation by MOCVD. Then, the SiN film 195 is deposited on the n$^+$ type GaAs cap layer 193 and patterned to form a plurality of stripe-shaped openings parallel to each other (FIG. 22(a)). Each stripe-shaped opening extends along the [011] direction. Using the etching method according to the third embodiment of the present invention, the wafer is selectively etched from portions exposed in the openings of the SiN film 195, forming a plurality of stripe-shaped V grooves (FIG. 22(b)). Subsequently, in the same reaction chamber, the n type AlGaAs electron supply layer 197 and the n$^+$ type GaAs cap layer 196 are selectively grown in the V grooves (FIG. 22(c)). It is desired that the surface cleaning according to the first or second embodiment of the present invention be performed before the etching process. After removing the SiN film 195 (FIG. 22(d)), the n$^+$ type GaAs cap layer 196 is deposited on the entire surface of the wafer (FIG. 22(e)).

In this production method, the quantum wire 194 is formed in a very narrow region of the i type GaAs layer 191 opposite the bottom of the V groove. The reason why the quantum wire 194 is formed is described in detail in the prior application No. 2-335827.

According to the eleventh embodiment of the present invention, the quantum wire structure is formed with high precision. In addition, if the surface cleaning according to the first or second embodiment of the present invention is performed before the etching process for forming the V grooves, a high-quality quantum wire structure with no impurity segregation on the regrowth interface is achieved.

While in the above-described eleventh embodiment the cap layer 193 comprises $n^+$ type GaAs, it may comprise i type GaAs.

Figure 23:
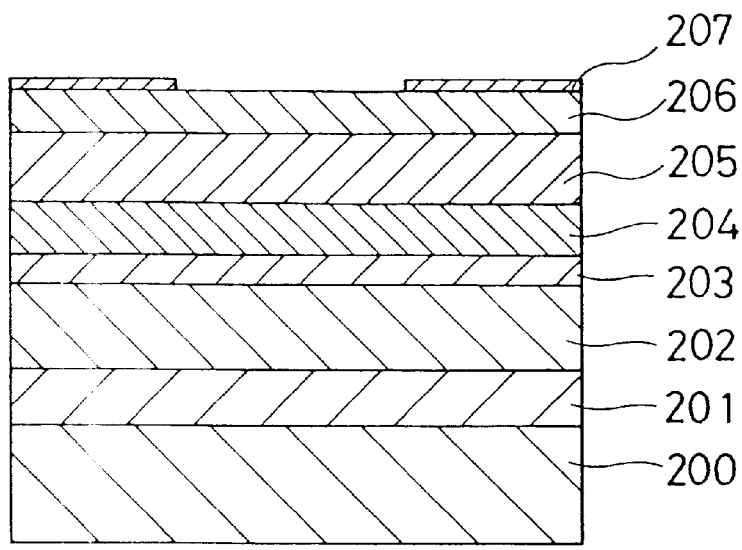
FIGS. 23(a)–23(c) are sectional views illustrating process steps in a method for fabricating a semiconductor laser in accordance with a twelfth embodiment of the present invention.
Figure 23:
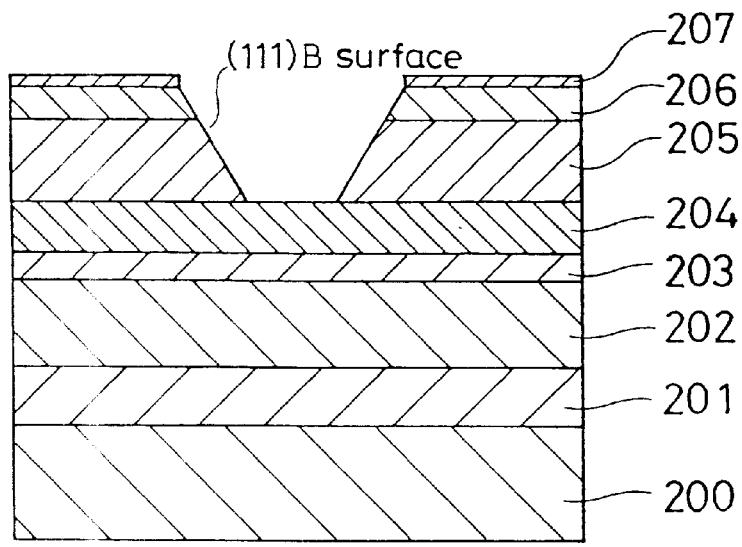
Figure 23:
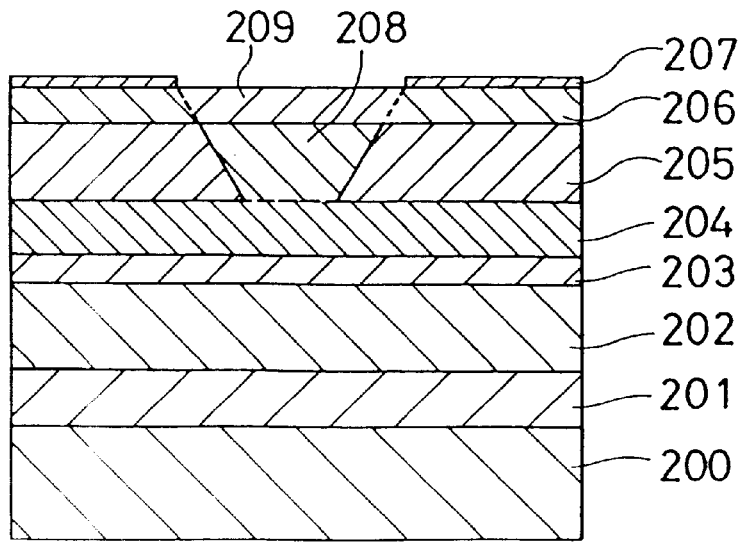

FIGS. 23(a)–23(c) are sectional views illustrating process steps in a method for fabricating a semiconductor laser according to a twelfth embodiment of the present invention.

Figure 24:
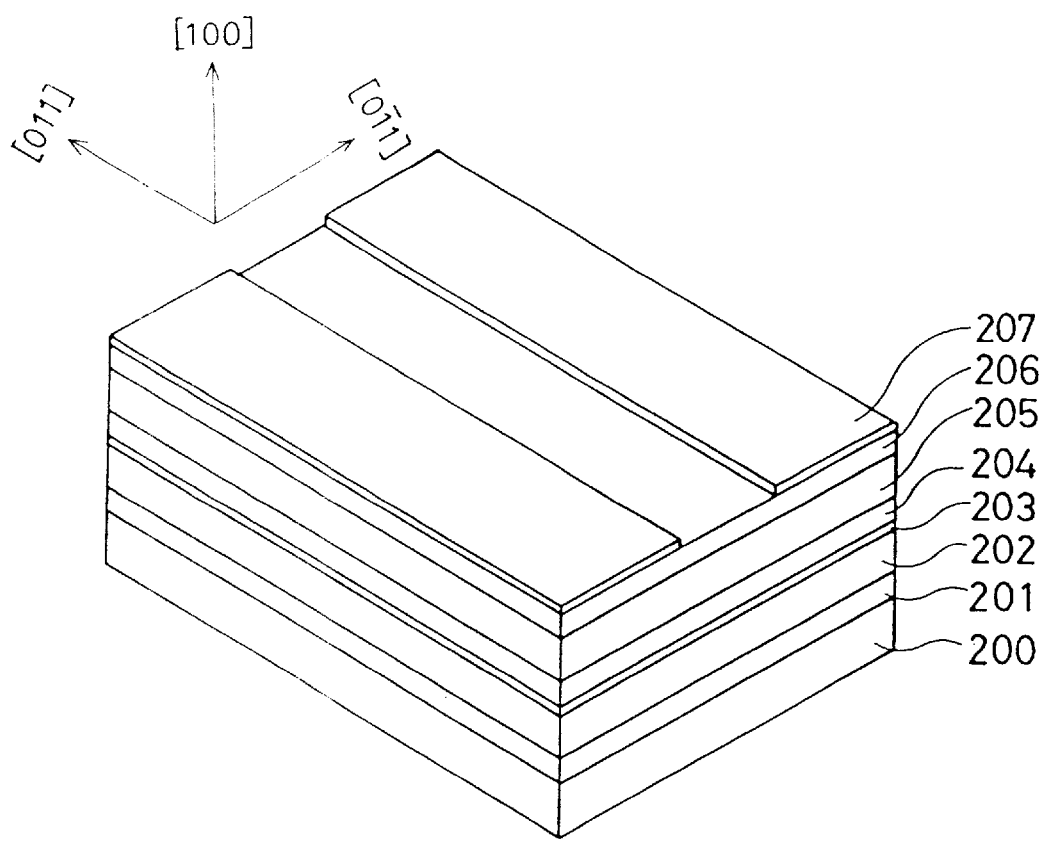
FIG. 24 is a perspective view of the semiconductor laser in the process step of FIG. 23(a).

Initially, there are successively grown on an n type GaAs substrate 200 by MOCVD an n type GaAs buffer layer 201, an n type AlGaAs cladding layer 202, an undoped GaAs active layer 203, a p type AlGaAs cladding layer 204, an n type GaAs current blocking layer 205, and a p type GaAs contact layer 206. Then, an SiO film 207 is deposited on the entire surface of the contact layer 206 by sputtering and patterned using conventional photolithography to form a stripe-shaped opening along the [011] direction (FIG. 23(a)). FIG. 24 is a perspective view of the wafer in the step of FIG. 23(a).

Using the SiO film pattern 207 as a mask, portions of the p type GaAs contact layer 206 and the n type GaAs current blocking layer 205 are selectively etched away, forming a stripe-shaped groove with side walls of(111)B planes (FIG. 23(b)). These layers 206 and 205 are etched by HCl gas in the MOCVD reactor. The etching conditions according to the third embodiment of the present invention may be employed for the HCl gas etching. In addition, it is desired that the surface cleaning according to the first or second embodiment of the present invention be performed before the etching process.

Figure 25:
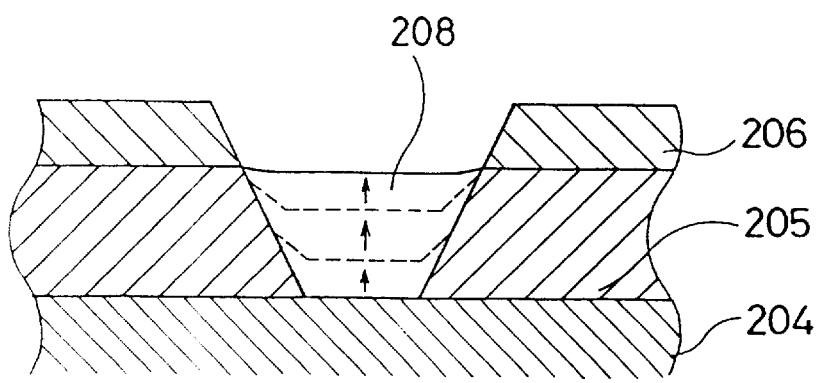
FIG. 25 is a sectional view for explaining a crystal growth in a groove in the process step of FIG. 23(c).

Then, a p type AlGaAs cladding layer 208 and a p type GaAs contact layer 209 are successively grown in the groove by MOCVD (FIG. 23(c)). Since the MOCVD growth does not proceed on the (111)B surfaces, the groove is filled with the crystal layers grown from the bottom of the groove as shown in FIG. 25, resulting in a flat surface of the wafer (FIG. 23(c)).

To complete the semiconductor laser, p side and n side electrodes are formed and the wafer is divided into chips by cleaving.

According to the twelfth embodiment of the present invention, the wafer is etched by the HCl gas etching using the mask pattern with the stripe-shaped opening extending along the [011] direction that is different from the conventional opening orientation by 90°, forming the stripe-shaped groove that provides a current path. Therefore, the crystal growth in the groove proceeds with a flat surface, resulting in a flat surface of the wafer that facilitates the subsequent photolithographic process. In addition, when the laser device is fabricated by junction-down bonding, the compressive stress applied to the active layer is reduced, improving the reliability of the laser device.

In the prior art process steps shown in FIGS. 36(a)–36(e), the p type AlGaAs layer 307 and the p type GaAs contact layer 308 are grown in different crystal growth steps and, therefore, three crystal growth steps are required in the production process. On the other hand, in this twelfth embodiment of the present invention, since the growth of the crystal layer in the groove proceeds parallel to the bottom surface of the groove, even if the p type AlGaAs layer 208 and the p type GaAs contact layer 209 are successively grown in a crystal growth step, the p type GaAs contact layer 209 is grown contacting the p type GaAs contact layer 206. That is, only two crystal growth steps are required, significantly simplifying the production process.

The growths of the p type AlGaAs layer 208 and the p type GaAs contact layer 209 may be separately carried out. That is, after filling the groove with the p type AlGaAs layer 208 and removing the mask pattern 207, the p type GaAs contact layer 209 is grown on the entire surface of the wafer. In this case, the layers 201, 202, 203, 204, and 205 are successively grown on the substrate in the first crystal growth step.

Although in the above-described twelfth embodiment a semiconductor substrate with a (100) surface orientation is employed and a stripe-shaped V groove with the side surfaces of the (111)B planes are formed, a semiconductor substrate with a {100} surface orientation that is crystallographically equivalent to the (100) surface may be employed. In this case, if the same etching process as described above is performed using a mask pattern with a stripe-shaped opening extending along the <011> direction, a stripe-shaped V groove having side surfaces of {111}B planes that are crystallographically equivalent to the (111)B planes is attained. When this groove is filled with the crystal layers, the same effects as described above are attained.

A description is given of a method for fabricating a semiconductor laser in accordance with a thirteenth embodiment of the present invention. In this embodiment, a highly-reliable buried heterojunction semiconductor laser is achieved using AlGaAs. The process steps of this method are illustrated in FIGS. 26(a)–26(e).

Figure 26:
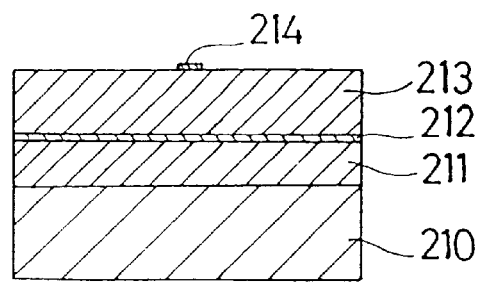
FIGS. 26(a)–26(e) are sectional views illustrating process steps in a method for fabricating a semiconductor laser in accordance with a thirteenth embodiment of the present invention.
Figure 26:
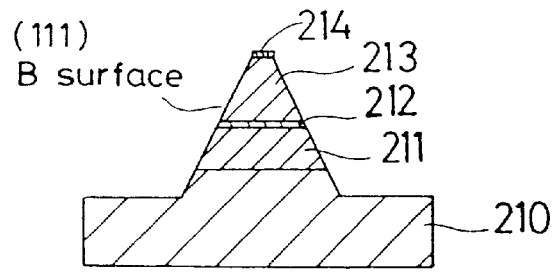
Figure 26:
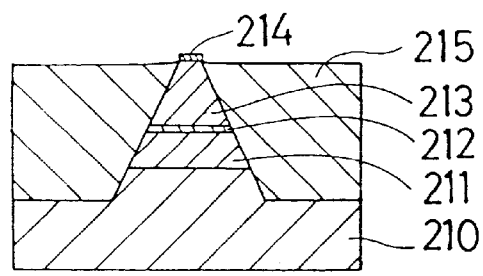
Figure 26:
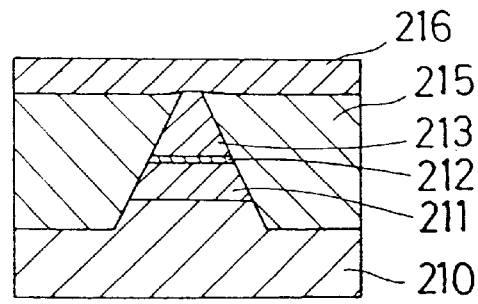
Figure 26:
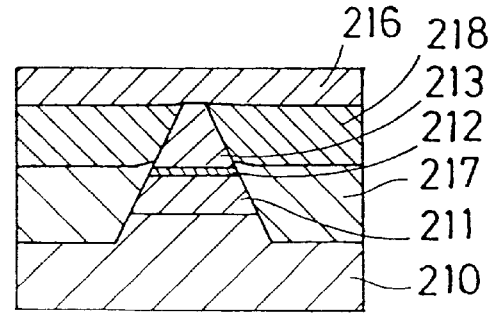

Initially, an n type AlGaAs cladding layer 211, an undoped GaAs active layer 212, and a p type AlGaAs cladding layer 213 are successively grown an n type GaAs substrate 210 by MOCVD. A p type GaAs cap layer is grown on the p type AlGaAs cladding layer 213 although it is not shown. Then, an $SiO_2$ film is deposited on the entire surface of the wafer by sputtering and patterned by conventional photolithography, forming a stripe-shaped $SiO_2$ pattern 214 along the [011] direction (FIG. 26(a)). Then, the double heterojunction structure is selectively etched using the $SiO_2$ pattern 214 as a mask, forming a ridge structure as shown in FIG. 26(b). Preferably, this etching is carried out in the MOCVD reactor using HCl gas. The ridge structure has opposite side walls of (111)B planes. Before the etching process, the surface cleaning according to the first or second embodiment of the present invention is carried out. In addition, the etching conditions according to the third embodiment of the present invention are employed for the gas etching. After the etching process, an i type GaAs current blocking layer 215 is grown on the substrate 210 contacting the side walls of the ridge structure by MOCVD (FIG. 26(c)). Thereafter, the $SiO_2$ pattern 214 is removed and a p type GaAs contact layer 216 is grown on the entire surface of the wafer (FIG. 26(d)).

To complete the semiconductor laser, a p side electrode and an n side electrode are formed on the contact layer 216 and on the rear surface of the substrate 210, respectively, and the wafer is divided into chips by cleaving.

When the buried-heterojunction semiconductor laser is fabricated using AlGaAs material, surface states are easily formed on the regrowth interface, and the active layer in the vicinity of the regrowth interface is adversely affected by the surface states, reducing the reliability of the laser. In this thirteenth embodiment of the present invention, however, since the surface cleaning according to the first or second embodiment of the present invention is performed before the etching process, a clean regrowth interface, on which the surface states are not easily formed, is attained, resulting in a highly-reliable AlGaAs buried heterojunction semiconductor laser.

While in the above-described thirteenth embodiment the current blocking layer 215 comprises the high resistivity GaAs layer, it may be of a double-layer structure comprising a p type GaAs layer 217 and an n type GaAs layer 218 as shown in FIG. 26(e). In this case, a p-n-p-n thyrister current blocking structure is achieved.

A description is given of a fourteenth embodiment of the present invention. FIGS. 27(a)–27(d) are sectional views illustrating a crystal growth method in accordance with the fourteenth embodiment of the present invention.

Figure 27:
FIGS. 27(a)–27(d) are sectional views illustrating process steps in a crystal growth method in accordance with a fourteenth embodiment of the present invention.
Figure 27:
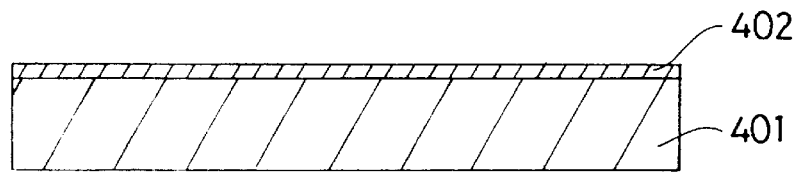
Figure 27:
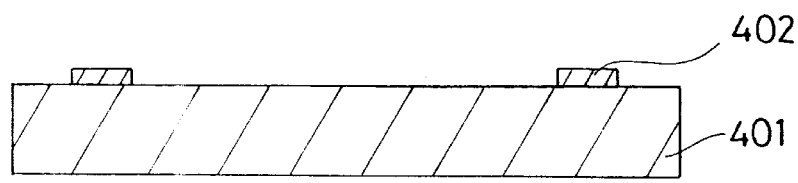
Figure 27:
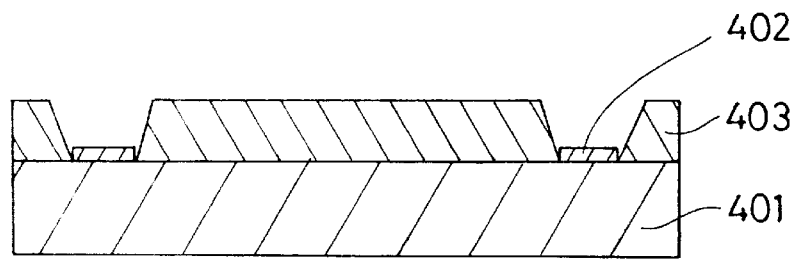

Initially, an Si substrate 401 is prepared (FIG. 27(a)), and a silicon nitride (SiN) film 402 is grown thereon by plasma CVD.

Then, as illustrated in FIG. 27(c), the SiN film 402 is patterned leaving portions surrounding a region on which a device is to be formed (hereinafter referred to as a device region). Then, the Si substrate 401 is rinsed with a mixture of ammonia, $H_2O_2$, and $H_2O$ (hereinafter referred to as RCA solution). When the Si substrate is rinsed with the RCA solution, contaminant such as photoresist and the like remaining on the surface are completely removed and, thereafter, an oxide film of little bonding strength to the clean surface of the Si substrate is formed on the Si substrate. The oxide film is easily removed by annealing the wafer in the MOCVD reactor before the crystal growth.

After the annealing, a GaAs layer 403 having a desired thickness is formed in a two-stage growth method (FIG. 27(d)). More specifically, first of all, a low temperature buffer layer is grown while supplying HCl gas together with the source gases, i.e., $AsH_3$ gas and trimethylgallium (TMG) (first growth stage). The molar flow ratio of HCl gas to TMG is 0.25. In conventional MOCVD growth, polycrystalline material is deposited on the insulating film at a temperature below 500° C., resulting in poor selective growth. In this embodiment of the present invention, however, since the small amount of HCl gas is added during the MOCVD growth, the deposition of polycrystalline material is completely prevented, resulting in a favorable selective growth. Therefore, when the GaAs layer is grown to a desired thickness at about 700° C. after the growth of the low temperature buffer layer, no polycrystalline material is deposited on the insulating film, and the GaAs layer is selectively grown on the device region.

In the conventional crystal growth method, since the selective growth of the low temperature buffer layer is not favorably carried out, cracks are produced in the buffer layer. In order to avoid this problem, the grooves are formed surrounding the device region to prevent the cracks produced at the edge of the wafer from reaching the device region. In this case, however, since the photoresist used for patterning the grooves is not completely removed from the wafer surface before the subsequent crystal growth process, a rhombic pit is formed due to the remaining photoresist during the high temperature growth process, resulting in cracks propagating from the rhombic pit.

According to the fourteenth embodiment of the present invention, after the patterning of the insulating film 402, the Si substrate is rinsed with the RCA solution and then the GaAs layer is grown by the two-stage growth method. Therefore, a favorable selective growth is performed. The cracks generated at the edge of the wafer are completely stopped by the insulating film, so that no crack is introduced into the device region. In addition, since the GaAs layer is grown on the clean surface of the Si substrate, no rhombic pit is produced.

While in the above-described fourteenth embodiment the GaAs layer is grown on the Si substrate, the same effects as described above are attained when an InP layer is grown on an Si substrate or a GaAs substrate. When the GaAs substrate is employed, it is difficult to sufficiently clean the surface after the formation of the insulating pattern. In the method according to the fourteenth embodiment, however, since the low temperature buffer layer is grown first on the surface of the GaAs substrate, differently from the prior art method where the high temperature growth is directly carried out on the GaAs substrate on which the photoresist remains, the rhombic pit caused by the impurities on the substrate is not easily produced and the cracks are sufficiently prevented.

The crystal growth method according to this fourteenth embodiment may be applied to crystal growths on different kind substrates other than those mentioned above with the same effects as described above.

Figure 28:
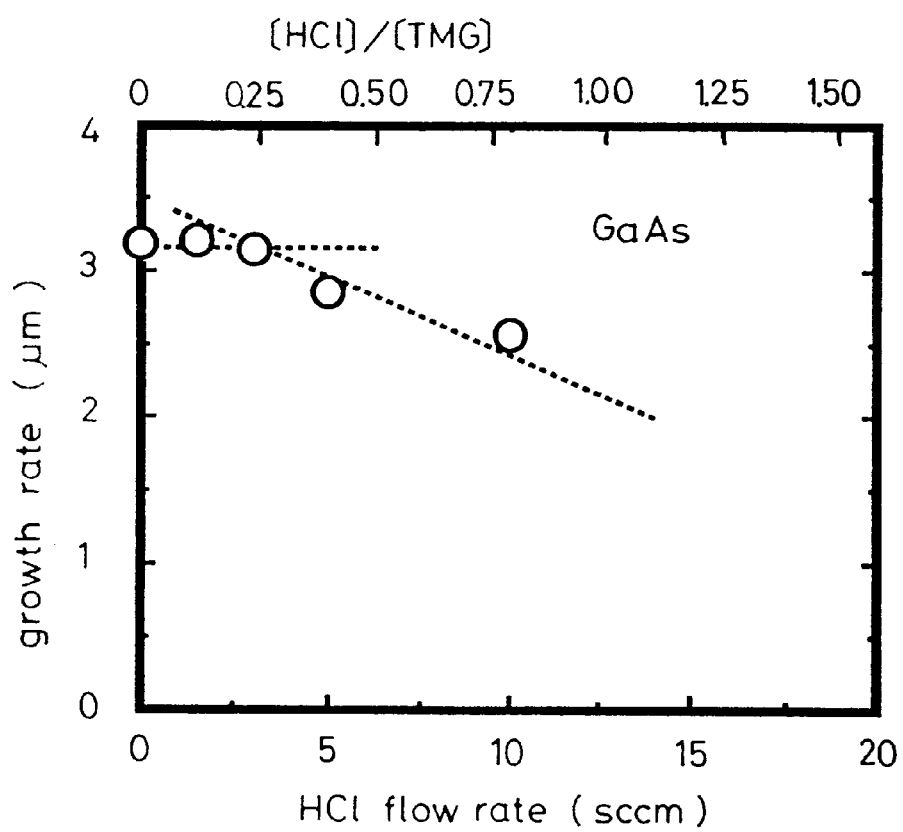
FIG. 28 is a graph illustrating HCl flow rate dependence of the crystal growth in a crystal growth method according to a fifteenth embodiment of the present invention.

FIG. 28 is a graph for explaining a crystal growth method in accordance with a fifteenth embodiment of the present invention. This graph illustrates HCl flow rate dependence of crystal growth rate when GaAs is grown on a GaAs substrate by MOCVD.

When the HCl flow rate is below 3 sccm, the growth rate is not varied. When the HCl flow rate exceeds 5 sccm, the growth rate decreases with increasing HCl flow rate. This is due to etching by the HCl gas that is synchronized with the crystal growth by the source gas. In order to improve the selective growth alone without reducing the uniformity and reproducibility of the MOCVD, it is very important to maintain the HCl flow rate under a prescribed value. That is, the HCl flow rate must be set so that the molar flow ratio of the HCl gas to the TMG is lower than 0.3.

Figure 29:
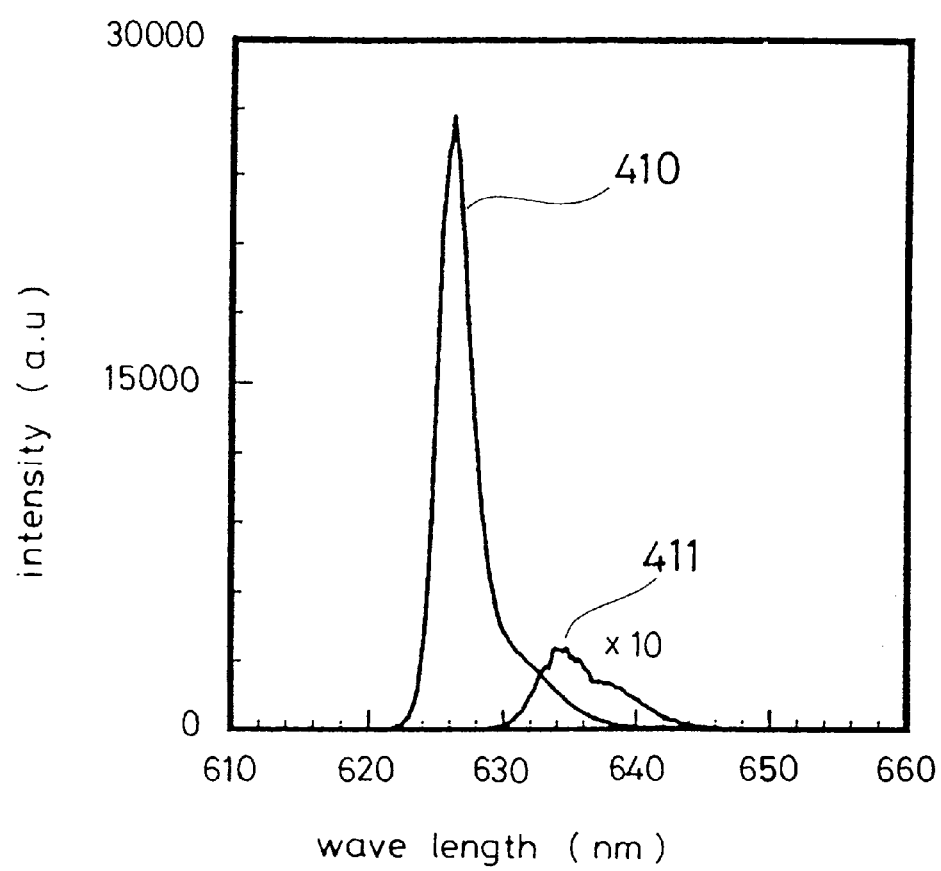
FIG. 29 is a graph illustrating 4.2° K photoluminescence spectrum of a material grown in the crystal growth method according to the fifteenth embodiment of the present invention.
Figure 30:
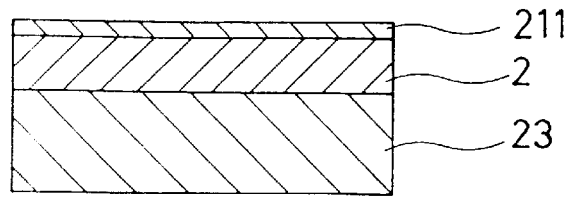
FIGS. 30(a)–30(c) are sectional views for explaining problems in a compound semiconductor etching method according to the prior art.
Figure 30:
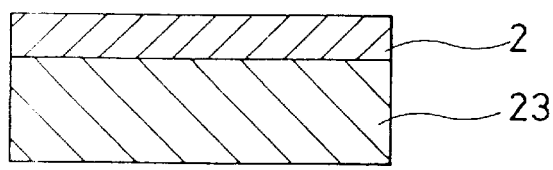
Figure 30:
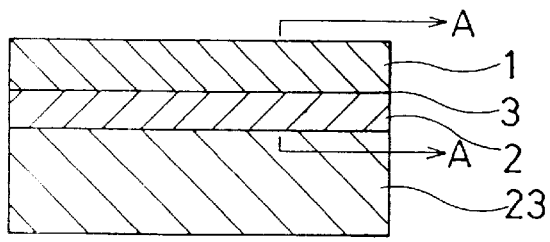
Figure 31:
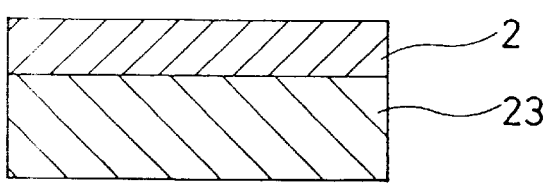
FIGS. 31(a)–31(c) are sectional views for explaining problems in a compound semiconductor etching method according to the prior art.
Figure 31:
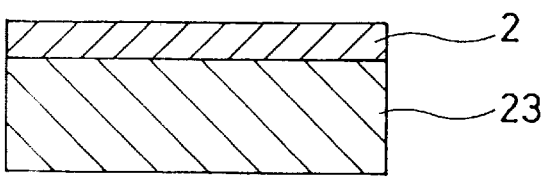
Figure 31:
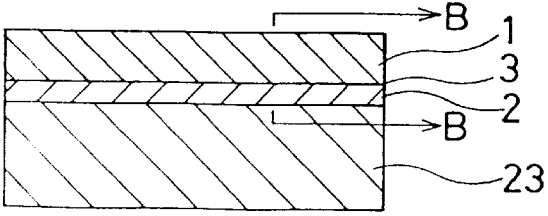

FIG. 29 is a graph for explaining the quality of the grown crystal layer as affected by the HCl gas supplied with the source gas during the MOCVD growth. The graph illustrates 4.2° K photoluminescence (PL) spectrums 410 and 411 of $Al_{0.37}Ga_{0.63}As$ layers grown on the GaAs substrate. The PL spectrum 410 is attained with a molar flow ratio of the HCl gas to the group III gas (hereinafter referred to as [HCl]/[III] rate) of 0.25 and the PL spectrum 411 is attained with a [HCl]/[III] ratio of 1.0. When the [HCl]/[III] ratio is 0.25, the PL spectrum 410 shows a good crystallinity equivalent to the crystallinity obtained by ordinary MOCVD growth. However, in the sample grown with a [HCl]/[III] ratio of 1.0, the peak intensity of the PL spectrum 411 is reduced by about 100 and a peak of light emission due to impurities dominates the peak of the PL spectrum. When the impurity distribution of this sample is observed by the SIMS technique, it is found that Cl and O are mixed into the crystal. This result shows that the large amount of HCl gas added during the crystal growth adversely affects the quality of the grown layer.

From the results of the experiment shown in FIGS. 28 and 29, it is discovered for the first time that maintaining the [HCl]/[III] ratio lower than 0.3 is very important with respect to the quality, uniformity, and reproducibility of the grown crystal layer.

In a crystal growth on a different kind substrate, such as GaAs on Si, especially when a low temperature buffer layer is grown while supplying HCl gas together with the source gases, a [HCl]/[III] ratio below 0.3 provides a favorable selective growth with an improved quality of the grown layer and no cracking.

While in the above-described fourteenth and fifteenth embodiments of the present invention the HCl gas is supplied at the same time as the source gas, $Cl_2$ gas may be supplied in place of the HCl gas. Also in this case, the same effects as described above are attained.

What is claimed is:

1. A method for producing a semiconductor device comprising:

growing a compound semiconductor cap layer including no aluminum on a compound semiconductor layer including aluminum;

selectively forming a mask pattern comprising an insulating film on a part of the compound semiconductor cap layer;

immersing the compound semiconductor cap layer having the insulating mask pattern in an ammonium sulfide solution;

selectively etching the compound semiconductor cap layer using a chlorine-containing gas in a reaction chamber to form a groove; and filling the groove with a compound semiconductor layer grown in the reaction chamber by MOCVD.

2. A method for producing a semiconductor device comprising:

growing a compound semiconductor cap layer including no aluminum on a compound semiconductor layer including aluminum;

selectively forming a mask pattern comprising an insulating film on a part of the compound semiconductor cap layer;

removing an oxide film the compound semiconductor cap layer in a reaction chamber using one of a hydrogen plasma and exposure to ultraviolet light;

selectively etching the compound semiconductor cap layer using a chlorine-containing gas in a reaction chamber to form a groove; and filling the groove with a compound semiconductor layer grown in the reaction chamber by MOCVD.

3. The method of claim 1 wherein the compound semiconductor layer including aluminum is AlGaAs and the compound semiconductor cap layer is GaAs.

4. The method of claim 2 wherein the compound semiconductor layer including aluminum is AlGaAs and the compound semiconductor cap layer is GaAs.

5. A method for producing a semiconductor device including dry etching an $Al_xGa_{1-x}As$ ($0 \leq x \leq 1$) layer using a HCl gas, arsine gas, and hydrogen supplied at the same time with a partial pressure of the arsine gas in a range of from $8 \times 10^{-3}$ Torr to 0.08 Torr and a flow ratio of the arsine gas to the HCl gas in a range of from 0.25 to 2.5.

6. A method for fabricating a semiconductor laser comprising:

growing a plurality of $Al_xGa_{1-x}As$ ($0 \leq x \leq 1$) layers on a {110} surface of a semiconductor substrate to form a laser diode structure;

forming an etching mask comprising an insulating film on a part of the laser diode structure; and forming an oscillation facet of the laser diode with a {111}B surface perpendicular to the {110} surface of the semiconductor substrate by etching with HCl, arsine, and hydrogen supplied at the same time with a partial pressure of the arsine gas in a range from $8 \times 10^{-3}$ Torr to 0.08 Torr and a flow ratio of the arsine gas to the HCl gas in a range of from 0.25 to 2.5.

7. A method for producing a semiconductor device including etching a III-V compound semiconductor layer with a chlorine-containing gas, the etching process comprising:

placing a III-V compound semiconductor layer in a reactor;

a first step of introducing into the reactor respective pulses of a Group V gas and a chlorine-containing gas so that the duration of a pulse of the chlorine-containing gas is shorter than the duration of a pulse of the Group V gas, the chlorine-containing gas being introduced while the Group V gas in being introduced. to etch the III-V compound semiconductor layer;

a second step of, between pulses of the Group V gas, purging the reactor with hydrogen; and alternatingly repeating the first and second steps to etch the III-V compound semiconductor layer.

8. The method of claim 7 wherein the Group V gas is $AsH_3$ and the chlorine-containing gas is HCl.

9. A method for producing a semiconductor device including etching a III-V compound semiconductor with a chlorine-containing gas, the etching process comprising:

preparing an apparatus having a rotatable discord susceptor with a surface;

partitioning the surface of the susceptor into at least first and second regions using flows of hydrogen;

filling the first region with a gas mixture comprising a Group V hydride gas, a chlorine-containing gas, and hydrogen;

filling the second region with hydrogen;

placing a III-V compound semiconductor layer on the susceptor;

first step of rotating the susceptor to place the III-V compound semiconductor layer in the first region filled with the gas mixture comprising the Group V hydride gas, the chlorine-containing gas, and hydrogen, thereby etching the III-V compound semiconductor layer;

a second step of rotating the susceptor to place the III-V compound semiconductor layer in the second region filled with hydrogen; and alternatingly repeating the first and second steps to etch the III-V compound semiconductor layer.

10. The method of claim 9 wherein the Group V hydride gas is $AsH_3$ and the chlorine-containing gas is HCl.

11. A method for producing a quantum wire structure comprising:

forming a first semiconductor layer having an energy band gap on a semiconductor substrate with a {100} surface orientation;

forming an etching mask on the first semiconductor layer, the etching mask having a stripe-shaped opening extending along an <011> direction of the substrate;

etching the first semiconductor layer using HCl gas, arsine gas, and hydrogen introduced into a reactor at the same time with a partial pressure of the arsine gas in a range of from $8 \times 10^{-3}$ Torr to 0.08 Torr and a flow ratio of the arsine gas to the HCl gas in a range of from 0.25 to 2.5, thereby forming a stripe-shaped V groove with side surfaces that are {111}B planes;

forming a second semiconductor layer having an energy band gap smaller than the energy band gap of the first semiconductor layer in the vicinity of the bottom of the V groove; and forming a third semiconductor layer having an energy band gap larger than the energy band gap of the second semiconductor layer on the second semiconductor layer.

12. A method for producing quantum wire structures comprising:
- growing a first high-resistivity layer comprising a first semiconductor having an electron affinity on a semiconductor substrate;
- successively growing a second high-resistivity layer comprising a second semiconductor having an electron affinity smaller than the electron affinity of the first semiconductor and a third high-resistivity layer comprising the first semiconductor;
- forming alternating projections and recesses in the second high-resistivity layer, so that the cross-section of each recess is an inverted triangles by gas etching using HCl gas, arsine gas, and hydrogen introduced into a reactor at the same time with a partial pressure of the arsine gas in a range of from $8 \times 10^{-3}$ Torr to 0.08 Torr and a flow ratio of the arsine gas to the HCl gas in a range of from 0.25 to 2.5; and
- successively growing a first n type layer comprising the second semiconductor and a second n type layer comprising the first semiconductor.

13. A method for fabricating a semiconductor laser comprising:
- successively growing at least a first conductivity type $Al_yGa_{1-y}As$ cladding layer, an $Al_zGa_{1-z}As$ ($0 \leq z < y$) active layer, and a second conductivity type $Al_wGa_{1-w}As$ (z<w) cladding layer on a first conductivity type GaAs substrate with a {100} surface orientation;
- forming a stripe-shaped insulating film pattern extending along a <011> direction on a part of the semiconductor substrate after the growing process;
- removing an oxide film from the grown semiconductor layers using an ammonium sulfide solution;
- using the insulating film pattern as a mask, selectively etching the grown semiconductor layers with a chlorine-containing gas, thereby forming a stripe-shaped ridge structure with side walls that are {111}B planes; and
- growing a current blocking layer on opposite sides of the ridge structure.

14. The method of claim 13 including growing a high-resistivity or semi-insulating GaAs layer as the current blocking layer.

15. The method of claim 13 including successively growing a second conductivity type GaAs layer and a first conductivity type GaAs layer as the current blocking layer.

16. A method for fabricating a semiconductor laser comprising:
- successively growing at least a first conductivity type $Al_yGa_{1-y}As$ cladding layer, an $Al_zGa_{1-z}As$ ($0 \leq z < y$) active layer, and a second conductivity type $Al_wGa_{1-w}As$ (z<w) cladding layer on a first conductivity type GaAs substrate with a {100} surface orientation;
- forming a stripe-shaped insulating film pattern extending along a <011> direction on a part of the semiconductor substrate after the growing process;
- removing an oxide film from the grown layers by cleaning in a reactor using one of a hydrogen plasma and ultraviolet light;
- using the insulating film pattern as a mask, selectively etching the grown semiconductor layers with a chlorine-containing gas, thereby forming a stripe-shaped ridge structure with side walls that are {111}B planes; and
- growing a current blocking layer on opposite sides of the ridge structure.

17. The method of claim 16 including growing a high-resistivity or semi-insulating GaAs layer as the current blocking layer.

18. The method of claim 16 including successively growing a second conductivity type GaAs layer and a first conductivity type GaAs layer as the current blocking layer.

* * * * *